US011320506B2

(12) United States Patent
Sun et al.

(10) Patent No.: US 11,320,506 B2
(45) Date of Patent: May 3, 2022

(54) MULTIBAND SPIRAL CARDIAC MRI WITH NON-CARTESIAN RECONSTRUCTION METHODS

(71) Applicant: University of Virginia Patent Foundation, Charlottesville, VA (US)

(72) Inventors: Changyu Sun, Charlottesville, VA (US); Frederick H. Epstein, Charlottesville, VA (US); Yang Yang, Charlottesville, VA (US); Xiaoying Cai, Brookline, MA (US); Michael Salerno, Charlottesville, VA (US); Craig H. Meyer, Charlottesville, VA (US); Daniel Stuart Weller, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 150 days.

(21) Appl. No.: 16/843,869

(22) Filed: Apr. 8, 2020

(65) Prior Publication Data
US 2020/0363485 A1 Nov. 19, 2020

Related U.S. Application Data

(60) Provisional application No. 62/964,881, filed on Jan. 23, 2020, provisional application No. 62/898,203, (Continued)

(51) Int. Cl.
*G01R 33/48* (2006.01)
*G01R 33/36* (2006.01)
(Continued)

(52) U.S. Cl.
CPC ..... *G01R 33/4824* (2013.01); *G01R 33/3621* (2013.01); *G01R 33/567* (2013.01);
(Continued)

(58) Field of Classification Search
CPC ............ G01R 33/4824; G01R 33/3621; G01R 33/567; G01R 33/58; G06T 7/262; G06T 2207/10088; G06T 2207/30048
See application file for complete search history.

(56) References Cited

U.S. PATENT DOCUMENTS 7,174,200 B2  2/2007  Salerno et al.
7,583,082 B1  9/2009  Hu et al.
(Continued)

FOREIGN PATENT DOCUMENTS

WO  2002/084305  10/2002
WO  2010/062557  6/2010
(Continued)

OTHER PUBLICATIONS

Ahn CB, Kim JH, Cho ZH. High-speed spiral-scan echo planar NMR imaging-I. IEEE Trans Med Imaging 1986;5(1):2-7.
(Continued)

*Primary Examiner* — G. M. A Hyder
(74) *Attorney, Agent, or Firm* — Meunier Carlin & Curfman LLC

(57) ABSTRACT

A computerized method of reconstructing acquired magnetic resonance image (MRI) data to produce a series of output images includes acquiring a multiband k-space data set from a plurality of multiband slices of spiral MRI data; simultaneously acquiring a single band k-space data set comprising respective single band spiral image slices that are each associated with a respective one of the multiband slices in the multiband k-space data set; using the single band k-space data set, for each individual multiband slice, calculating a respective calibration kernel to apply to the multi-band k-space data set for each individual multiband slice; separating each individual multiband slice from the multiband k space data set by phase demodulating the multi-band k-space data using multiband phase demodulation operators
(Continued)

corresponding to the individual multiband slice and convolving phase demodulated multi-band k-space data with a selected convolution operator to form a gridded set of the multi-band k-space data corresponding to the individual multiband slice.

11 Claims, 39 Drawing Sheets

Related U.S. Application Data filed on Sep. 10, 2019, provisional application No. 62/830,769, filed on Apr. 8, 2019.

(51) Int. Cl.
  G01R 33/567 (2006.01)
  G06T 7/262 (2017.01)
  G01R 33/58 (2006.01)

(52) U.S. Cl.
  CPC .............. *G01R 33/58* (2013.01); *G06T 7/262* (2017.01); *G06T 2207/10088* (2013.01); *G06T 2207/30048* (2013.01)

(56) References Cited

U.S. PATENT DOCUMENTS

| | | | |
|---|---|---|---|
| 7,642,777 B1 | 1/2010 | Meyer et al. | |
| 7,813,537 B2 | 10/2010 | Epstein et al. | |
| 7,888,935 B1 | 2/2011 | Tan et al. | |
| 8,026,720 B1 | 9/2011 | Chen et al. | |
| 8,094,907 B1 | 1/2012 | Meyer et al. | |
| 8,238,634 B1 | 8/2012 | Meyer et al. | |
| 8,306,289 B1 | 11/2012 | Meyer et al. | |
| 8,440,167 B2 | 5/2013 | Beller et al. | |
| 8,700,127 B2 | 4/2014 | Salerno et al. | |
| 9,183,626 B2 | 11/2015 | Zhao et al. | |
| 9,224,210 B2 | 12/2015 | Epstein et al. | |
| 9,322,896 B2 | 4/2016 | Fielden et al. | |
| 9,589,345 B2 | 3/2017 | Zhao et al. | |
| 9,651,645 B2 | 5/2017 | Fielden et al. | |
| 9,811,924 B2 | 11/2017 | Johnson et al. | |
| 9,874,623 B2 | 1/2018 | Fielden et al. | |
| 9,910,118 B2 | 3/2018 | Feng et al. | |
| 9,953,439 B2 | 4/2018 | Salerno et al. | |
| 9,989,611 B2 | 6/2018 | Zhao et al. | |
| 10,143,384 B2 | 12/2018 | Chen et al. | |
| 10,198,810 B2 | 2/2019 | Chow et al. | |
| 2014/0364723 A1 | 12/2014 | Meyer et al. | |
| 2015/0282719 A1 | 10/2015 | Fielden et al. | |
| 2015/0282733 A1 | 10/2015 | Fielden | |
| 2015/0287222 A1 | 10/2015 | Zhaoi et al. | |
| 2017/0035319 A1 | 2/2017 | Zhao et al. | |
| 2017/0112449 A1 | 4/2017 | Huang et al. | |
| 2017/0140518 A1 | 5/2017 | Liang et al. | |
| 2017/0202478 A1 | 7/2017 | Handsfield et al. | |
| 2017/0307705 A1 | 10/2017 | Mugler, III et al. | |
| 2017/0307712 A1 | 10/2017 | Cai et al. | |
| 2017/0328972 A1 | 11/2017 | Fielden et al. | |
| 2017/0343635 A1 | 11/2017 | Salerno et al. | |
| 2018/0292499 A1 | 10/2018 | Meyer et al. | |
| 2018/0306880 A1* | 10/2018 | Salerno .................. | A61B 5/055 |
| 2019/0154785 A1 | 5/2019 | Zhou et al. | |
| 2019/0279361 A1 | 9/2019 | Meyer et al. | |

FOREIGN PATENT DOCUMENTS

| | | |
|---|---|---|
| WO | 2012/145547 | 10/2012 |
| WO | 2013/023214 | 2/2013 |
| WO | 2016/004423 | 1/2016 |

OTHER PUBLICATIONS

Barth M, Breuer F, Koopmans PJ, Norris DG, Poser BA. Simultaneous multislice (SMS) imaging techniques. Magn Reson Med 2016;75(1):63-81.

Blaimer M, Breuer FA, Seiberlich N, Mueller MF, Heidemann RM, Jellus V, Wiggins G, Wald LL, Griswold MA, Jakob PM. Accelerated volumetric MRI with a SENSE/GRAPPA combination. J Magn Reson Imaging 2006;24(2):444-450.

Breuer FA, Blaimer M, Heidemann RM, Mueller MF, Griswold MA, Jakob PM. Controlled aliasing in parallel imaging results in higher acceleration (CAIPIRINHA) for multi-slice imaging. Magn Reson Med 2005;53(3):684-691.

Cauley SF, Polimeni JR, Bhat H, Wald LL, Setsompop K. Interslice leakage artifact reduction technique for simultaneous multislice acquisitions. Magn Reson Med 2014;72(1):93-102.

Chen X, Salerno M, Yang Y, Epstein FH. Motion-compensated compressed sensing for dynamic contrast-enhanced MRI using regional spatiotemporal sparsity and region tracking: block low-rank sparsity with motion-guidance (BLOSM). Magn Reson Med 2014;72(4):1028-1038.

Chu A, Noll DC. Coil compression in simultaneous multislice functional MRI with concentric ring slice-GRAPPA and SENSE. Magn Reson Med 2016;76(4):1196-1209.

Feng L, Grimm R, Block KT, Chandarana H, Kim S, Xu J, Axel L, Sodickson DK, Otazo R. Golden-angle radial sparse parallel MRI: combination of compressed sensing, parallel imaging, and golden-angle radial sampling for fast and flexible dynamic volumetric MRI. Magn Reson Med 2014;72(3):707-717.

Feng X, Salerno M, Kramer CM, Meyer CH. Non-Cartesian balanced steady-state free precession pulse sequences for real-time cardiac MRI. Magn Reson Med 2016;75(4):1546-1555.

Ferrazzi G, Bassenge JP, Wink C, Ruh A, Markl M, Moeller S, Metzger GJ, Ittermann B, Schmitter S. Autocalibrated multiband CAIPIRINHA with through-time encoding: Proof of principle and application to cardiac tissue phase mapping. Magn Reson Med 2019;81(2):1016-1030.

Fessler JA, Sutton BP. Nonuniform fast fourier transforms using min-max interpolation. IEEE Transactions on Signal Processing 2003;51(2):560-574.

Griswold MA, Jakob PM, Heidemann RM, Nittka M, Jellus V, Wang J, Kiefer B, Haase A. Generalized autocalibrating partially parallel acquisitions (GRAPPA). Magn Reson Med 2002;47(6):1202-1210.

Huang, Feng, et al. A rapid and robust numerical algorithm for sensitivity encoding with sparsity constraints: Self-feeding sparse SENSE. Magnetic Resonance in Medicine 64.4 (2010): 1078-1088.

Irarrazabal P, Meyer CH, Nishimura DG, Macovski A. Inhomogeneity correction using an estimated linear field map. Magnetic Resonance in Medicine 1996;35(2):278-282.

Jackson JI, Meyer CH, Nishimura DG, Macovski A. Selection of a convolution function for Fourier inversion using gridding [computerised tomography application]. IEEE Trans Med Imaging 1991;10(3):473-478.

Kellman P, Epstein FH, McVeigh ER. Adaptive sensitivity encoding incorporating temporal filtering (TSENSE). Magn Reson Med 2001;45(5):846-852.

Kramer, Christopher M., et al. Standardized cardiovascular magnetic resonance (CMR) protocols 2013 update. Journal of Cardiovascular Magnetic Resonance 15.1 (2013): 1-10.

Lustig M, Donoho D, Pauly JM. Sparse MRI: The application of compressed sensing for rapid MR imaging. Magnetic resonance in medicine 2007;58(6):1182-1195.

Lustig M, Pauly JM. SPIRiT: Iterative self-consistent parallel imaging Yeconstruction from arbitrary k-space. Magn Reson Med 2010;64(2):457-471.

Madore B, Glover GH, Pelc NJ. Unaliasing by fourier-encoding the overlaps using the temporal dimension (UNFOLD), applied to cardiac imaging and fMRI. Magn Reson Med 1999;42(5):813-828.

Madore B. Using UNFOLD to remove artifacts in parallel imaging and in partial-Fourier imaging. Magn Reson Med 2002;48(3):493-501.

Meyer CH, Hu BS, Nishimura DG, Macovski A. Fast spiral coronary artery imaging. Magn Reson Med 1992;28(2):202-213.

(56) References Cited

OTHER PUBLICATIONS

Otazo, Ricardo, Emmanuel Candes, and Daniel K. Sodickson. Low-rank plus sparse matrix decomposition for accelerated dynamic MRI with separation of background and dynamic components. Magnetic resonance in medicine 73.3 (2015): 1125-1136.
Otazo, Ricardo, et al. Combination of compressed sensing and parallel imaging for highly accelerated first-pass cardiac perfusion MRI. Magnetic resonance in medicine 64.3 (2010): 767-776.
Paige CC, Saunders MA. LSQR: An algorithm for sparse linear equations and sparse least squares. TOMS 1982;8(1):43-71.
Rapacchi S, Troalen T, Bentatou Z, Quemeneur M, Guye M, Bernard M, Jacquier A, Kober F. Simultaneous multi-slice cardiac cine with Fourier-encoded self-calibration at 7 Tesla. Magn Reson Med 2019;81(4):2576-2587.
Rosenzweig S, Holme HCM, Wilke RN, Voit D, Frahm J, Uecker M. Simultaneous multi-slice MRI using cartesian and radial FLASH and regularized nonlinear inversion: SMS-NLINV. Magn Reson Med 2018;79(4):2057-2066.
Salerno M, Sica CT, Kramer CM, Meyer CH. Optimization of spiral-based pulse sequences for first-pass myocardial perfusion imaging. Magn Reson Med 2011;65(6):1602-1610.
Schmitter S, Moeller S, Wu X, Auerbach EJ, Metzger GJ, Van de Moortele PF, Ugurbil K. Simultaneous multislice imaging in dynamic cardiac MRI at 7T using parallel transmission. Magn Reson Med 2017;77(3):1010-1020.
Setsompop K, Gagoski BA, Polimeni JR, Witzel T, Wedeen VJ, Wald LL. Blipped-controlled aliasing in parallel imaging for simultaneous multislice echo planar imaging with reduced g-factor penalty. Magn Reson Med 2012;67(5):1210-1224.
Stab D, Ritter CO, Breuer FA, Weng AM, Hahn D, Kostler H. Catpirinha accelerated SSFP imaging. Magn Reson Med 2011;65(1):157-164.
Stab D, Wech T, Breuer FA, Weng AM, Ritter CO, Hahn D, Kostler H. High resolution myocardial first-pass perfusion imaging with extended anatomic coverage. J Magn Reson Imaging 2014;39(6):1575-1587.
Sun C, Yang Y, Cai X, Cui S, Auger D, Salerno M, Epstein FH. Simultaneous multislice spiral cine DENSE MRI. Proceedings of the 26th Annual meeting of ISMRM 2018:#4911.
Sun, Changyu, et al. "Non-Cartesian slice-GRAPPA and slice-SPIRiT reconstruction methods for multiband spiral cardiac MRI." 2019-Magnetic_Resonance_in_Medicine.
Uecker M, Lai P, Murphy MJ, Virtue P, Elad M, Pauly JM, Vasanawala SS, Lustig M. ESPIRiT—an eigenvalue approach to autocalibrating parallel MRI: where SENSE meets GRAPPA. Magn Reson Med 2014;71(3):990-1001.
Walsh DO, Gmitro AF, Marcellin MW. Adaptive reconstruction of phased array MR imagery. Magn Reson Med 2000;43(5):682-690.
Wang H, Adluru G, Chen L, Kholmovski EG, Bangerter NK, DiBella EV. Radial simultaneous multi-slice CAIPI for ungated myocardial perfusion. Magn Reson Imaging 2016;34(9):1329-1336.
Weingartner S, Moeller S, Schmitter S, Auerbach E, Kellman P, Shenoy C, Akcakaya M. Simultaneous multislice imaging for native myocardial T1 mapping: Improved spatial coverage in a single breath-hold. Magn Reson Med 2017;78(2):462-471.
Yang Y, Meyer CH, Epstein FH, Kramer CM, Salerno M. Whole-heart spiral simultaneous multi-slice first-pass myocardial perfusion imaging. Magn Reson Med 2019;81(2):852-862.
Yang, Donghan M., et al. "Intracellular water preexchange lifetime in neurons and astrocytes." Magnetic resonance in medicine 79.3 (2018): 1616-1627.
Ye H, Cauley SF, Gagoski B, Bilgic B, Ma D, Jiang Y, Du YP, Griswold MA, Wald LL, Setsompop K. Simultaneous multislice magnetic resonance fingerprinting (SMS-MRF) with direct-spiral slice-GRAPPA (ds-SG) reconstruction. Magn Reson Med 2017;77(5):1966-1974.
Yutzy SR, Seiberlich N, Duerk JL, Griswold MA. Improvements in multislice parallel imaging using radial CAIPIRINHA. Magn Reson Med 2011;65(6):1630-1637.
Zahneisen B, Ernst T, Poser BA. Sense and simultaneous multislice imaging. Magn Reson Med 2015;74(5):1356-1362.
Zhong X, Spottiswoode BS, Meyer CH, Kramer CM, Epstein FH. Imaging three-dimensional myocardial mechanics using navigator-gated volumetric spiral cine DENSE MRI. Magn Reson Med 2010;64(4):1089-1097.

\* cited by examiner

MULTIBAND SPIRAL CARDIAC MRI WITH NON-CARTESIAN RECONSTRUCTION METHODS

CROSS-REFERENCE TO RELATED APPLICATION

This application claims priority to and benefit under 35 U.S.C § 119(e) of U.S. Provisional Patent Application Ser. No. 62/830,769 entitled "NON-CARTESIAN SLICE-GRAPPA AND SLICE-SPIRIT RECONSTRUCTION METHODS FOR MULTIBAND SPIRAL CARDIAC MRI" and filed on 2019 Apr. 8; U.S. Provisional Patent Application Ser. No. 62/898,203 entitled "NON-CARTESIAN SLICE-GRAPPA AND SLICE-SPIRIT RECONSTRUCTION METHODS FOR MULTIBAND SPIRAL CARDIAC MRI" and filed on 2019 Sep. 10; U.S. Provisional Patent Application Ser. No. 62/964,881 entitled "NON-CARTESIAN SLICE-GRAPPA AND SLICE-SPIRIT RECONSTRUCTION METHODS FOR MULTIBAND SPIRAL CARDIAC MRI" and filed on 2020 Jan. 23 all of which are hereby incorporated by reference herein in their respective entirety as if fully set forth below.

STATEMENT REGARDING FEDERALLY FUNDED RESEARCH

This invention was made with government support under NIH Grant No. HL147104 awarded by National Institutes of Health. The government has certain rights in the invention.

FIELD

The present disclosure relates to magnetic resonance imaging (MRI) operations that, according to some aspects, reconstructs MRI images from spirally acquired MRI data and provides final images having suppressed artifact images across numerous imaging domains.

BACKGROUND

The present disclosure generally relates to the field of medical imaging for analysis of certain physiological activities of a subject. For example, and without limiting this disclosure, various conventional imaging techniques can provide for an assessment of the heart with regard to spatial coverage. Two-dimensional (2D), three-dimensional (3D), and "cine" data measurements can provide a complete assessment of the heart with regard to spatial coverage and a comprehensive evaluation of certain areas such as the strain tensor.

It is notable that MRI imaging encompasses techniques such as acquisition of "cine images." Cine images are short movies that are able to show heart motion throughout the cardiac cycle, in short-axis. For example, measurement of left ventricular (LV) mass, ejection fraction, percentage of LV mass subtended by scar, and extracellular volume may be some of the heart tissue qualities studied with cine data. Cine DENSE, therefore, measures myocardial displacements by encoding tissue displacement into the signal phase. Displacement encoding frequencies (ke) are selected to balance signal-to-noise ratio, displacement sensitivity, and artifact suppression [4], resulting in phase wrapping during systole. Spatio-temporal phase unwrapping is required to compute Lagrangian motion trajectories and strain [4] [5]. Phase unwrapping may be aided by delineating the myocardium using manually-defined contours [2]. Displacement encoding with stimulated echoes (DENSE), therefore, may be described as tools that measure myocardial displacements using the signal phase. Current DENSE analysis methods are aided by user-defined myocardial contours.

Even in light of the achievements in magnetic resonance imaging set forth in earlier patent publications, many MRI images include artifacts that users would like to suppress. For example, as shown in FIG. 1, when displacement is encoded into the phase of a Stimulated Echo (STE), an additional undesired echo is simultaneously being acquired along with the STE due to T1-relaxation. T1-relaxation echo generates striping artifacts in the image domain that practitioners would prefer to avoid. This is one area of inquiry addressed herein.

SUMMARY

Other aspects and features according to the example embodiments of the disclosed technology will become apparent to those of ordinary skill in the art, upon reviewing the following detailed description in conjunction with the accompanying figures.

In the embodiments, a computerized method of reconstructing acquired magnetic resonance image (MRI) data to produce a series of output images includes acquiring a multiband k-space data set from a plurality of multiband slices of spiral MRI data; simultaneously acquiring a single band k-space data set comprising respective single band spiral image slices that are each associated with a respective one of the multiband slices in the multiband k-space data set; using the single band k-space data set, for each individual multiband slice, calculating a respective calibration kernel to apply to the multi-band k-space data set for each individual multiband slice; separating each individual multiband slice from the multiband k space data set by phase demodulating the multi-band k-space data using multiband phase demodulation operators corresponding to the individual multiband slice and convolving phase demodulated multi-band k-space data with a selected convolution operator to form a gridded set of the multi-band k-space data corresponding to the individual multiband slice. The method continues by separating the individual multiband slice from the multi-band k-space data set by convolving the respective calibration kernel with the gridded set of the multi-band k-space data set to form a calibrated slice of k-space multi-band image data; converting the calibrated slice of multi-band k-space image data to an output image.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Reference will now be made to the accompanying drawings, which are not necessarily drawn to scale.

FIG. 6 shows reconstruction of MB spiral data using spiral slice-GRAPPA. (A) The non-Cartesian slice-GRAPPA method applied to MB spiral k-space data uses phase demodulation of the sth slice, followed by gridding and application of the slice-GRAPPA kernel of the sth slice, as shown in Eq. 5 below. In a final step, the IFFT is performed.

Calibration of the non-Cartesian slice-GRAPPA kernel. FIG. 8 shows a simulated MB data from SB cardiac acquisitions were used to determine the dependence of the NCSG reconstruction on the spatial resolution of kernel calibration data. Example NCSG reconstructions using 15% of k-space (a-c) and 35% of k-space (d-f) are shown, as are the errors relative to SB reference data (m-o) in (g-i) and (j-l), respectively. In (a-c), red arrows highlight image artifacts seen when insufficient calibration data are used. The dependence of rRMSE on the percent of k-space used for kernel calibration is shown in (p).

FIG. 9 includes a comparison of NCSG, slice-SPIRiT and CG-SENSE for reconstruction of MB spiral cine gradient echo MRI (MB=3) of a tomato. MB data were reconstructed using CG-SENSE (a-c), NCSG (d-f), and slice-SPIRiT (h-i). Image artifacts relative to reference SB images (k-l) are shown for CG-SENSE (m-o), NCSG (p-r), and slice-SPIRiT (s-u). CG-SENSE had the highest amount of image artifact, with less observed using NCSG, and with slice-SPIRiT providing the lowest artifact level. SSP indicates slice-SPIRiT.

FIG. 10 shows a comparison of NCSG, slice-SPIRiT and CG-SENSE for reconstruction of MB spiral cine gradient echo MRI (MB=3) of the heart in volunteers. MB data at basal, mid-ventricular, and apical levels were reconstructed using CG-SENSE (a-c), NCSG (d-f), and slice-SPIRiT (h-i). SB reference images are also shown (k-l). Red arrows highlight image artifacts. As shown in (m), for all five volunteers studied the artifact power was highest for CG-SENSE, intermediate for NCSG, and lowest for slice-SPIRiT (p<0.05). Error bars indicate standard error. SSP indicates slice-SPIRiT.

FIG. 11 illustrates an evaluation of T-NCSG and T-slice-SPIRiT for reconstruction of MB TCAIPIRINHA spiral cine gradient echo MRI (MB=3) of the heart in volunteers. MB data at basal, mid-ventricular, and apical levels were reconstructed using NCSG (a-c), T-NCSG (d-f), slice-SPIRiT (g-i), and T-slice-SPIRiT. (j-l). SB reference images are also shown (m-o). Red arrows highlight image artifacts. As shown in (p), for all five volunteers studied the rRMSE was lower for T-NCSG compared to NCSG (p<0.05) and for T-slice-SPIRiT compared to slice-SPIRiT (p<0.05). Error bars indicate standard error. SSP indicates slice-SPIRiT.

FIG. 12 shows off-resonance corrections for NCSG and slice-SPIRiT. Panels (a-c) show reference SB spiral images, without off-resonance correction, acquired at slice locations with off-resonance frequencies intentionally set to 100 Hz, 140 Hz, 180 Hz, respectively. NCSG with off-resonance correction (d-f) and slice-SPIRiT with off-resonance correction (g-i) demonstrate successful deblurring, with appearances similar to SB spiral images acquired on resonance (j-l). SSP indicates slice-SPIRiT.

FIG. 13A shows an example rRMSE as a function of iteration number for slice-SPIRiT applied to MB spiral cine gradient echo MRI (MB=3) of the heart of one volunteer. Ten-15 iterations were needed for each individual slice (a-c) and for all slices combined (d) to minimize rRMSE.

FIG. 13B shows an example rRMSE as a function of iteration number for slice-SPIRiT applied to MB spiral cine gradient echo MRI (MB=3) of the heart of one volunteer. Ten-15 iterations were needed for each individual slice (a-c) and for all slices combined (d) to minimize rRMSE.

FIG. 13C shows an example rRMSE as a function of iteration number for slice-SPIRiT applied to MB spiral cine gradient echo MRI (MB=3) of the heart of one volunteer. Ten-15 iterations were needed for each individual slice (a-c) and for all slices combined (d) to minimize rRMSE.

FIG. 13D shows an example rRMSE as a function of iteration number for slice-SPIRiT applied to MB spiral cine gradient echo MRI (MB=3) of the heart of one volunteer. Ten-15 iterations were needed for each individual slice (a-c) and for all slices combined (d) to minimize rRMSE.

FIG. 14 FIG. 14A is a flow chart of one method of reconstructing image data from acquired MRI data. Separation of multiband (MB) spiral k-space by spiral slice-GRAPPA. For kernel calibration, single-band data of the center of k-space are acquired for all slices, phase modulation is applied to all slices, and phase demodulation corresponding to the sth slice is applied to all slices.

FIG. 17 shows a comparison of SSG and CG-SENSE for image recovery applied to spiral cine gradient echo MRI (MB=3) of three short-axis slices in a human volunteer. For CG-SENSE (a-c), multiple slice-leakage artifacts are observed (red arrows). The artifacts are reduced using SSG (d-f). SB images at matched locations are presented as reference standards (g-i).

FIG. 18 is an example demonstrating that SSG can be further improved using temporal alternation of CAIPIRINHA and a temporal filter (TSSG). Slice leakage artifacts observed in SSG (a-c) are reduced using TSSG (d-f), as compared to SB images at matched locations (g-i).

FIG. 19 FIG. 19A is a flow chart of one method of reconstructing image data from acquired MRI data. FIG. 19 is directed to separation of multiband (MB) spiral k-space by spiral slice-GRAPPA. For kernel calibration, single-band data of the center of k-space are acquired for all slices, phase modulation is applied to all slices, and phase demodulation corresponding to the sth slice is applied to all slices.

FIG. 20 shows the separation of MB images using spiral slice-GRAPPA improves as the percentage of the calibration k-space data approaches 25-30%. The temporal resolution of the calibration has little effect on rRMSE. These results are from synthesized data generated using three SB short-axis cine images at basal, mid-ventricular and apical locations. The image reconstruction used 15% of k-space (a-c) and 35% of k-space (d-f) for the calibration. The artifacts (j-l) were relative to SB images (m-o). rRMSE as a function of the percentage of calibration k-space is shown in (p), and the simulated effect of the temporal resolution of the calibration data on rRMSE is shown in (q).

FIG. 22 depicts a comparison of SSG and CG-SENSE for image recovery applied to spiral cine gradient echo MRI (MB=3) of three short-axis slices in a human volunteer. For CG-SENSE (a-c), multiple slice-leakage artifacts are observed (red arrows). The artifacts are reduced using SSG (d-f). SB images at matched locations are presented as reference standards (g-i).

FIG. 23 shows an example demonstrating that SSG can be further improved using temporal alternation of CAIPIRINHA and a temporal filter (TSSG). Slice leakage artifacts observed in SSG (a-c) are reduced using TSSG (d-f), as compared to SB images at matched locations (g-i).

FIG. 24 FIG. 24A is an example of output images according to the disclosure herein. FIG. 24A includes an illustration of the proposed slice-SPIRiT reconstruction for SMS_CAIPIRINHA spiral images. Slice-SPIRiT utilizes through-plane and in-plane calibration consistency, and data consistency. FIG. 24A uses the conjugate gradient (CG) algorithm of slice-SPIRiT for the reconstruction of spiral SMS images.

FIG. 25 depicts phantom studies using spiral cine gradient-echo MRI (MB=3) to show that reconstruction using slice-SPIRiT (d-f) reduces slice leakage artifacts compared to CG-SENSE (a-c). The reference standard single-band images at matched locations were reconstructed by NUFFT$^6$ (g-i).

FIG. 26 shows a comparison of slice-SPIRiT and CG-SENSE for image recovery applied to spiral cine gradient echo MRI (MB=3) of three short-axis slices in a human volunteer. For CG-SENSE (a-c), multiple slice-leakage artifacts are observed (red arrows). The artifacts are reduced using slice-SPiRIT (d-f). SB images at matched locations are presented as reference standards (g-i).

FIG. 28 FIG. 28A is an example of output images according to the disclosure herein. Phantom studies using spiral cine gradient-echo MRI (MB=3) show that reconstruction using slice-SPIRiT (d-f) reduces slice leakage artifact compared to CG-SENSE (a-c). The reference standard single-band images at matched locations were reconstructed by NUFFT6 (g-i).

FIG. 29 FIG. 29A is a flow chart of one method of reconstructing image data from acquired MRI data. The solution of the k-t slice SPARSE SENSE model using CG.

FIG. 30 shows Rate-6 accelerated perfusion imaging with MB=3 and in plane undersampling with R=2. 2DIFFT reconstructions illustrate the artifacts associated with MB=3 and R=2 sampling (a). The three slices separated using split slice GRAPPA show the remaining in plane undersampling artifacts and slice separation artifacts, and form the initial guess for k-t slice-L+S(b). Images reconstructed using k-t slice-L+S demonstrate background (L) and dynamic components (S) of three slices simultaneously (c). The super position of L and S demonstrates slice separation and artifact removal (d).

DETAILED DESCRIPTION

Figure 1:
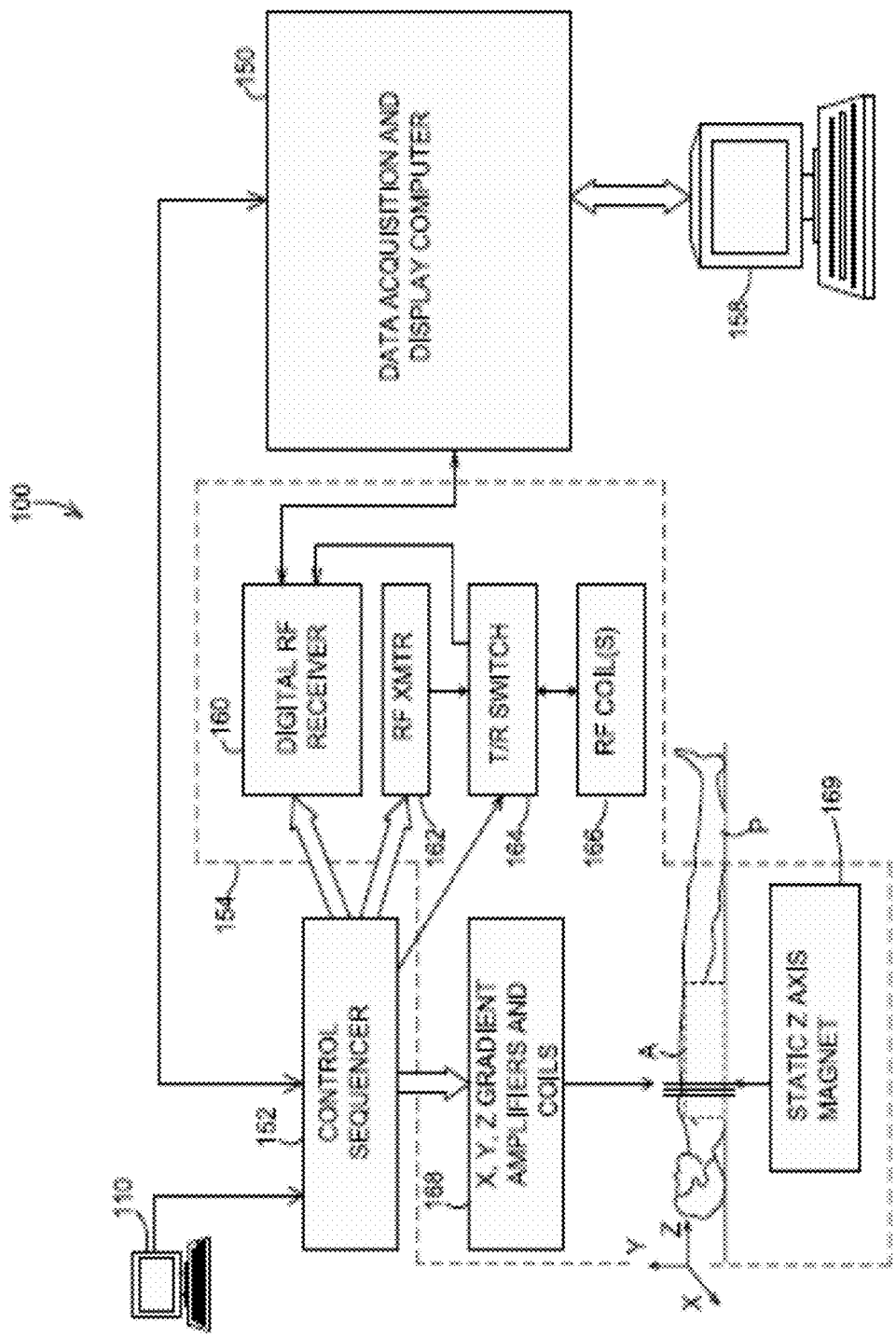
FIG. 1 is a schematic of a computer environment used in accordance with the disclosure herein.

Although example embodiments of the disclosed technology are explained in detail herein, it is to be understood that other embodiments are contemplated. Accordingly, it is not intended that the disclosed technology be limited in its scope to the details of construction and arrangement of components set forth in the following description or illustrated in the drawings. The disclosed technology is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

As discussed herein, a "subject" (or "patient") may be any applicable human, animal, or other organism, living or dead, or other biological or molecular structure or chemical environment, and may relate to particular components of the subject, for instance specific organs, tissues, or fluids of a subject, may be in a particular location of the subject, referred to herein as an "area of interest" or a "region of interest."

Some references, which may include various patents, patent applications, and publications, are cited in a reference list and discussed in the disclosure provided herein. The citation and/or discussion of such references is provided merely to clarify the description of the disclosed technology and is not an admission that any such reference is "prior art" to any aspects of the disclosed technology described herein. In terms of notation, "[r]" corresponds to the nth reference in the list. All references cited and discussed in this specification are incorporated herein by reference in their entireties and to the same extent as if each reference was individually incorporated by reference. By way of example only, the article reference number [20] cited as Lustig M, Pauly J M. SPIRiT: Iterative self-consistent parallel imaging reconstruction from arbitrary k-space, Magn. Reson. Med 2010; 64(2):457-471 is one example that gives significant background information in regard to prior kinds of MRI image reconstruction having acronyms that are commonly used in the art. The Lustig article explains certain background concepts for Generalized Autocalibrating Partially Parallel Acquisition (GRAPPA) discussed in terms of Cartesian GRAPPA, and iTerative Self-consistent Parallel Imaging Reconstruction (SPIRiT) discussed as Cartesian SPIRiT and non-Cartesian SPIRiT. The Lustig article and the other noted references of this disclosure include certain fundamental concepts that this disclosure references in showing additional innovative concepts. Discussions of fundamental background information (e.g., Controlled Aliasing in Parallel Imaging Results in Higher Acceleration" (CAIPIRINHA)) is not repeated herein, but those discussions are available in the cited references incorporated by reference as if set forth verbatim in this disclosure.

In the following description, references are made to the accompanying drawings that form a part hereof and that show, by way of illustration, specific embodiments or examples. In referring to the drawings, like numerals represent like elements throughout the several figures.

FIG. 1 is a system diagram illustrating an operating environment capable of implementing aspects of the present disclosure of automated DENSE analysis in accordance with one or more example embodiments. FIG. 1 illustrates an example of a magnetic resonance imaging (MRI) system 100, including a data acquisition and display computer 150 coupled to an operator console 110, an MRI real-time control sequencer 152, and an MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a living subject, patient P, to be imaged. A contrast-enhanced image of an area of interest A of the patient P may be shown on display 158. The display 158 may be implemented through a variety of output interfaces, including a monitor, printer, or data storage.

The area of interest "A" corresponds to a region associated with one or more physiological activities in patient "P". The area of interest shown in the example embodiment of FIG. 1 corresponds to a chest region of patient "P", but the area of interest for purposes of implementing aspects of the disclosure presented herein is not limited to the chest area. It should be recognized and appreciated that the area of interest can be one or more of a brain region, heart region, and upper or lower limb regions of the patient "P", for example.

It should be appreciated that any number and type of computer-based medical imaging systems or components, including various types of commercially available medical imaging systems and components, may be used to practice certain aspects of the present disclosure. Systems as described herein with respect to example embodiments are not intended to be specifically limited to magnetic resonance imaging (MRI) implementations or the particular system shown in FIG. 1.

One or more data acquisition or data collection steps as described herein in accordance with one or more embodiments may include acquiring, collecting, receiving, or otherwise obtaining data such as imaging data corresponding to an area of interest. By way of example, data acquisition or collection may include acquiring data via a data acquisition device, receiving data from an on-site or off-site data acquisition device or from another data collection, storage, or processing device. Similarly, data acquisition or data collection devices of a system in accordance with one or more embodiments of the present disclosure may include any device configured to acquire, collect, or otherwise obtain data, or to receive data from a data acquisition device within the system, an independent data acquisition device located on-site or off-site, or another data collection, storage, or processing device.

Figure 2:
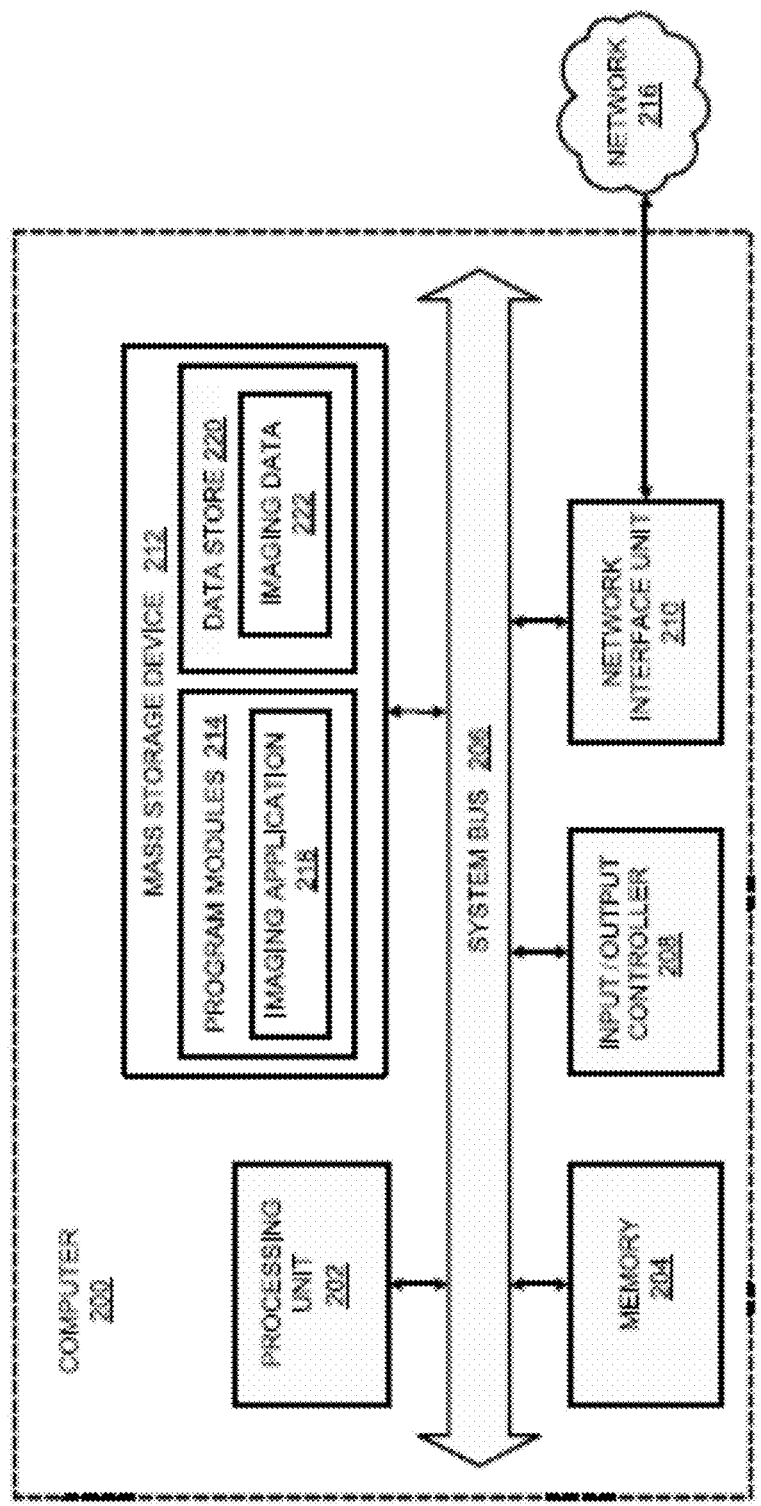
FIG. 2 is a schematic of a computer environment used in accordance with the disclosure herein.

FIG. 2 is a computer architecture diagram showing a general computing system capable of implementing aspects of the present disclosure in accordance with one or more embodiments described herein. A computer 200 may be configured to perform one or more functions associated with embodiments of this disclosure. For example, the computer 200 may be configured to perform operations of the method as described below. It should be appreciated that the computer 200 may be implemented within a single computing device or a computing system formed with multiple connected computing devices. The computer 200 may be configured to perform various distributed computing tasks, which may distribute processing and/or storage resources among the multiple devices. The data acquisition and display computer 150 and/or operator console 110 of the system shown in FIG. 1 may include one or more systems and components of the computer 200.

As shown, the computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform one or more functions associated with embodiments of method as illustrated in one or more of the figures of this disclosure, for example to cause the computer 200 to perform operations of the automated DENSE analysis as described below. The program modules 214 may include an imaging application 218 for performing data acquisition functions as described herein, for example to receive image data corresponding to magnetic resonance imaging of an area of interest. The computer 200 can include a data store 220 for storing data that may include imaging-related data 222 such as acquired image data, and a modeling data store 224 for storing image modeling data, or other various types of data utilized in practicing aspects of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example, and not limitation, computer-storage media (also referred to herein as a "computer-readable storage medium" or "computer-readable storage media") may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200. Transitory signals are not "computer-storage media", "computer-readable storage medium" or "computer-readable storage media" as described herein.

According to various embodiments, the computer 200 may operate in a networked environment using connections to other local or remote computers through a network 216 via a network interface unit 210 connected to the bus 206. The network interface unit 210 may facilitate connection of the computing device inputs and outputs to one or more suitable networks and/or connections such as a local area network (LAN), a wide area network (WAN), the Internet, a cellular network, a radio frequency network, a Bluetooth-enabled network, a Wi-Fi enabled network, a satellite-based network, or other wired and/or wireless networks for communication with external devices and/or systems. The computer 200 may also include an input/output controller 208 for receiving and processing input from a number of input devices. Input devices may include one or more of keyboards, mice, stylus, touchscreens, microphones, audio capturing devices, or image/video capturing devices. An end user may utilize such input devices to interact with a user interface, for example a graphical user interface, for managing various functions performed by the computer 200.

The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like. The computer-storage media may represent memory components, whether characterized as RAM, ROM, flash, or other types of technology. The computer-storage media may also represent secondary storage, whether implemented as hard drives or otherwise. Hard drive implementations may be characterized as solid state or may include rotating media storing magnetically-encoded information. The program modules 214, which include the imaging application 218, may include instructions that, when loaded into the processing unit 202 and executed, cause the computer 200 to provide functions associated with embodiments illustrated herein. The program modules 214 may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202.

Encoding the program modules 214 may also transform the physical structure of the computer-storage media. The specific transformation of physical structure may depend on various factors, in different implementations of this description. Examples of such factors may include but are not limited to the technology used to implement the computer-storage media, whether the computer storage media are characterized as primary or secondary storage, and the like. For example, if the computer-storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer-storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

The computing system can include clients and servers. A client and server are generally remote from each other and generally interact through a communication network. The relationship of client and server arises by virtue of computer programs running on the respective computers and having a client-server relationship to each other. In embodiments deploying a programmable computing system, it will be appreciated that both hardware and software architectures require consideration. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware can be a design choice. Below are set out hardware (e.g., machine 300) and software architectures that can be deployed in example embodiments.

The machine 300 can operate as a standalone device or the machine 300 can be connected (e.g., networked) to other machines. In a networked deployment, the machine 300 can operate in the capacity of either a server or a client machine in server-client network environments. In an example, machine 300 can act as a peer machine in peer-to-peer (or other distributed) network environments. The machine 300 can be a personal computer (PC), a tablet PC, a set-top box (STB), a Personal Digital Assistant (PDA), a mobile telephone, a web appliance, a network router, switch or bridge, or any machine capable of executing instructions (sequential or otherwise) specifying actions to be taken (e.g., performed) by the machine 300. Further, while only a single machine 300 is illustrated, the term "machine" shall also be taken to include any collection of machines that individually or jointly execute a set (or multiple sets) of instructions to perform any one or more of the methodologies discussed herein.

Example machine (e.g., computer system) 300 can include a processor 302 (e.g., a central processing unit (CPU), a graphics processing unit (GPU) or both), a main memory 304 and a static memory 306, some or all of which can communicate with each other via a bus 308. The machine 300 can further include a display unit 310, an alphanumeric input device 312 (e.g., a keyboard), and a user interface (UI) navigation device 311 (e.g., a mouse). In an example, the display unit 810, input device 317 and UI navigation device 314 can be a touch screen display. The machine 300 can additionally include a storage device (e.g., drive unit) 316, a signal generation device 318 (e.g., a speaker), a network interface device 320, and one or more sensors 321, such as a global positioning system (GPS) sensor, compass, accelerometer, or other sensor. The storage device 316 can include a machine readable medium 322 on which is stored one or more sets of data structures or instructions 324 (e.g., software) embodying or utilized by any one or more of the methodologies or functions described herein. The instructions 324 can also reside, completely or at least partially, within the main memory 304, within static memory 306, or within the processor 302 during execution thereof by the machine 300. In an example, one or any combination of the processor 302, the main memory 304, the static memory 306, or the storage device 316 can constitute machine readable media. While the machine readable medium 322 is illustrated as a single medium, the term "machine readable medium" can include a single medium or multiple media (e.g., a centralized or distributed database, and/or associated caches and servers) that configured to store the one or more instructions 324. The term "machine readable medium" can also be taken to include any tangible medium that is capable of storing, encoding, or carrying instructions for execution by the machine and that cause the machine to perform any one or more of the methodologies of the present disclosure or that is capable of storing, encoding or carrying data structures utilized by or associated with such instructions. The term "machine readable medium" can accordingly be taken to include, but not be limited to, solid-state memories, and optical and magnetic media.

Specific examples of machine readable media can include non-volatile memory, including, by way of example, semiconductor memory devices (e.g., Electrically Programmable Read-Only Memory (EPROM), Electrically Erasable Programmable Read-Only Memory (EEPROM)) and flash memory devices; magnetic disks such as internal hard disks and removable disks; magnetooptical disks; and CD-ROM and DVD-ROM disks. The instructions 324 can further be transmitted or received over a communications network 326 using a transmission medium via the network interface device 320 utilizing any one of a number of transfer protocols (e.g., frame relay, IP, TCP, UDP, HTTP, etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., IEEE 802.11 standards family known as Wi-Fi®, IEEE 802.16 standards family known as WiMax®), peer-to-peer (P2P) networks, among others. The term "transmission medium" shall be taken to include any intangible medium that is capable of storing, encoding or carrying instructions for execution by the machine, and includes digital or analog communications signals or other intangible medium to facilitate communication of such software.

Spiral MRI has advantages for cardiac imaging, and multiband (MB) spiral MRI of the heart shows promise. However, current reconstruction methods for MB spiral imaging have limitations. We sought to develop improved reconstruction methods for MB spiral cardiac MRI.

Methods: Two reconstruction methods were developed. The first is non-Cartesian slice-GRAPPA (NCSG), which utilizes phase demodulation and gridding operations prior to application of a Cartesian slice-separating kernel. The second method, slice-SPIRiT, formulates the reconstruction as a minimization that enforces in-plane coil consistency, through-plane coil consistency, and consistency with the acquired MB data. These methods were compared to CG-SENSE in phantoms and volunteers.

Temporal alternation of CAIPIRINHA phase and the use of a temporal filter was also investigated.

Results: Phantom experiments with three simultaneous slices (MB=3) showed that mean artifact power was highest for CG-SENSE, lower for NCSG, and lowest for slice-SPIRiT. For volunteer cine imaging (MB=3, N=5), the artifact power was 0.182±0.037, 0.148±0.036, and 0.139±0.034 for CG-SENSE, NCSG and slice-SPIRiT, respectively (p<0.05, ANOVA). Temporal alternation of CAIPIRINHA reduced artifacts for both NCSG and slice-SPIRiT.

Conclusion: NCSG and slice-SPIRiT provide more accurate reconstructions for MB spiral cine imaging compared to CG-SENSE. These methods hold promise for non-Cartesian MB imaging.

Spiral MRI has advantages for cardiac imaging, and multiband (MB) spiral MRI of the heart shows promise. However, current reconstruction methods for MB spiral imaging have limitations. We sought to develop improved reconstruction methods for MB spiral cardiac MRI.

Methods: Two reconstruction methods were developed. The first is non-Cartesian slice-GRAPPA (NCSG), which utilizes phase demodulation and gridding operations prior to application of a Cartesian slice-separating kernel. The second method, slice-SPIRiT, formulates the reconstruction as a minimization that enforces in-plane coil consistency, through-plane coil consistency, and consistency with the acquired MB data. These methods were compared to CG-SENSE in phantoms and volunteers.

Temporal alternation of CAIPIRINHA phase and the use of a temporal filter was also investigated.

Results: Phantom experiments with three simultaneous slices (MB=3) showed that mean artifact power was highest for CG-SENSE, lower for NCSG, and lowest for slice-SPIRiT. For volunteer cine imaging (MB=3, N=5), the artifact power was 0.182±0.037, 0.148±0.036, and 0.139±0.034 for CG-SENSE, NCSG and slice-SPIRiT, respectively (p<0.05, ANOVA). Temporal alternation of CAIPIRINHA reduced artifacts for both NCSG and slice-SPIRiT.

NCSG and slice-SPIRiT provide more accurate reconstructions for MB spiral cine imaging compared to CG-SENSE. These methods hold promise for non-Cartesian MB imaging.

Introduction

Simultaneous multislice (SMS) or multiband (MB) imaging has become an important acceleration method for MRI. Compared to in-plane undersampling, through-plane acceleration with SMS results in less of a reduction in signal-to-noise ratio (SNR), as SNR decreases due to the geometry-factor (g-factor), but not due to a reduction in the number of readouts. Furthermore, using CAIPIRINHA (controlled aliasing in parallel imaging results in higher acceleration) (1), the SNR penalty due to the g-factor can be minimized. With these advantages, Cartesian MB imaging with CAIPIRINHA has been successfully applied in diffusion-weighted and functional imaging of the brain (2,3), abdominal imaging (1) cardiac imaging (4-7), and other applications. While Cartesian imaging is widely employed, spiral trajectories (8,9) sample k-space efficiently, are insensitive to flow and motion, and provide advantages for cardiac imaging (9-12). Recently, a MB spiral technique was applied to first-pass myocardial perfusion imaging, showing feasibility and promise of MB spiral MRI of the heart (13).

Multiple methods based on parallel imaging (PI) have been developed for the reconstruction of MB data. For Cartesian MB imaging, a SENSE/GRAPPA method has been used (14); however, this method was shown to be susceptible to residual artifact (2). The slice-GRAPPA (SG) method (2) was developed to reduce image artifacts compared to SENSE/GRAPPA; however, it was found that the SG kernel is dependent on the contrast properties of the calibration scan, leading to slice leakage when the contrast properties of the calibration and image data are different. Subsequently, the split slice-GRAPPA (SP-SG) method (3), which balances errors coming from both image artifacts and slice leakage in the SG kernel-fitting objective function, was developed and provides a robust reconstruction with low slice leakage for Cartesian MB data.

As for reconstruction of in-plane accelerated MRI, MB reconstruction methods are more complex for non-Cartesian versus Cartesian trajectories. While iterative CGSENSE (15,16) and non-iterative GRAPPA-based methods (17,18) have been demonstrated for non-Cartesian MB imaging (15,17,18), these methods have limitations. For CG-SENSE (15,16), which utilizes in-plane coil profile information, the main limitation is that residual artifacts occur. For direct spiral slice-GRAPPA (17,18), which uses different kernels for different sections of k-space, a limitation is that the method involves substantial complexity in the acquisition of kernel calibration data and in the calculations of the various and potentially large number of kernels.

Here we develop a non-Cartesian slice-GRAPPA (NCSG) method requiring single-band (SB) calibration data for a single through-plane slice-separating GRAPPA kernel. As the SB calibration scans enable the computation of both through-plane and in-plane GRAPPA kernels, we also investigated the integrated use of in-plane coil calibration consistency, through-plane coil calibration consistency, and consistency with acquired data much like coil calibration consistency and consistency with acquired data are both exploited in iterative self-consistent parallel imaging reconstruction (SPIRiT) (19). Specifically, building from NCSG, we developed a slice-SPIRiT reconstruction model for MB spiral imaging. Further, for dynamic imaging, we investigated time alternation of the MB phase modulation pattern (T-CAIPIRINHA) and employed a temporal filter (20-22) after NCSG (T-NCSG) or slice-SPIRiT (T-slice-SPIRiT) in the reconstruction. We evaluated the new methods in the context of MB spiral cine imaging of the heart (without in-plane undersampling), comparing MB spiral data reconstructed using CG-SENSE, NCSG, slice-SPIRiT, T-NCSG, and T-slice-SPIRiT.

In this section, we develop the NCSG and slice-SPIRiT reconstruction models. As in Cartesian CAIPIRINHA MB imaging and a previous MB radial method (15,23), we employ CAIPIRINHA phase modulation during the MB RF excitation of a spiral sequence, and we demonstrate the effect of this phase modulation on spiral images. Next, we introduce a NCSG model for separating the MB spiral images, including methods for calibrating a slice-separating SG kernel. Subsequently, we develop a slice-SPIRiT model that utilizes both the through-plane SG kernel and an in-plane coil calibration consistency kernel (i.e., a SPIRiT kernel) to iteratively enforce in-plane coil calibration consistency, through-plane coil calibration consistency, and consistency with acquired data. Finally, we introduce temporal alternation of the CAIPIRINHA phase modulation pattern (T-CAIPIRINHA) to further improve dynamic MB imaging. CAIPIRINHA phase modulation and demodulation for spiral imaging. For a MB acquisition, CAIPIRINHA phase modulation can be expressed as:

$$Y_{MB} = \sum_{Z=1}^{NS} P_z y_z \quad (1)$$

Where $y_z$ is the SB spiral k-space data for the zth slice, $P_z$ is the CAIPIRINHA phase modulation matrix for the slice, NS is the number of slices undergoing MB excitation, and yMB is the MB spiral k-space data. All the k-space data are multi-coil data; however, the k-space data are processed coil-by-coil, therefore there is no need to employ a coil index in the equations. The sizes of the yz and yMB matrices are L×NP, where L is the number of spiral interleaves and NP is the number of readout points acquired per interleave. The phase modulation matrix for the slice is given by $$P_z = \text{diag}(e^{-ipz[1\ldots L]}) = \begin{pmatrix} e^{-ipz[1]} & \ldots & 0 \\ 0 & \ldots & e^{-ipz[L]} \end{pmatrix} \quad (2)$$

Where $$pz[l] = (z-1)(l-1)\frac{2\pi}{NS},$$

with l=1, 2, . . . L and Z=1, 2 . . . NS. The Pz matrices have dimensions L×L.

For Cartesian MB imaging, by design the CAIPIRINHA phase modulation pattern results in slice-specific shifting of the overlapped MB slices in the phase-encoding direction (1), facilitating the separation of slices using PI reconstruction methods. However, for non-Cartesian trajectories the effect is different. For the non-Cartesian case, if we apply the phase demodulation operator of the slice in the k-space domain to both sides of Eq. 1, we obtain the following expression:

$$P_s^* Y_{MB} = y_s + \sum_{Z=1 \& Z \neq S}^{NS} \tilde{Y}_z \quad (3)$$

The left side is the complex conjugate of Ps, the phase demodulation matrix corresponding to the sth slice. As shown by Eq. 3, for non-Cartesian trajectories after phase demodulation of the slice, MB excitation with CAIPIRINHA largely selects the k-space data of the sth slice, and additionally includes residual signal from the other slices (15). This effect is demonstrated in FIG. 1 which shows spiral gradient echo images acquired using 18 interleaves.

Non-Cartesian Slice-GRAPPA (NCSG)

The NCSG method builds upon Eq. 3 and the split slice-GRAPPA method previously developed for Cartesian imaging (3). For Cartesian imaging, the split slice-GRAPPA model can be expressed as, $$\tilde{Y}s = Ks \tilde{c} Ps^*YMB \quad (4)$$

where the left term is the separated Cartesian k-space data for the slice, Ks is a matrix that performs a convolution using the split slice-GRAPPA kernel for the sth slice, and y~MB is the Cartesian MB k-space data. The Ks kernel is applied as a series of convolutions on the data from different coils. As shown previously, the Ks kernels are computed using SB Cartesian data from the center of k space acquired as calibration data for each slice (3).

Building from Eqs. 3 and 4, and as shown in FIG. 2, we propose an NCSG reconstruction model for MB spiral data expressed as:

$$\tilde{Y}s = Ks \tilde{c} Ps^*YMB \quad (5)$$

where the left term is the gridded separated k-space data of the sth slice, and c~ is the gridding operator (24,25). The operator is applied as a convolution. As shown in FIG. 2 and Eq. 3, the spiral MB data are phase demodulated using the conjugate of the phase modulation matrix, P*s, of the sth slice, and then the gridding convolution operator is applied (24). Next, the gridded data are convolved with the slice- GRAPPA kernel of the sth slice, and the separated gridded k-space is obtained. As shown in FIG. 2, the inverse Fast Fourier transform (IFFT) is finally performed to compute the image of the sth slice. This process is performed for all slices.

The Ks kernel is calibrated using SB spiral data from the center of k-space acquired in calibration scans, as shown in FIG. 2B. The k-space trajectories of the SB calibration scans exactly replicate those of the MB image data in the central k-space region. To compute the Ks kernel, phase demodulation corresponding to the slice is applied to the calibration data of all slices. Gridding is then performed on the resulting spiral k-space data to generate Cartesian k-space data, and the calibration calculations of the Cartesian split slice-GRAPPA method (3) are applied to fit the SG kernel of the slice. Details of these calculations are provided in the supporting information.

Slice-SPIRiT. While the methods described above make use of through-plane coil sensitivity information to calibrate an SG kernel and separate MB data, there is an opportunity to additionally use in-plane coil sensitivity information to calibrate an in-plane SPIRiT kernel and to develop an iterative reconstruction model that enforces in-plane coil consistency, through-plane coil consistency, and consistency with the acquired MB data. We propose a slice-SPIRiT reconstruction model formulated as the following minimization problem:

$$\text{Minimize} \|(G-I)[m1\,m2\,m3\ldots\,mNs]\|^2, \quad (6)$$

$$\text{s.t. } \left\|\sum_{Z=1}^{Ns} Pzc\,Fmz - ymb\right\|^2 \leq \varepsilon$$

Where $$m = [m1\,m2\,m3\ldots\,mNs]$$

represents the concatenated NS multi-coil images undergoing reconstruction on Cartesian grids, $$G = \begin{bmatrix} G1 & \ldots & 0 \\ 0 & \ldots & GNs \end{bmatrix}$$

represents the concatenated in plane SPIRiT kernels, Gz (19) for the NS slices, $$I = \begin{bmatrix} I1 & \ldots & 0 \\ 0 & \ldots & INs \end{bmatrix}$$

represents NS concatenated Unit matrices. The FFT operator performs the Fast Fourier transform and is the inverse-gridding operation. Also in Eq. 6, the parameter epsilon controls the consistency and trades off data consistency and through-plane coil calibration information with in-plane coil calibration information.

Next we define the operator H as $$H = (P1cF, F2cF, \ldots PNs\,c\,F) = PQ, \quad (7)$$

Where $$P = (p1, p2, \ldots PN) \text{ and } Q = \begin{bmatrix} cF & \ldots & 0 \\ 0 & \ldots & cF \end{bmatrix}$$

and we reformulate Eq. 6 as follows:

$$\text{Argmin} f[m1\,m2\ldots\,mNs] = $$
$$def\|H[m1\,m2\ldots\,mNs] - YMB\|^2 + \lambda 1\|(G-I)[m1\,m2\ldots\,mNs]\|^2$$

Eq. 8 finds Ns images that minimize the slice Spirit joint objective function f(m).

The gradient of the objective function for the separated slices can be written as:

$$\nabla mF[m1\,m2\ldots\,mNs] = \quad (9)$$
$$2H^*(H[m1\,m2\ldots\,mNs] - YMB) + 2\lambda 1(G-I)^*(G-I)[m1\,m2\ldots\,mNs]$$

The operator $H^* = Q^*P^*$ forms the Hermitian adjoint of the MB CAIPIRINHA data acquisition operation, i.e., performs phase demodulation, gridding, the separation of slices in the K space domain and transformation to the image domain. Leaving phase demodulation of data P* intact where $$P^* = [P^*1\,P^*2\ldots\,P^*N]$$

is the phase demodulation operator for all slices, we redefine Q* as follows:

$$Q^* = \begin{bmatrix} F-1K1\hat{c} & \ldots & 0 \\ 0 & \ldots & F-1KNs\,\hat{c} \end{bmatrix} \quad (10)$$

With this solution the first term of the right hand side of Eq. 8 enforces consistency with the acquired data, the second term enforces in plane coil calibration consistency, and through Eqs. 9 and 10, through plane coil sensitivity information is used.

Figure 3:
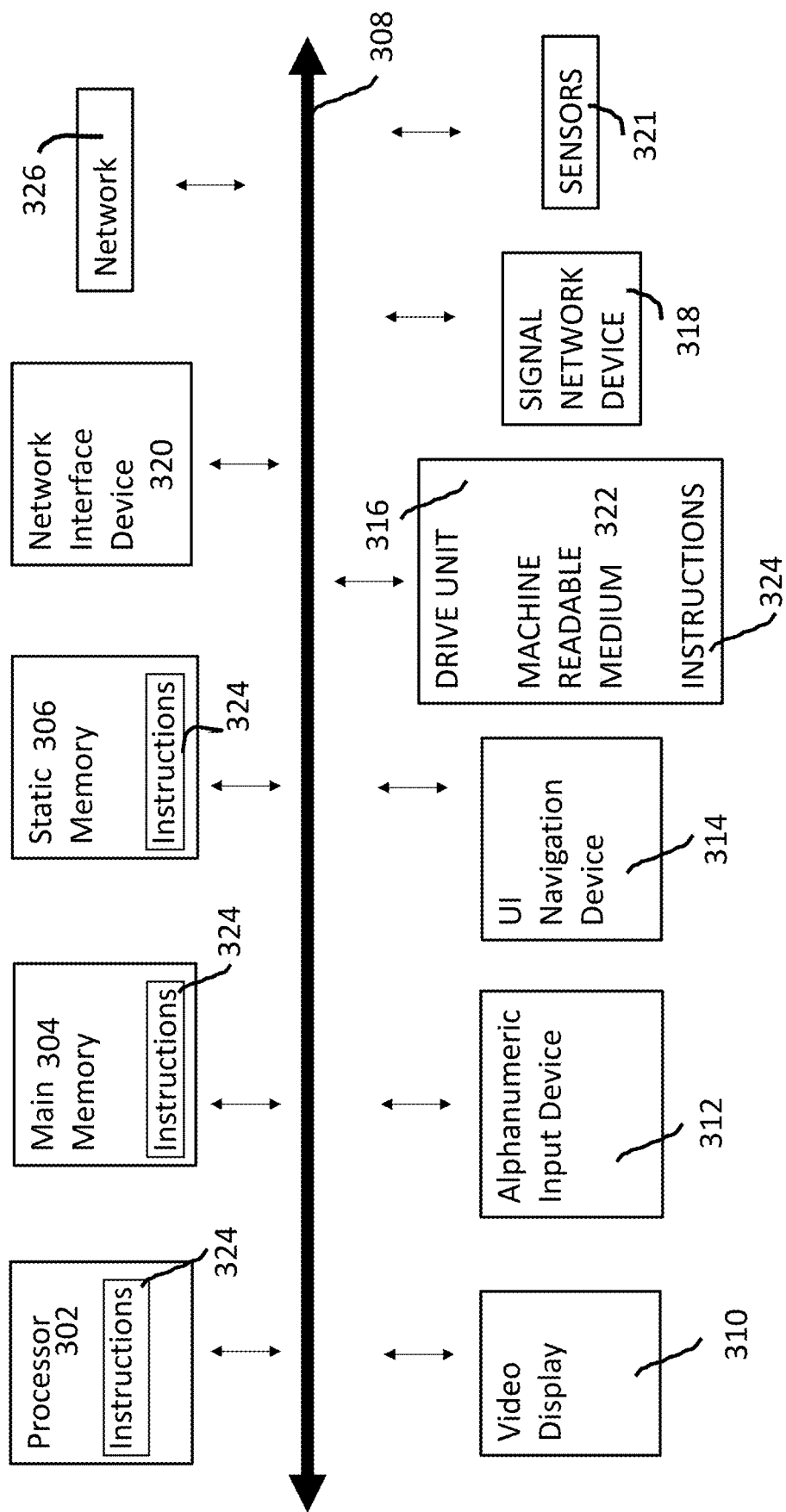
FIG. 3 is a schematic of a computer environment used in accordance with the disclosure herein.

Eq. 8 is solved using the conjugate gradient (CG) framework, as shown in FIG. 3, using the gradient in Eq. 9 and definition of Q* given by Eq. 10. The LSQR method (27) is used as the CG solver for this model. Pseudo-code of slice-SPIRIT is provided in the supporting information S2. The slice SPIRIT model requires both a slice separating kernel, K, and an in plane SPIRIT kernel, G, and both kernels are computed from SB calibration data from the center of k-space, as described above and as described previously (20), respectively.

T-CAIPIRINHA

Cardiac MRI, which often involves dynamic imaging, also presents the opportunity to utilize temporal variation. We alternated the CAIPIRINHA phase modulation pattern as a function of cardiac phase to impart a high temporal frequency to the artifact pattern, and we refer to this method as T-CAPIRINHA. The alternation of the CAIPIRINHA phase is based on cardiac phase, and can be expressed as:

$$pz[l] = \quad (11)$$

$$\left[(m-1)(l-1)\frac{2\pi}{Ns}, \text{ if } T_c \text{ is odd}\right.$$
$$\left.(m-1)(l-1)\left(-\frac{2\pi}{Ns}\right), \text{ if } T_c \text{ is even}\right] \text{with } l = 1, 2 \ldots L$$

After acquiring MB data using T-CAIPIRINHA phase modulation, NCSG or slice-SPIRiT is used to reconstruct the images of each cardiac phase. A temporal filter, as previously performed in UNFOLD (21) and TSENSE (20), is employed to filter the images along the cardiac phase dimension, resulting in a T-non-Cartesian slice-GRAPPA (T-NCSG) method or a T-slice-SPIRiT reconstruction.

Methods

The proposed NCSG, slice-SPIRiT, T-NCSG, and T-slice-SPIRiT methods were evaluated using spiral gradient-echo cine MRI of phantoms and healthy human subjects. All MRI was performed using a 3T system (MAGNETOM Prisma, Siemens Healthcare, Erlangen, Germany) with chest and spine phased-array receiver coils (24-34 channels). Studies were performed to determine the minimal amount of k-space calibration data needed to accurately calibrate the through-plane SG kernel and achieve a high-quality NCSG reconstruction, to compare the various reconstruction methods for phantom and in vivo imaging, and to demonstrate off-resonance corrections for the various methods in the presence of interslice differences in resonant frequency.

Pulse Sequence, Image Reconstruction and Data Analysis

For all experiments, SB and MB data were acquired using an ECG-gated segmented and interleaved spiral gradient echo cine sequence. All volunteers provided informed consent and all volunteer imaging was performed in accordance with protocols approved by our Institutional Review Board. This sequence was an investigational prototype implementation. Breathholding was used for human imaging. For SB acquisitions one slice was acquired per breathhold, while for MB acquisitions slices were acquired per breathhold. A standard sinc pulse was used for SB RF excitation, and simple MB excitation pulses were implemented by summing sinc pulses with appropriate phase modulation, as described (27).

MB excitation pulses for TCAIPIRINHA were implemented using alternation of the CAIPIRINHA phase as described in Eq. 13. For the MB acquisitions, SB kernel calibration data were acquired in one additional heartbeat appended to the end of the MB cine acquisitions. All interleaves of the SB calibration data for each slice were acquired in a single shot, using the minimum TR commensurate with the amount of k-space covered and the number of slices. Calibration data for multiple slices were acquired in a slice-interleaved fashion.

All image reconstruction was performed offline on a desktop computer using MATLAB (The MathWorks, Inc., Natick, Mass.). The non-Cartesian Fourier transform and gridding utilized NUFFT (24) code. The NCSG fitting was based on Cartesian slice-GRAPPA (2) and split slice-GRAPPA (3). The CG slice-SPIRiT reconstruction was based on SPIRiT software (19). As a reference for the reconstruction of non-Cartesian MB data, conjugate gradient SENSE (CG-SENSE) was used (15).

The SG and SPIRiT kernel sizes were all 7×7, as used previously for split slice-GRAPPA (28) and SPIRiT (19). Images were initialized to 0 for all slice-SPIRiT reconstructions. The in-plane calibration weight was set to 1, as done previously for SPIRiT (19). Sensitivity maps were calculated using the method in (29). Tikhonov regularization was added to the CG-SENSE reconstruction. For Tikhonov-regularized CG-SENSE, the regularization parameter was determined by varying the parameter from 0 to 1 and finding the value that minimized the artifact power (15). This approach was applied to MB spiral cine MRI of volunteers, and a regularization parameter value of 0.5 was empirically found to minimize the artifact power relative to matched SB reference images. For the iterative CG-SENSE and slice-SPIRiT algorithms, the iterative procedure was terminated when the change in the data consistency term was less than 10-5 or a preset number of iterations was reached (15). The reconstructed images using NCSG and slice-SPIRiT from the individual coil channels were combined using the root of the sum of squares method (2,30).

For off-resonance corrections, we assumed a constant off-resonance frequency for each slice, but different off-resonance frequencies for different slices. For the NCSG method, off-resonance corrections for each slice were performed on spiral data after phase demodulation as described by Eq. 3. The slice-SPIRiT off-resonance correction was similar to that performed in SPIRiT. Specifically, the off-resonance correction was included in the and operations.

The NUFFT reconstructions of SB images acquired at matched location were used as the reference standard to quantify the errors of the various MB reconstruction methods. Using these reference standards, the relative root mean square error (rRMSE) (31) or the artifact power (15) was computed for each reconstruction method. The rRMSE for coil-by-coil reconstructions was computed as:

$$Rrmse = \frac{1}{N}\sqrt{\sum \frac{|mz - mz\sim|^2}{|mz\sim|^2}} \qquad (12)$$

Where m~ is the NUFFT (24) of the SB image, mz is the separated MB image, and Nx×Ny is the total number of pixels.

Artifact power (AP), which was used to quantify the quality of MB-separated images in a prior radial SMS CG-SENSE study (15), was used to compare the slice-GRAPPA-based methods with CG-SENSE. AP was defined as:

$$AP = Rrmse = \frac{1}{N}\sqrt{\frac{\Sigma|mz - mz\sim|^2}{\Sigma|mz\sim|^2}} \qquad (13)$$

Determination of Minimal Amount of Calibration Data for NCSG

Simulations were performed using SB data from five volunteer to determine the minimal amount of k-space data needed to calibrate an SG kernel and achieve a high-quality NCSG MB reconstruction. SB gradient echo spiral cine images were acquired from a human subject for three cardiac short-axis slices at basal, mid-ventricular, and apical locations. Sequence parameters included: field of view (FOV)=340×340–350×350 mm2, slice thickness=8 mm, 18 spiral interleaves (uniform density) per image, 2 interleaves per heartbeat, spiral readout length=2.18 ms, in-plane spatial resolution=
2.7×2.7 mm2, TR=15 ms, TE=1.08 ms, temporal resolution=30 ms, and flip angle=15°. The total scan time was 9 heartbeats and 24-30 cardiac phases were acquired. The inter-slice gap was 15-16 mm. All cardiac cine imaging was performed using breath holding.

Synthetic MB data were generated from these SB images using Eq. 1. Then, different percentages (5-100% in steps of 5) of the spiral k-space data (from the center out) were used to calibrate the SG kernels, and NCSG reconstructions were performed using those kernels. The resulting image quality was quantified using rRMSE, where the SB images were the reference standard.

Comparison of CG-SENSE, NCSG, and Slice-SPIRiT

NCSG and slice-SPIRiT were evaluated using phantoms and volunteer cardiac imaging, and CG-SENSE was used as a standard reconstruction method for non-Cartesian MB data (15). For the phantom experiments, a tomato was imaged at 3 axial slices using SB and MB spiral gradient-echo cine acquisitions. Sequence parameters included:

FOV=150×150 mm2, slice thickness=8 mm, 18 spiral interleaves, 2 interleaves per heartbeat, spiral readout length of 2.18 ms, in-plane spatial resolution of 1.2×1.2 mm2, TR=8 ms, TE=1.08 ms, and flip angle=15°. The inter-slice gap was 16 mm. The ECG was simulated. At the end of the MB acquisition, three SB spiral k-space centers covering 35% of k-space were acquired for kernel calibration and the calculation of sensitivity maps. Other than SB vs. MB excitation, the SB and MB images were acquired using identical parameters.

Similar studies were performed in five human volunteers. SB and MB cardiac short-axis spiral cine images were acquired at basal, mid-ventricular, and apical locations. Sequence parameters were the same as those used to determination of minimal amount of calibration data for the GRAPPA kernel. At the end of the MB acquisition, in one additional heartbeat, three SB spiral k-space centers covering 35% of k-space were acquired for kernel calibration and the calculation of the sensitivity maps.

Cardiac imaging was ECG-gated and volunteers were instructed to hold their breath during image acquisition. The MB phantom and volunteer datasets were reconstructed using non-Cartesian slice-GRAPPA, slice-SPIRiT, and CG-SENSE. Artifact power was computed using SB images as reference standard data.

Evaluation of T-NCSG and T-Slice-SPIRiT

To evaluate the T-NCSG and T-slice-SPIRiT methods, the volunteers were also scanned using T-CAIPIRINHA. Other than performing T-CAIPIRINHA phase modulation, these acquisitions were identical to the MB volunteer scans described above. Relative RMSE was computed using SB images as reference standard data.

Evaluation of NCSG and slice-SPIRiT in the presence of slice-to-slice differences in off-resonance frequency We sought to demonstrate that the proposed NCSG and slice-SPIRiT MB reconstruction methods could incorporate off-resonance corrections when the off resonance frequencies are different for different slice locations. For this experiment, synthetic MB data were generated using three SB spiral images of a phantom acquired at three locations, where each location had a different off-resonance frequency. The following sequence parameters were used: FOV=320× 320 mm2, slice thickness=8 mm, 6 spiral interleaves per image, 2 interleaves per simulated heartbeat, spiral readout length of 5.6 ms, in-plane spatial resolution of 2.5×2.5 mm2, TR=15 ms, TE=1.08 ms, flip angle=15°, and off-resonance frequencies set to 100 Hz, 140 Hz, 180 Hz for the three slices, respectively.

Results

Calibration Data Required for NCSG

Figure 4:
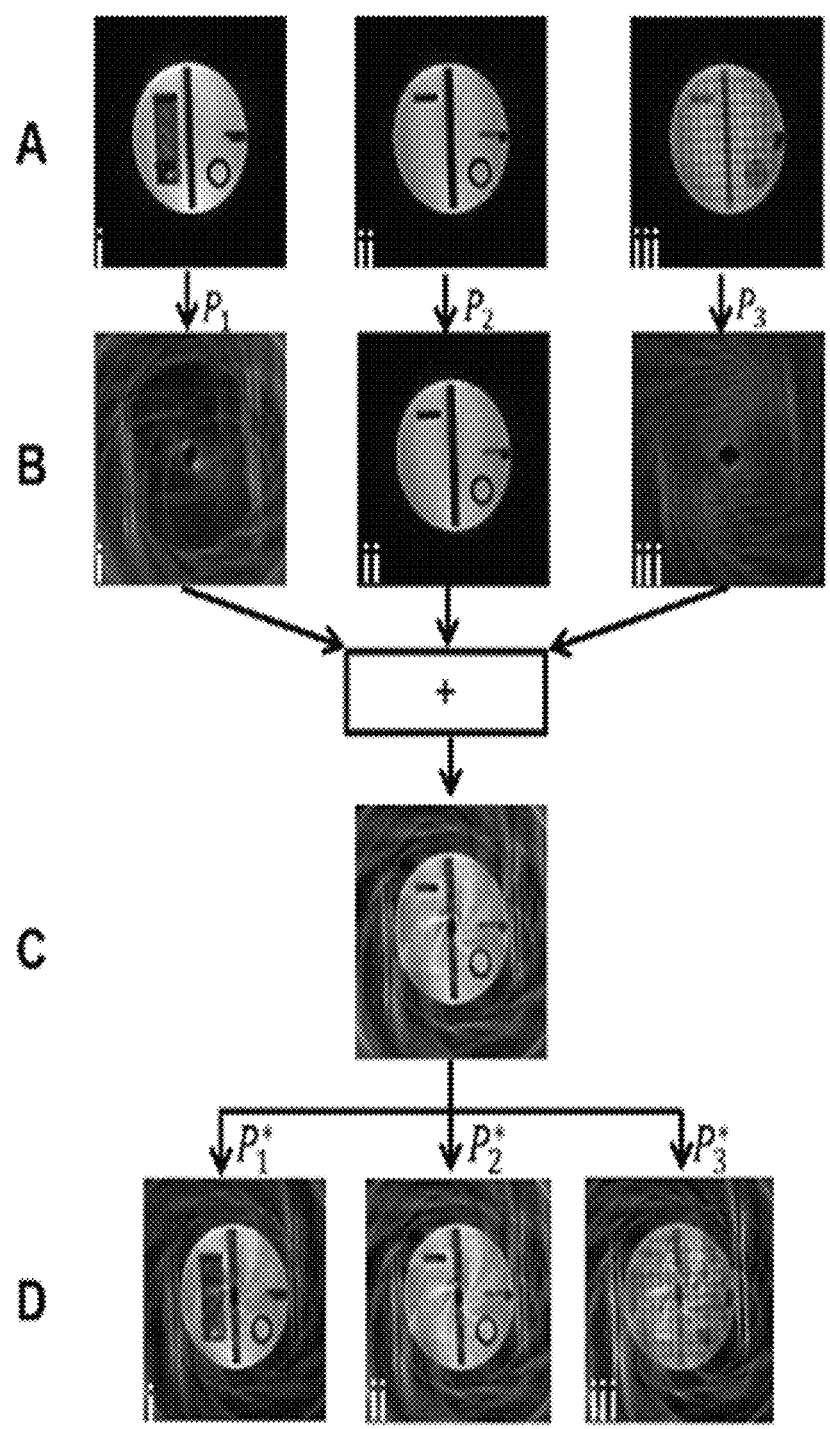
FIG. 4 is an example display of output images according to the disclosure herein. herein and shows the effect of CAIPIRINHA phase modulation on multiband (MB) spiral data. Three single band (SB) slices of a phantom are shown in (A). MB image (C) is equal to the sum of the slice with no phase modulation (B(ii)) and the slices with phase modulation (B(i)) and (B(iii)), as described by Eq. 1. is the phase modulation matrix corresponding to slice z. Phase modulation of spiral MRI is seen to largely cause signal cancellation (B(i)) and (B(iii)). The application of slice-specific phase demodulation to MB data emphasizes the image of that slice, and includes residual signal from other slices (D). is the phase demodulation matrix corresponding to slice z, as described by Eq. 3.

Simulated MB data from SB cardiac acquisitions were used to study the dependence of the SG kernel and reconstruction method on the amount of kernel calibration data. In FIG. 4, example images reconstructed using the central 15% (FIG. 4a-c) and 35% (FIG. 4d-f) of k-space for calibration are shown, as are corresponding artifacts relative to the fully-sampled SB reference images (FIG. 4m-o). FIG. 4a-c shows more artifacts (arrows) than FIG. 4d-f with respect to the SB images, and this result is further demonstrated in FIG. 4g-i and FIG. 4j-l, where the difference images relative to the SB images are shown, respectively. FIG. 4p shows the dependence of rRMSE on the percentage of k-space used for kernel calibration. Similar results were found for all volunteers. Based on these results, we use the central 35% of k-space for kernel calibration, which, based on FIG. 4p, is a conservative choice.

Comparison of CG-SENSE, NCSG, and Slice-SPIRiT

Figure 5:
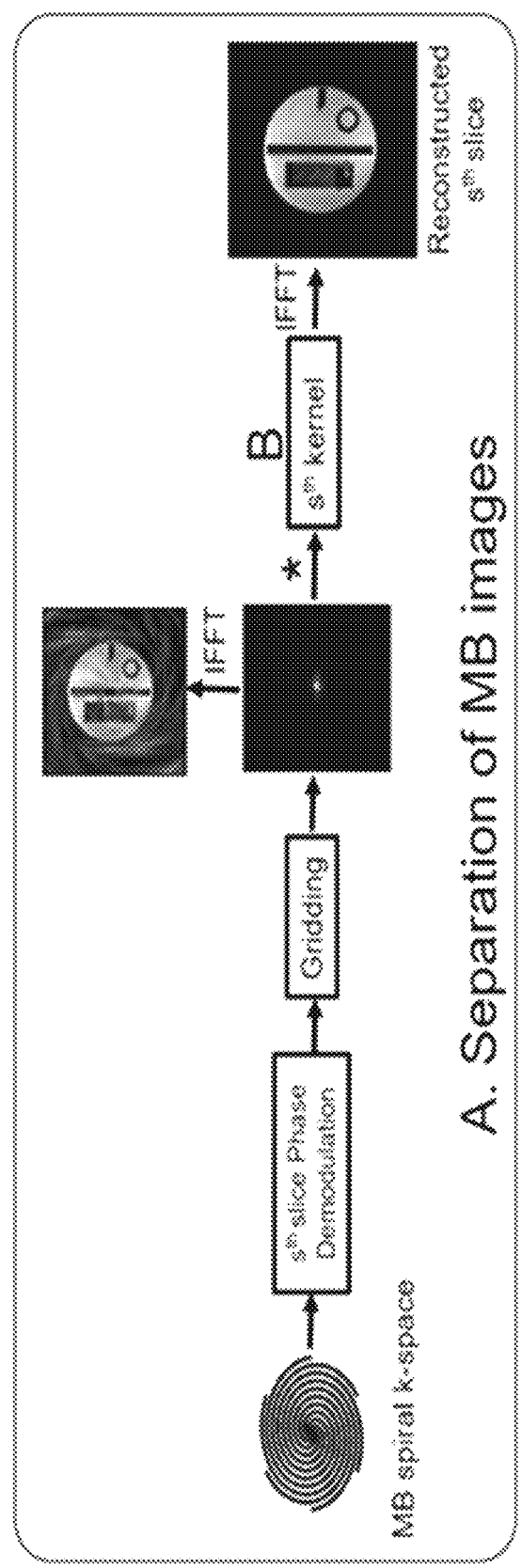
FIG. 5 is a flow chart of one method of reconstructing image data from acquired MRI data.

We compared the NCSG and slice-SPIRiT methods to CG-SENSE by imaging a tomato phantom (where there is no motion and SB images are perfectly matched with MB images) and by imaging healthy subjects. FIG. 5 shows the results from the phantom experiment. Example images and displays of the difference between MB reconstructions and SB images show that CG-SENSE produced the highest artifact levels, with NCSG providing a reduction in artifact level and slice-SPIRiT providing the lowest level of artifact. All methods used 35% of SB k-space for kernel calibration or computation of sensitivity maps. The mean artifact powers were 0.092, 0.074 and 0.068 for CG-SENSE, NCSG and slice-SPIRiT, respectively.

Figure 6:
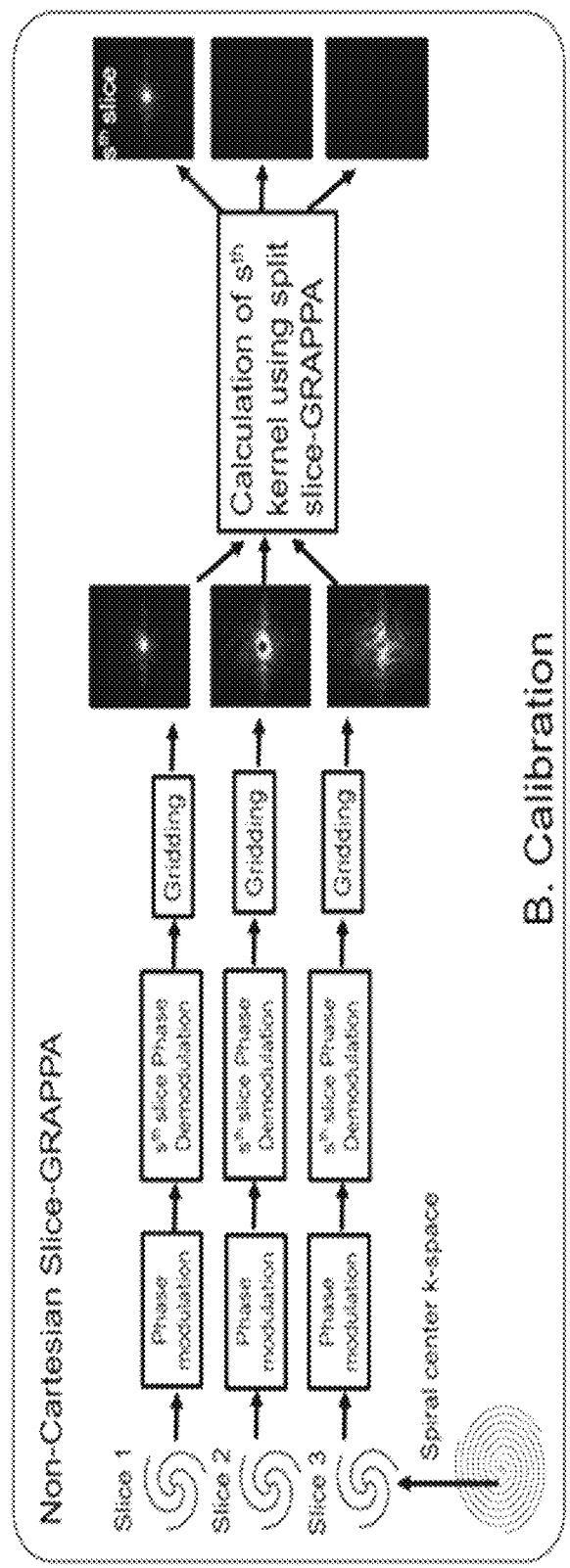
FIG. 6 is a flow chart of one method of reconstructing image data from acquired MRI data.

Results from a volunteer are shown in FIG. 6 with MB images reconstructed by CGSENSE(a-c), NCSG (d-f), and slice-SPIRiT (g-i). For comparison, SB images acquired at matched locations are shown in panels (j-l). Image artifacts were most apparent in the CG-SENSE images (red arrows), with NCSG- and slice-SPIRiT-reconstructed images demonstrating progressive reductions in artifact. These observations are consistent with measurements of artifact power from all 5 volunteers using the SB images as the ground truth, as shown in FIG. 6m. For the five volunteers, the artifact power was 0.182±0.037, 0.148±0.036, and 0.139±0.034 for CG-SENSE, NCSG and slice-SPIRiT, respectively ($p<0.05$, ANOVA). The artifact power of NCSG was 18.7% lower than CG-SENSE ($p<0.05$) and the artifact power of slice-SPIRiT was 6.1% lower than NCSG ($p<0.05$). The rRMSE of slice-SPIRiT was 3.5% lower than NCSG (0.0055±0.00049 vs 0.0057±0.00050 for slice-SPIRiT vs. NCSG, $p<0.05$, N=5). The average computation times per image for CG-SENSE, NCSG, and slice-SPIRiT were 21.8, 6.6, and 58.7 seconds, respectively. All reconstructions were performed in MATLAB on a desktop computer (3.4 GHz Intel(R)i7 CPU with 24 GB RAM).

Evaluation of T-NCSG and T-slice-SPIRiT

Figure 7:
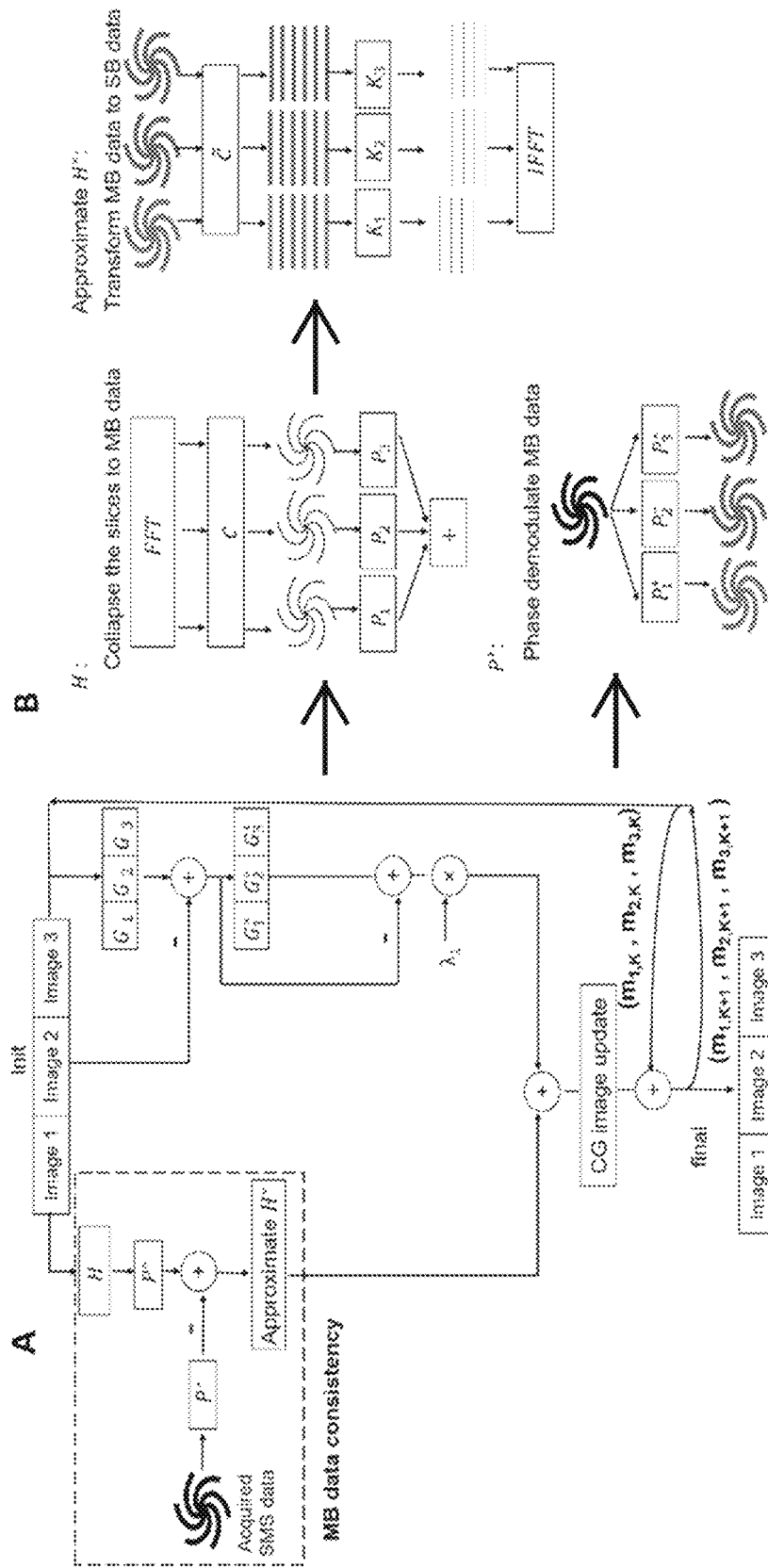
FIG. 7 is a flow chart of one method of reconstructing image data from acquired MRI data. It is a schematic of the conjugate gradient solution of the slice-SPIRiT model of Eq. 9. (A) Images of all slices are initialized to zero. The left side of (A) depicts consistency with the collapsed MB data, utilizing the slice-collapsing (H) and slice separating operations (H*), as well as slice-specific phase demodulation of the CAIPIRINHA-modulated MB data. The right side of (A) represents in-plane data and coil consistency for the separated slices, utilizing the SPIRiT kernels. In (B), the H operator (Eq. 10) is depicted in greater detail, including the FFT, gridding, phase modulation, summation, and slice-specific phase demodulation operations. The approximation of the H* operator (Eq. 12) is also depicted, including gridding, application of the slice-separating SGs kernels, and the IFFT transform. Bold k-space trajectories indicate MB k-space data, while non-bold k-space trajectories indicate SB k-space data.

Temporal alternation of CAIPIRINHA was evaluated by acquiring T-CAIPIRINHA MB data from volunteers and reconstructing images using NCSG, T-NCSG, slice-SPIRiT, and T-slice-SPIRiT. Example images from one volunteer are shown in FIG. 7 with reconstruction of the same dataset by NCSG (a-c), T-NCSG (d-f), slice-SPIRiT (g-t) and T-slice-SPIRiT (j-l) SB images of matched slices are shown in panels (m-o). These images demonstrate improved artifact suppression using T-NCSG vs. NCSG and using T-slice-SPIRiT vs. slice-SPIRiT. As shown in panel p, the rRMSE (31) of T-NCSG was 11.3% lower than NCSG (0.0063±0.00089 vs 0.0071±0.000093 for T-NCSG vs. NCSG, $p<0.05$, N=5). The rRMSE of T-slice-SPIRiT was 17.4% lower than slice-SPIRiT (0.0057±0.00074 vs 0.0069±0.000081 for T-slice-SPIRiT vs. slice-SPIRiT, $p<0.05$, N=5), and 19.7% lower than NCSG.

Figure 8:
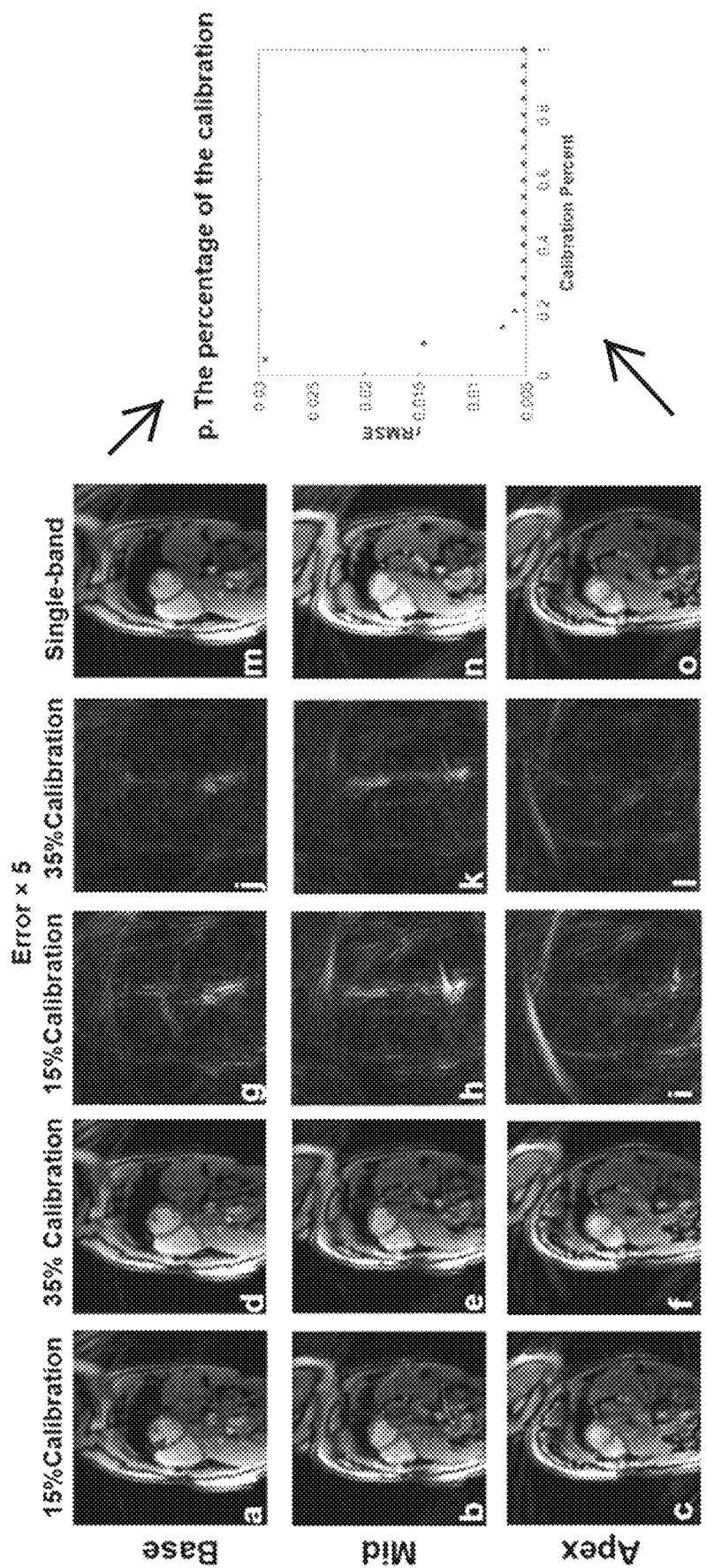
FIG. 8 is an example output images according to the disclosure herein.

Evaluation of NCSG and Slice-SPIRiT in the Presence of Slice-to-Slice Differences in Off-Resonance Frequency FIG. 8 shows the result of off-resonance-corrected NCSG (d-f) and slice-SPIRiT (g-i) reconstructions of synthetic MB images, as well as the off-resonance corrected SB images as the standards (j-l). The SB images acquired with off-resonance frequencies intentionally set to 100 Hz, 140 Hz, 180 Hz and reconstructed without off-resonance correction are shown in (a-c). Visual inspection of the images demonstrates effective deblurring of MB data under conditions where the off-resonance frequency varies from slice to slice.

Discussion

The major findings of this study are 1) MB spiral MRI with CAIPIRINHA largely causes signal cancellation of phase-modulated slices and the application of slice-specific phase demodulation to MB data emphasizes the image of that slice; 2) for MB imaging with a constant density spiral trajectory and without in-plane undersampling, the NCSG and slice-SPIRiT methods provide high-quality MB reconstructions using SB kernel calibration data requiring just 25-35% of the center of k-space; 3) an effective through plane slice-separating SG kernel can be computed using CAIPIRINHA phase modulation of all slices, phase demodulation of a specific slice, gridding, and the Cartesian split slice-GRAPPA model; 4) for a constant density spiral trajectory and without in-plane undersampling, the non-iterative NCSG method using just a slice separating kernel applied to phase-demodulated k-space data provides better image quality than the iterative CG-SENSE method; 5) the iterative slice-SPIRiT model combines through-plane coil calibration consistency, in-plane coil calibration consistency, consistency with acquired data and joint estimation of all slices; 6) a key part of the iterative slice-SPIRiT model involves the use of the slice-separating SG kernel to approximately conjugate the MB CAIPIRINHA data acquisition operation and to approximate the slice-by-slice gradient in the conjugate gradient algorithm; 7) the slice-SPIRiT method provides improved reconstructions compared to NCSG by further reducing image artifacts; and 8) for dynamic imaging such as cardiac cine imaging, TCAIPIRINHA imparts a high temporal frequency to the MB artifact pattern and a temporal filter applied after NCSG or slice-SPIRiT reconstructions further reduces artifacts.

Insights into the NCSG Method

The NCSG method developed here is based on the prior work of split slice-GRAPPA for Cartesian MB imaging (3), and on work showing the effect on MB images of CAIPIRINHA phase modulation using non-Cartesian k-space trajectories (15). Because phase demodulation for a specific slice largely emphasizes that slice (albeit with residual signal from other slices), after gridding, these operations combined with the Cartesian split slice-GRAPPA method enable the calculation of effective slice separating kernels. A key difference compared to the Cartesian case is the application of phase demodulation prior to computing the SG kernels. For each slice, our method applies a single kernel computed from the central k-space data to all of k-space, which is different than prior approaches for non-Cartesian GRAPPA, where different kernels are computed for different k-space sectors (17,18). The use of a single kernel, as opposed to a potentially large number of kernels (17), greatly simplifies the acquisition of calibration data as well as kernel construction.

Insights into the Slice-SPIRiT Method

The slice-SPIRiT method developed here is based on the prior work of split slice-GRAPPA for reconstructing MB images and SPIRiT, a PI reconstruction method. The second term of the slice-SPIRiT optimization equation is very similar to the second term of SPIRiT, and enforces in-plane coil calibration consistency for each slice. The first term of the slice-SPIRiT optimization equation combines the SPIRiT data consistency concept with the split slice-GRAPPA concept of a k-space domain slice-separating GRAPPA kernel. In this way, the first term enforces both consistency with the acquired MB data and through-plane coil calibration consistency. The through-plane coil calibration consistency is enforced because the slice-separating SG kernel is used in the gradient calculation within the conjugate gradient algorithm. Another important point is that in the conjugate gradient algorithm, we used a slice-separating SG kernel to calculate the separate gradients for the different slices. Separate gradients are needed so that the separate slices iterate toward their solutions, while at the same time the method enforces consistency with the collapsed MB k-space data, providing joint estimation of all the slices. While the slice-separating SG kernel is not the analytical gradient, the information in the kernel helps separate the slices effectively, yielding the desired solution. As formulated, slice-SPIRiT may be readily extended in the future to use Tikhonov or other regularizations, employ the L1 norm (13), and exploit spatial sparsity (32), temporal sparsity (33), and low rank constraints, which may lead to further improvements in image quality and greater acceleration.

Use of in-plane and through-plane coil sensitivities for non-Cartesian MB reconstructions Previous studies on non-Cartesian MB imaging utilized in-plane coil sensitivity maps (15,18,34) or multiple through-plane GRAPPA kernels (17, 18). Our comparison of CGSENSE, NCSG and slice-SPIRiT may be viewed as a comparison of using only in-plane coil sensitivity information (CG-SENSE), using only through-plane kernel calibration information (NCSG), and using both in-plane and through-plane coil sensitivity information (slice-SPIRiT). While CG-SENSE and NCSG are effective, using both in-plane and through-plane coil information simultaneously with slice-SPIRiT, image artifacts were further reduced.

Termination of the Iterative Algorithm

Figure 9:
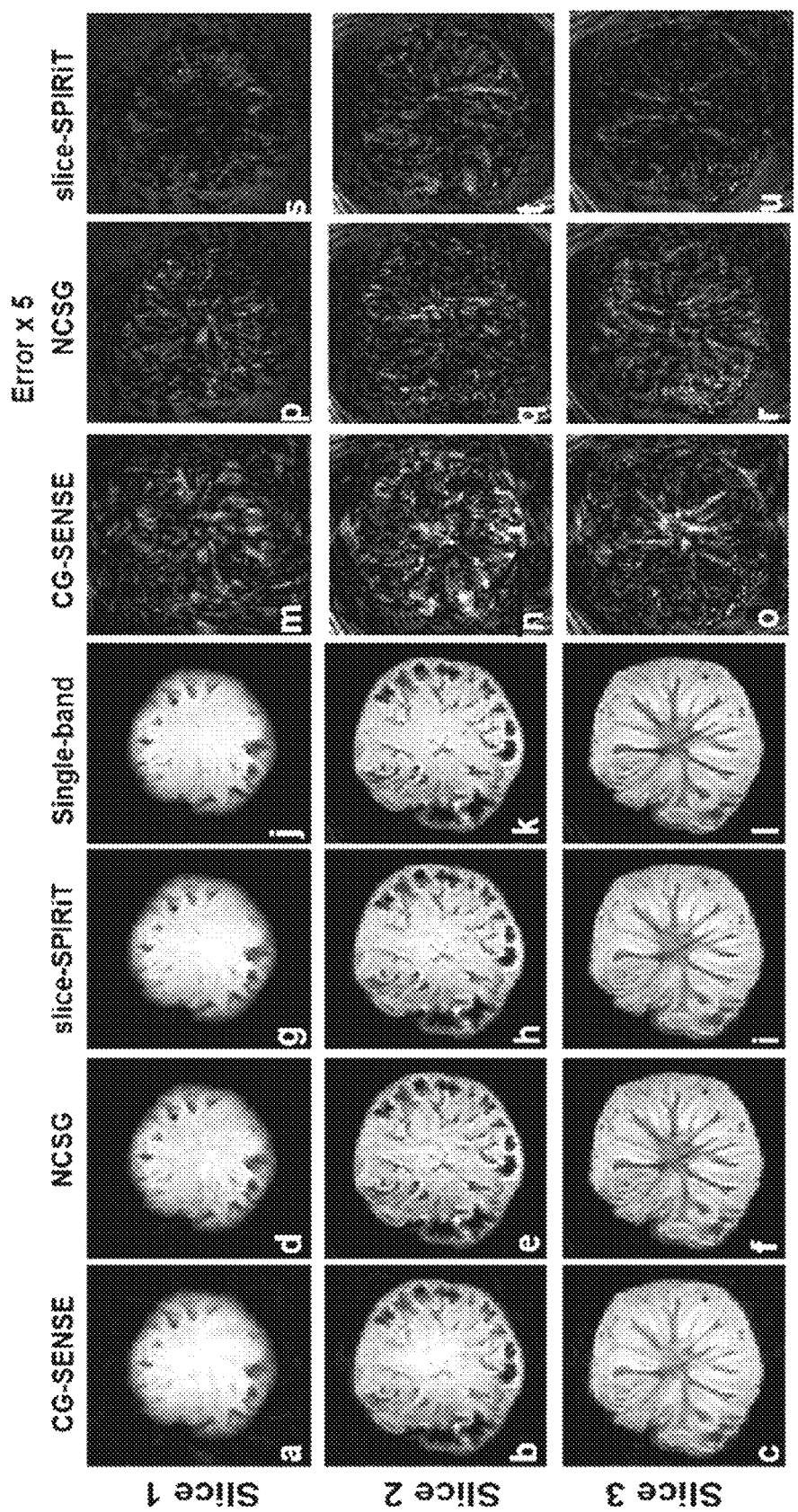
FIG. 9 is an example output images according to the disclosure herein.
Figure 10:
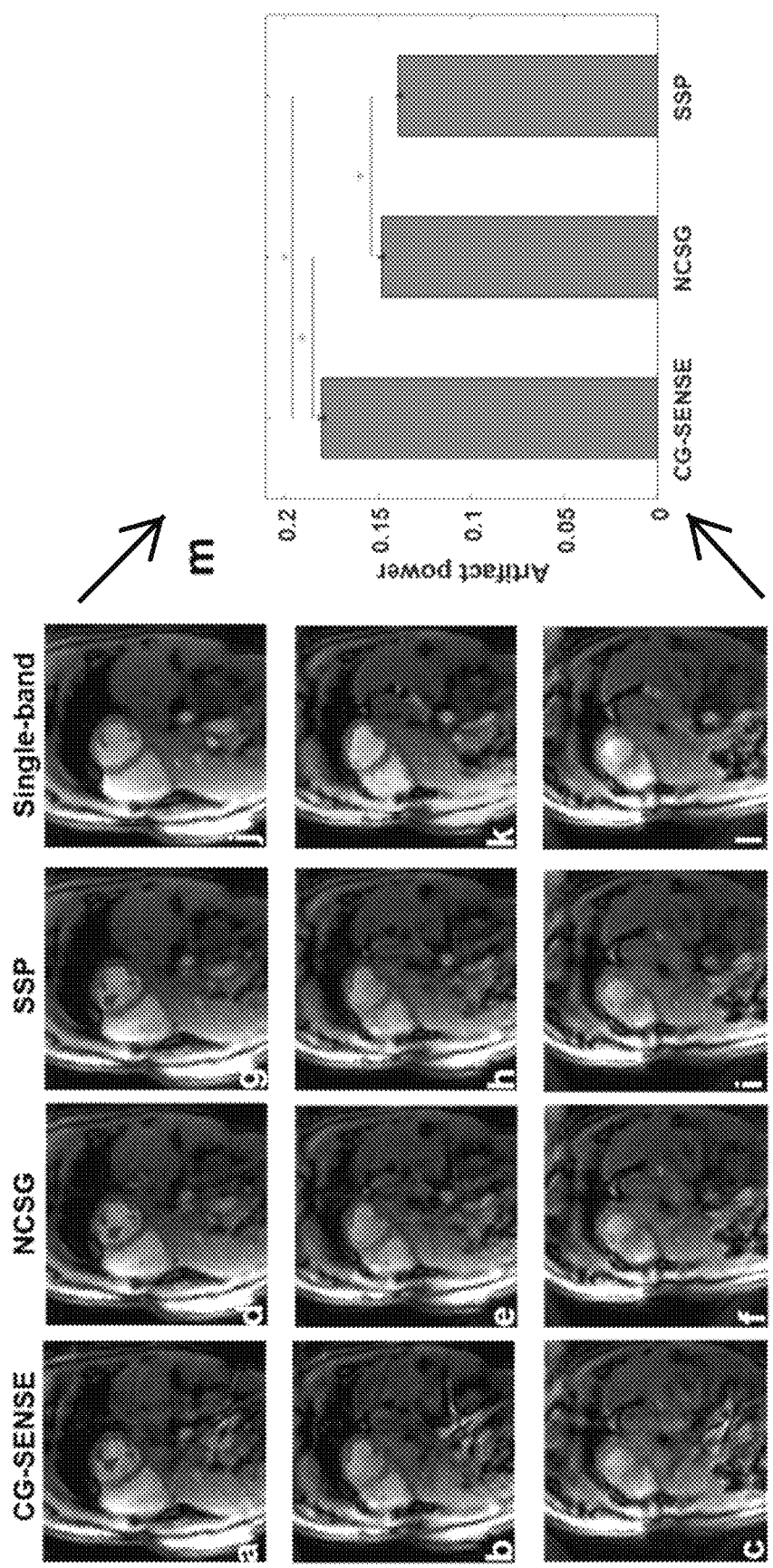
FIG. 10 is an example output images according to the disclosure herein.
Figure 11:
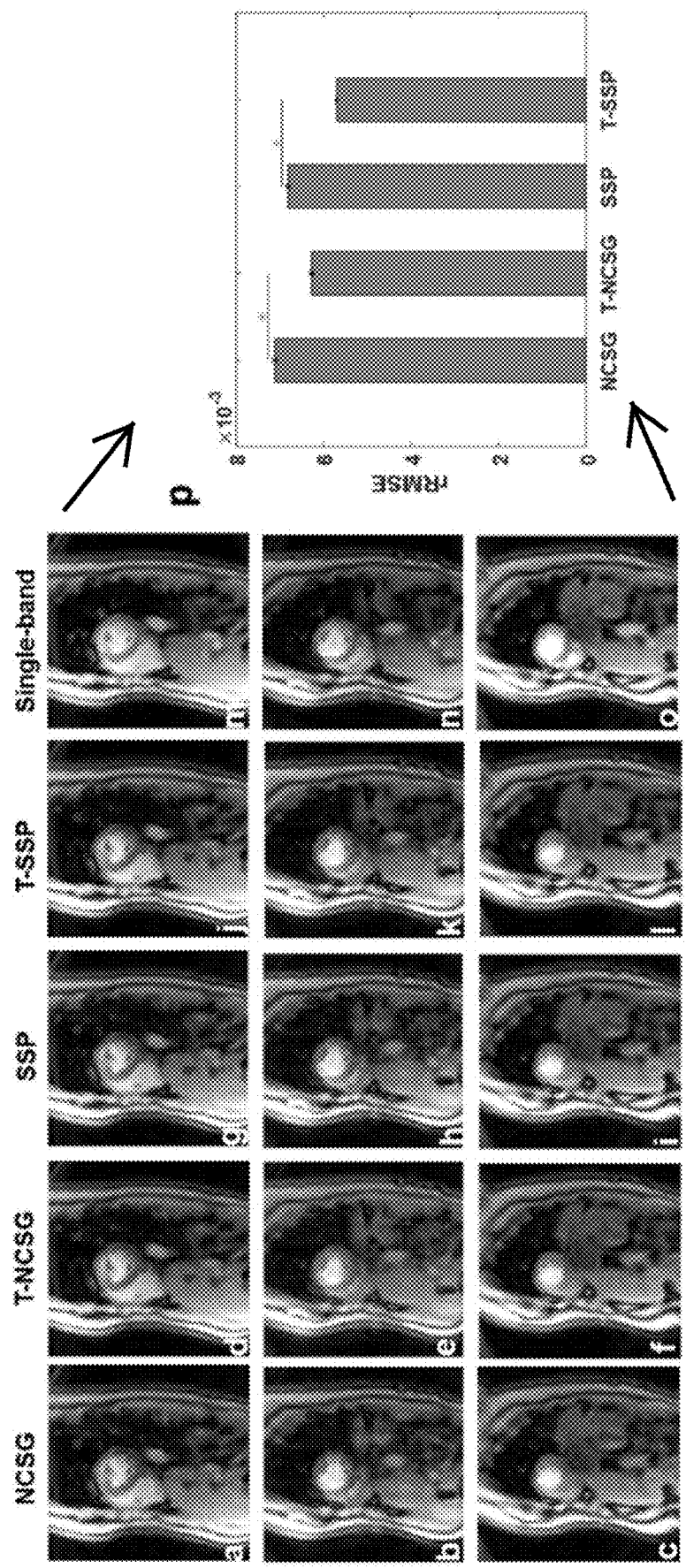
FIG. 11 is an example output images according to the disclosure herein.
Figure 12:
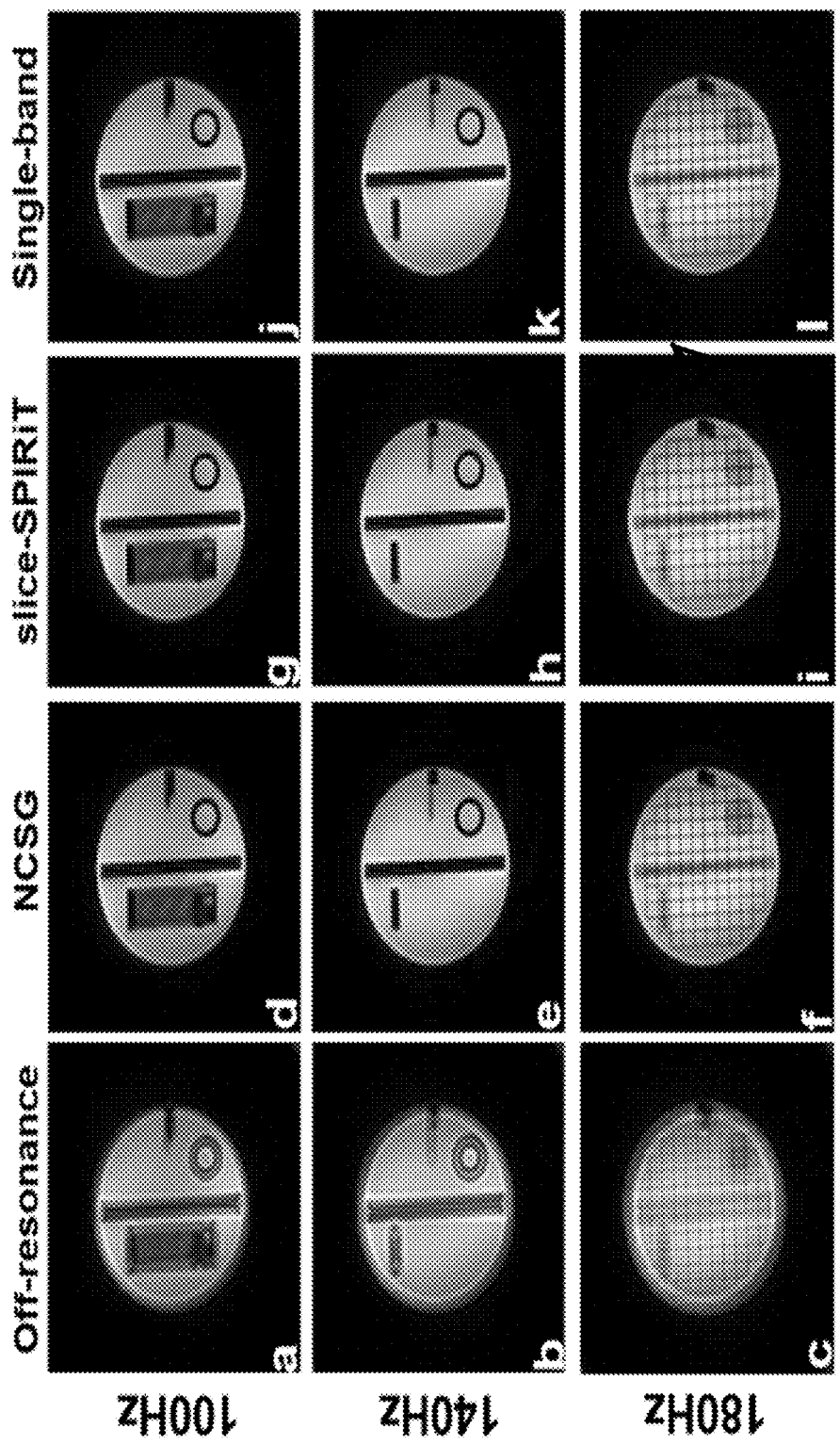
FIG. 12 illustrates example output images according to the disclosure herein.
Figure 13A:
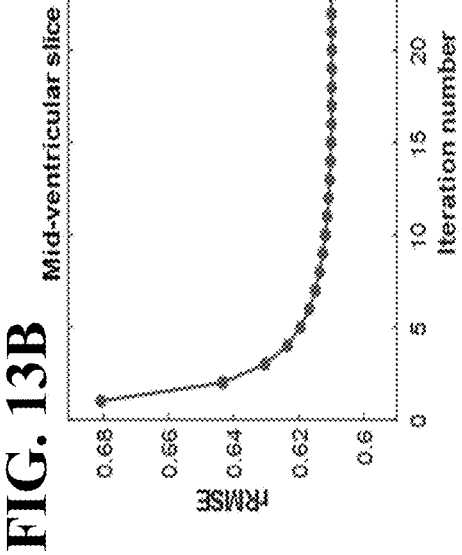
FIG. 13A is an example output image of a basal slice according to the disclosure herein.
Figure 13B:
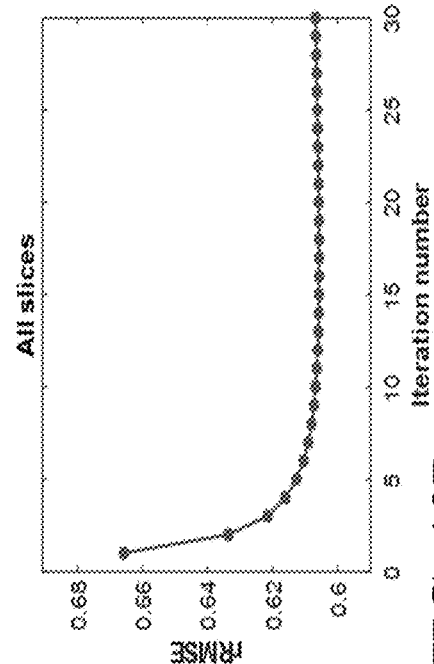
FIG. 13B is an example output image of a mid-ventricular slice according to the disclosure herein.
Figure 13C:
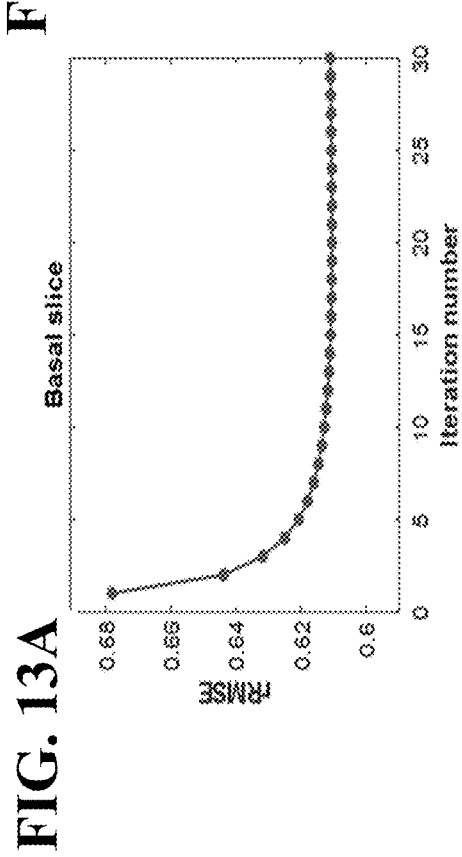
FIG. 13C is an example output image of an apical slice according to the disclosure herein.
Figure 13D:
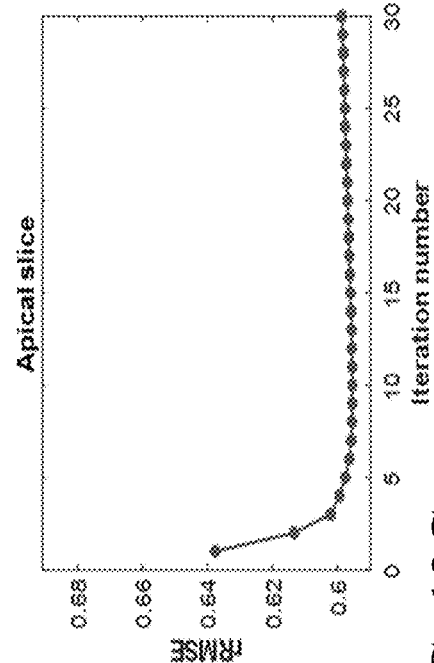
FIG. 13D is an example output image of all slices according to the disclosure herein.
Figure 14A:
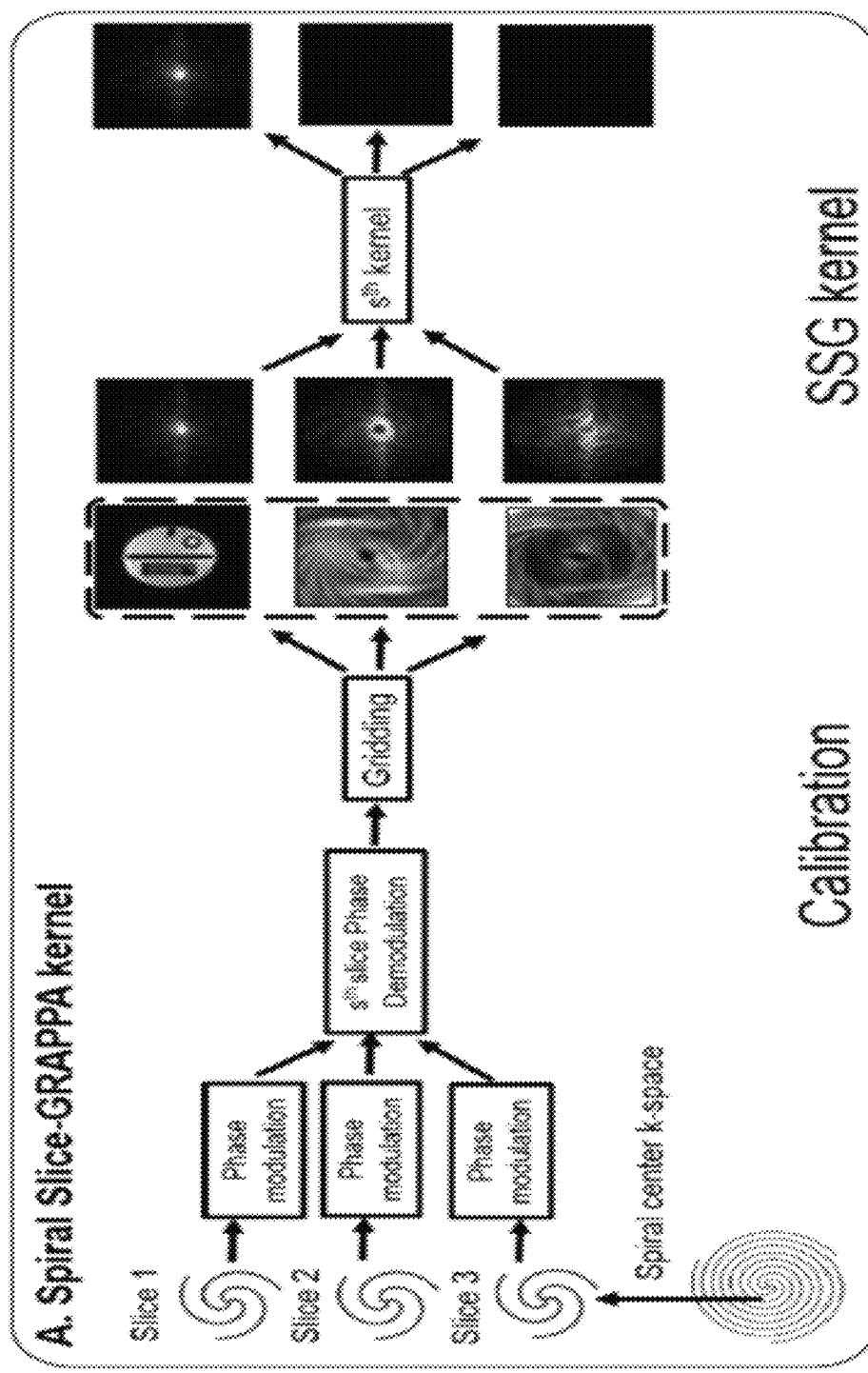
Figure 14B:
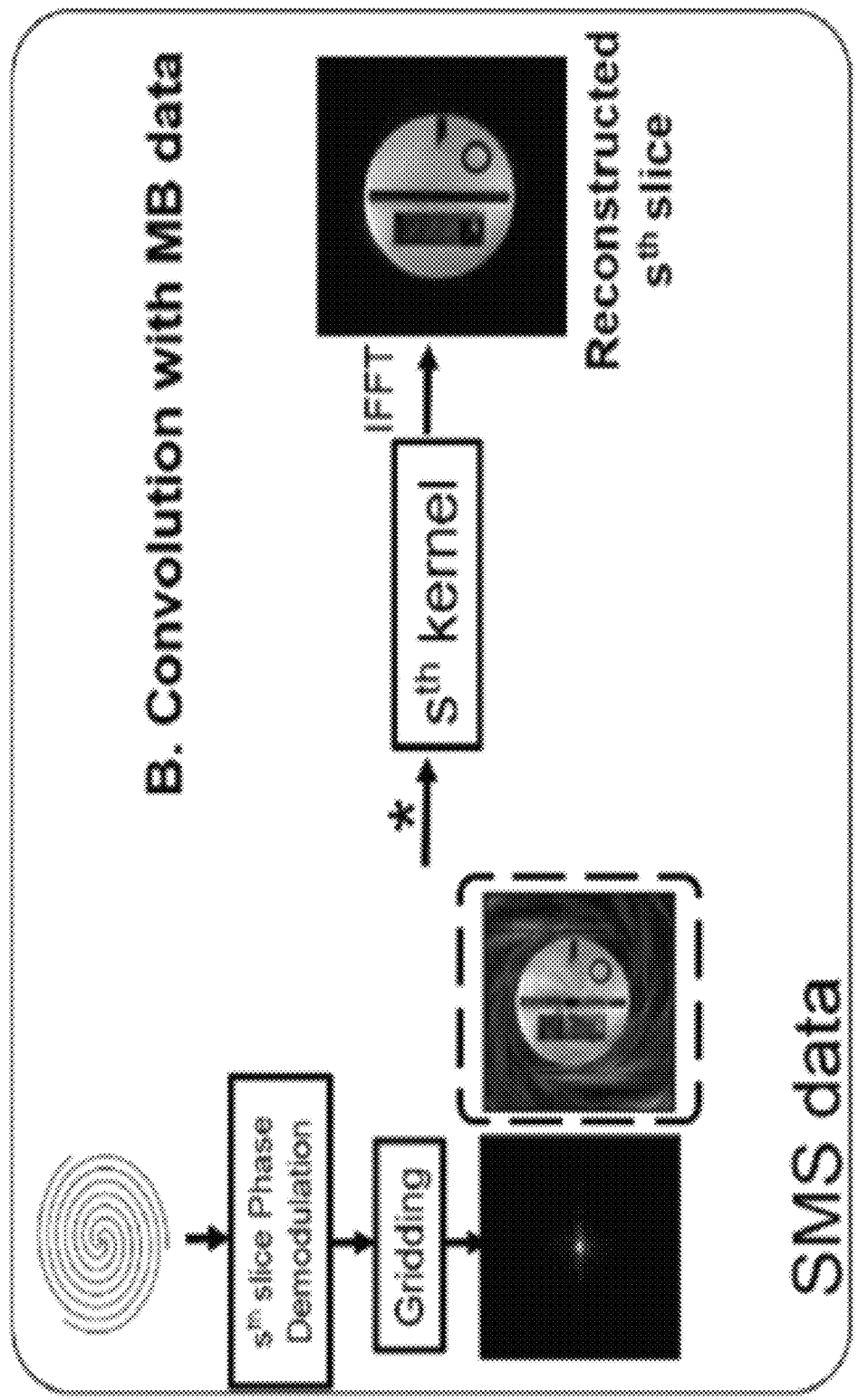
FIG. 14B is a continuation of the flow chart of FIG. 14A. Next, gridding is performed on all slices, and the split-slice GRAPPA method is applied to fit the slice-GRAPPA kernel of the sth slice. For MB data, the sth slice-GRAPPA kernel is applied after phase demodulation corresponding to the sth slice and gridding, followed by the IFFT. This process repeats for each of the slices.
Figure 15:
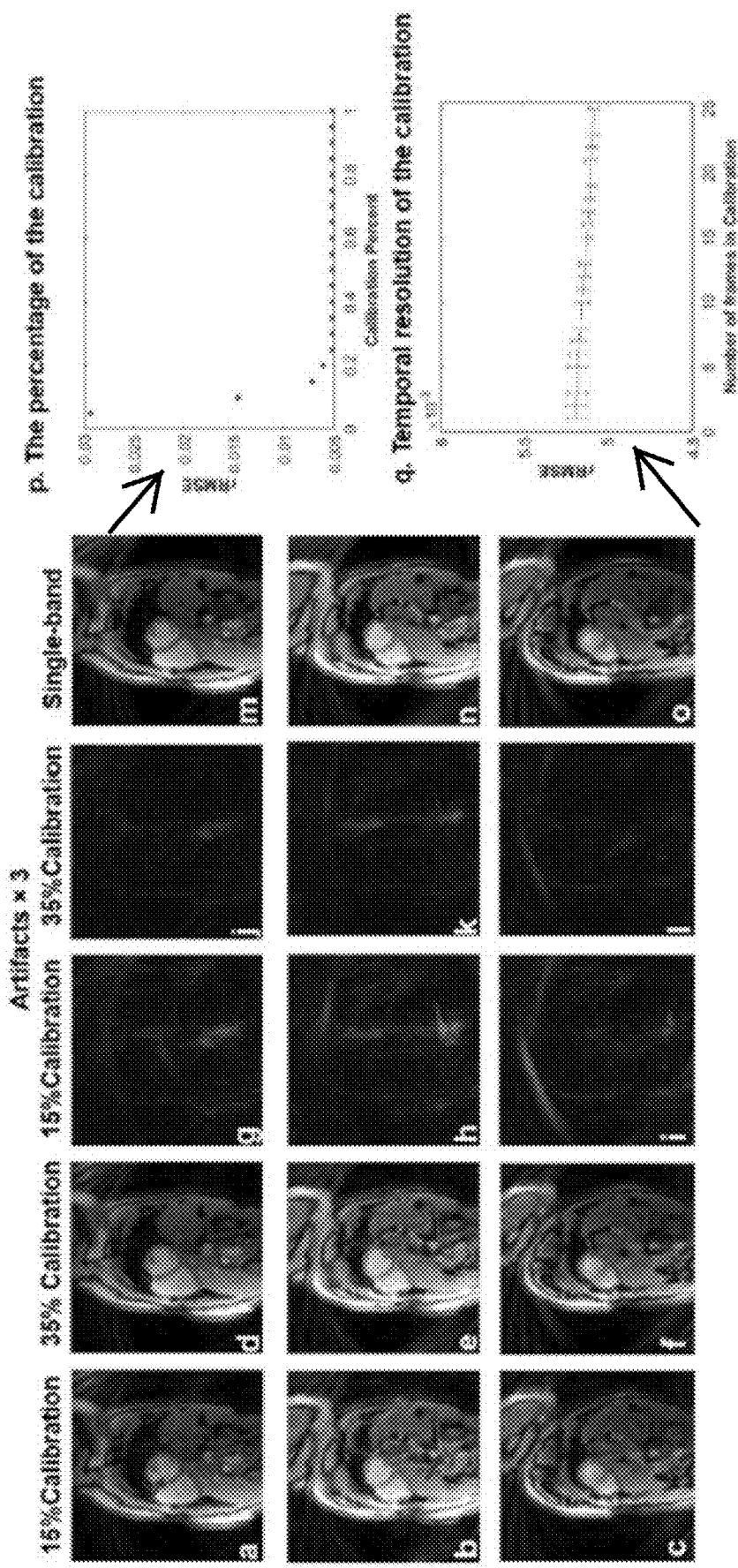
FIG. 15 is an example of output images according to the disclosure herein. The separation of MB images using spiral slice-GRAPPA improves as the percentage of the calibration k-space data approaches 25-30%. The temporal resolution of the calibration has little effect on rRMSE. These results are from synthesized data generated using three SB short-axis cine images at basal, mid-ventricular and apical locations. The image reconstruction used 15% of k-space (a-c) and 35% of k-space (d-f) for the calibration. The artifacts (j-l) were relative to SB images (m-o). rRMSE as a function of the percentage of calibration k-space is shown in (p), and the simulated effect of the temporal resolution of the calibration data on rRMSE is shown in (q).
Figure 16:
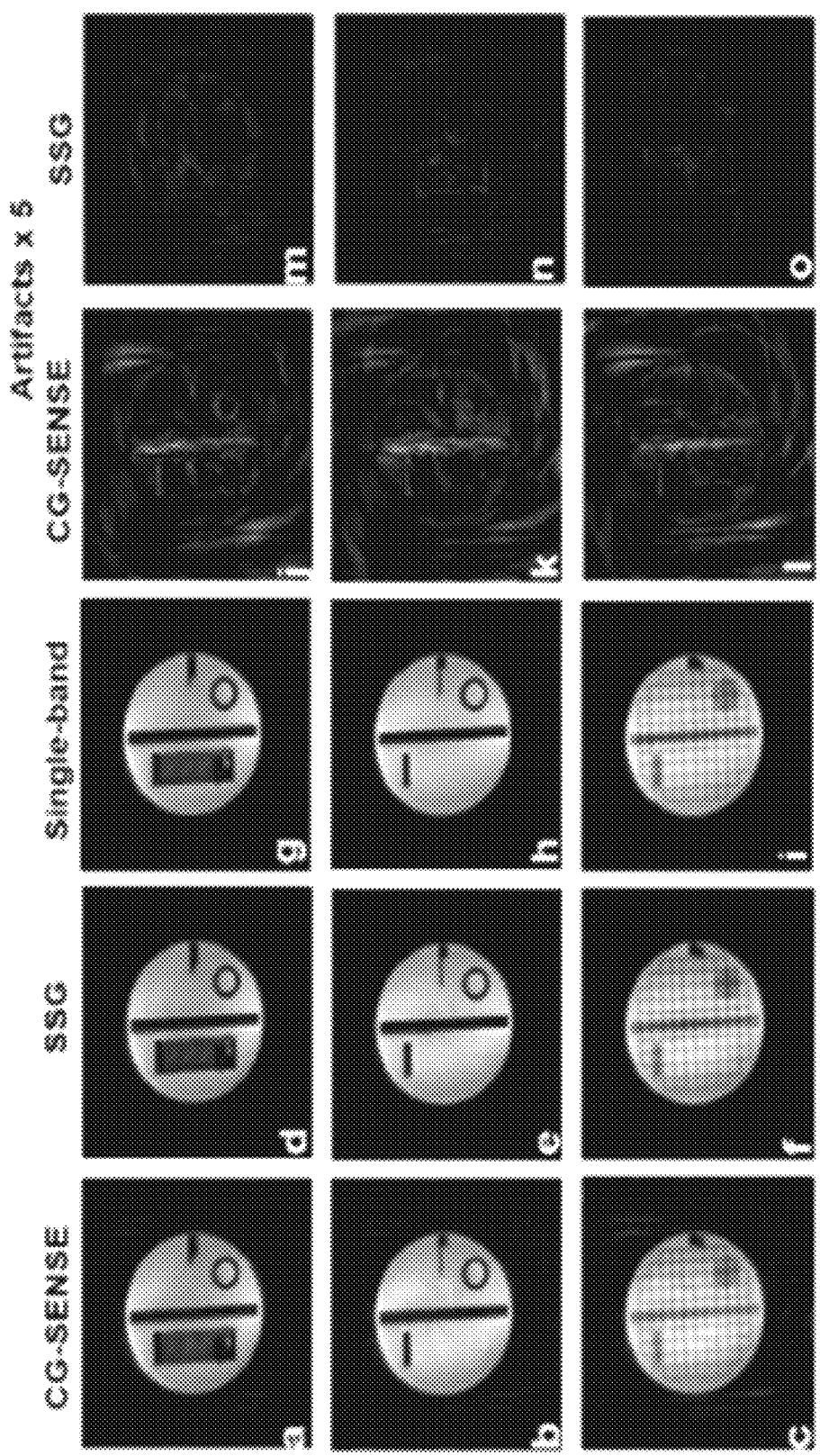
FIG. 16 is an example of output images according to the disclosure herein. Phantom imaging with spiral cine gradient-echo MRI (MB=3) shows that reconstruction using SSG (d-f) reduces slice leakage artifact compared to CG-SENSE (a-c). The gold standard single-band images at matched locations were reconstructed by NUFFT (g-i).
Figure 17:
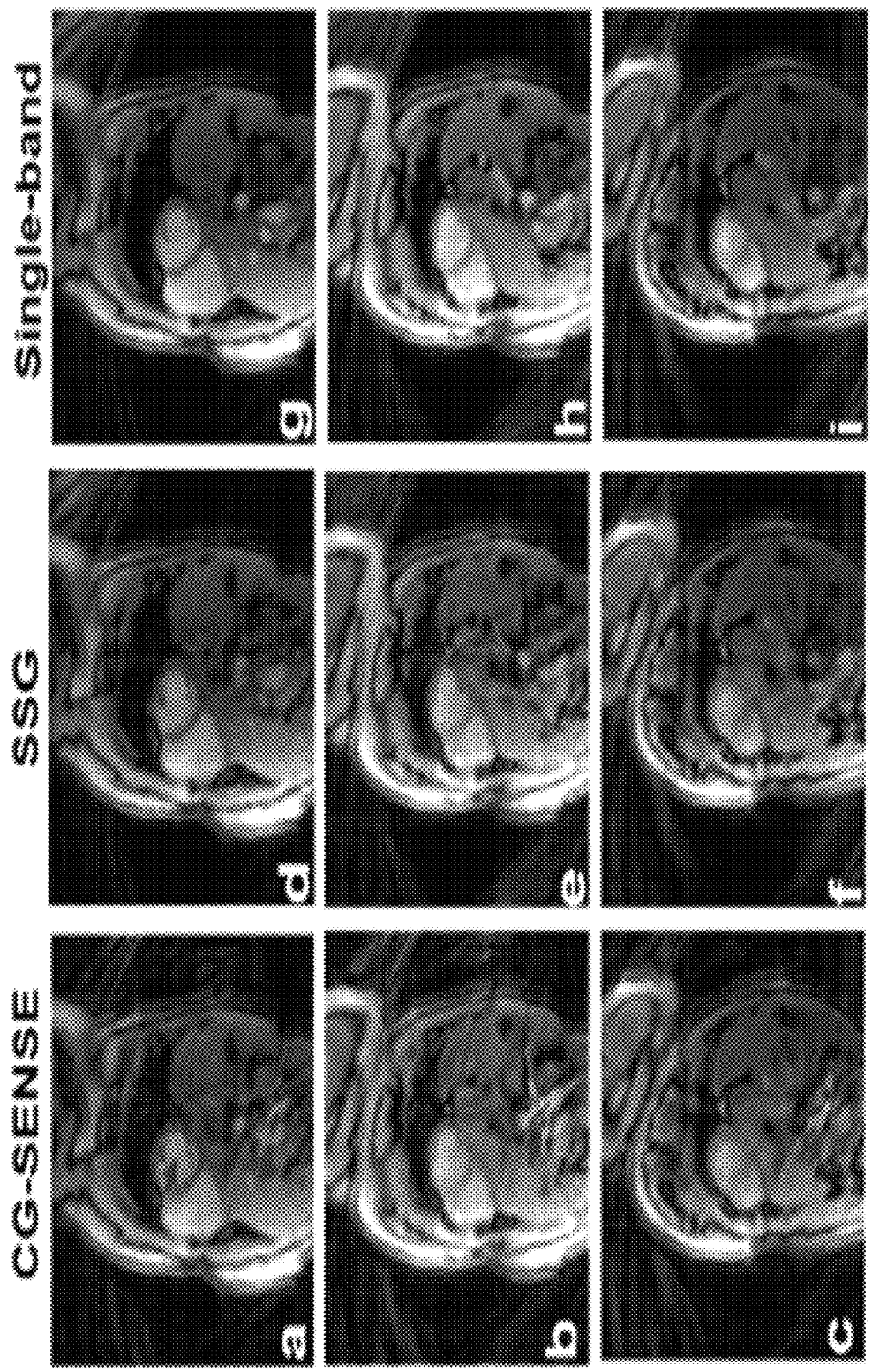
FIG. 17 is an example of output images according to the disclosure herein.
Figure 18:
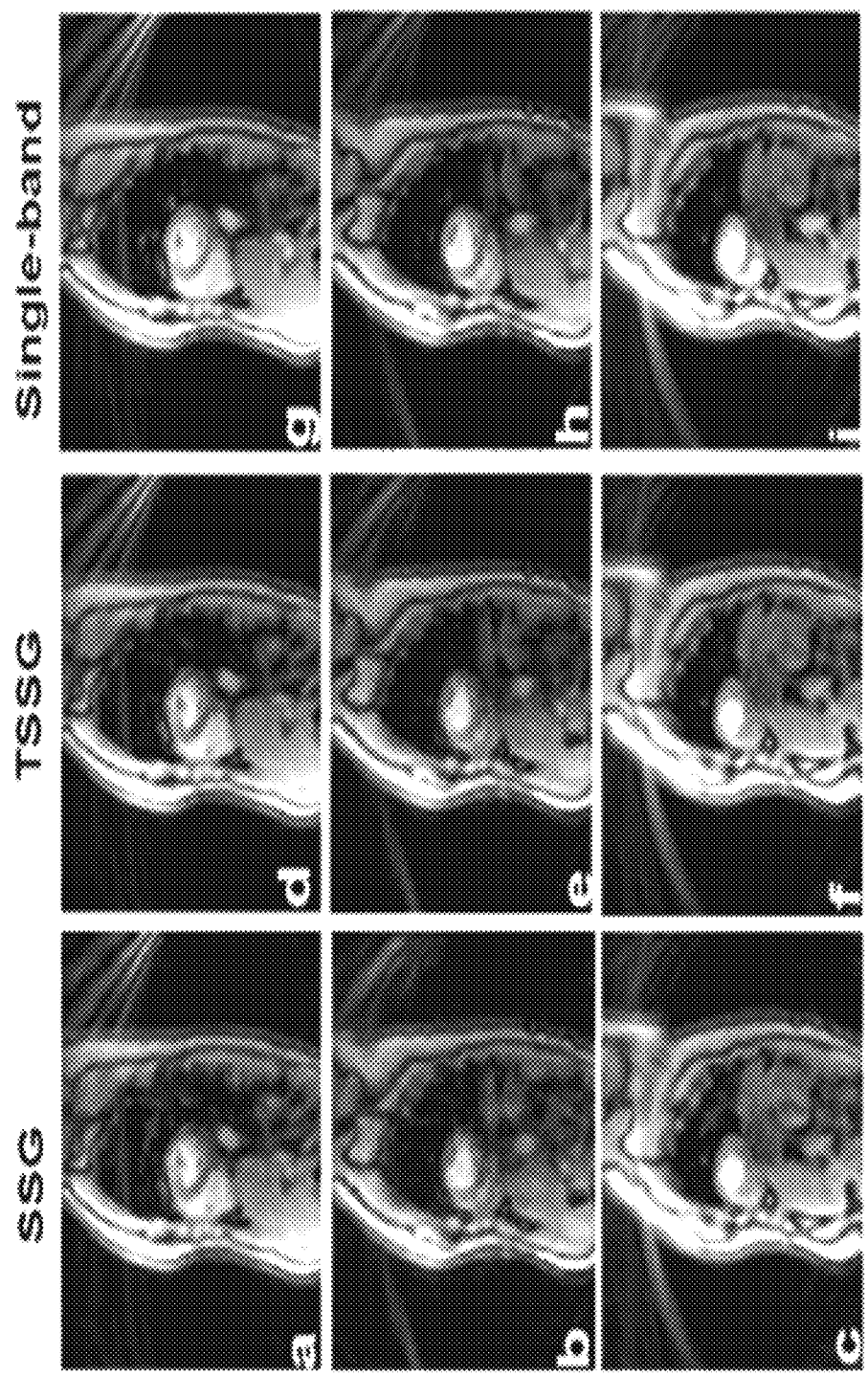
FIG. 18 is an example of output images according to the disclosure herein.
Figure 19A:
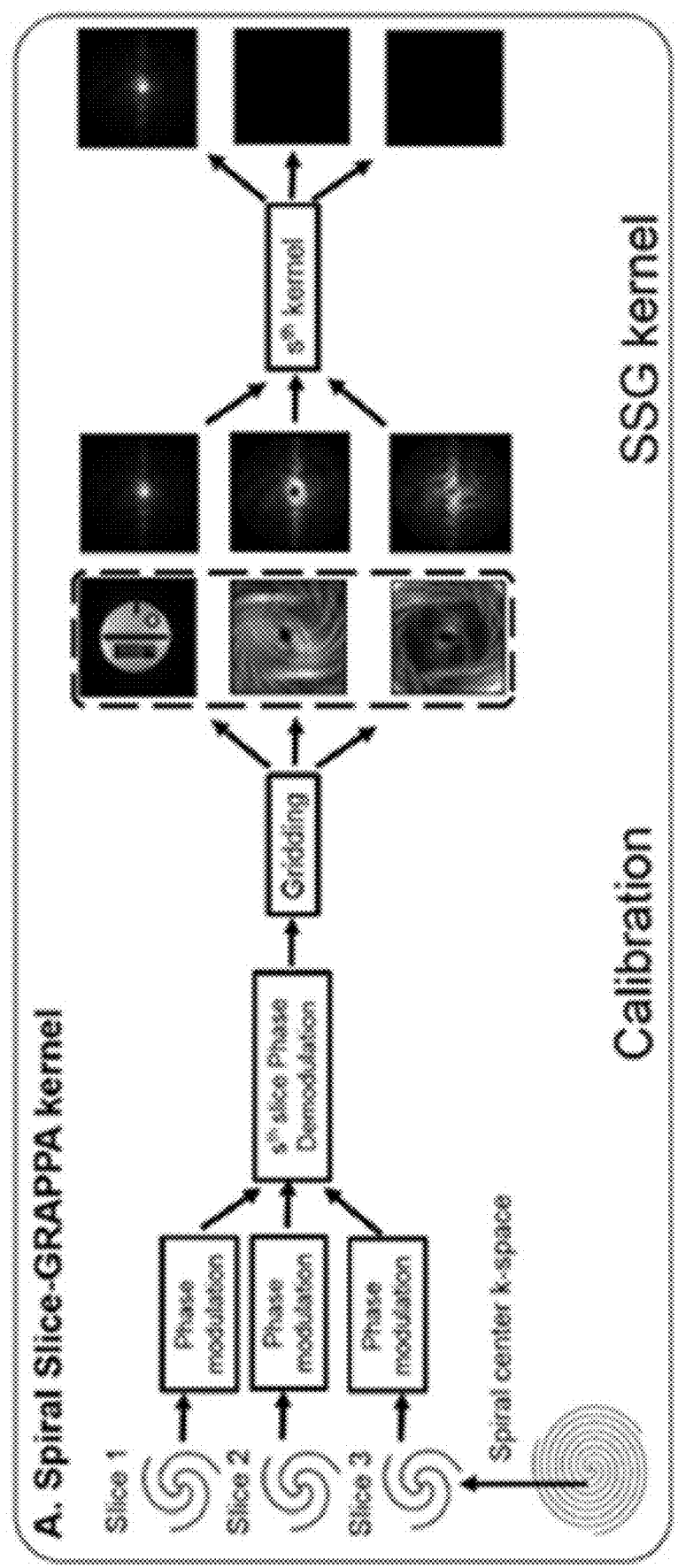
Figure 19B:
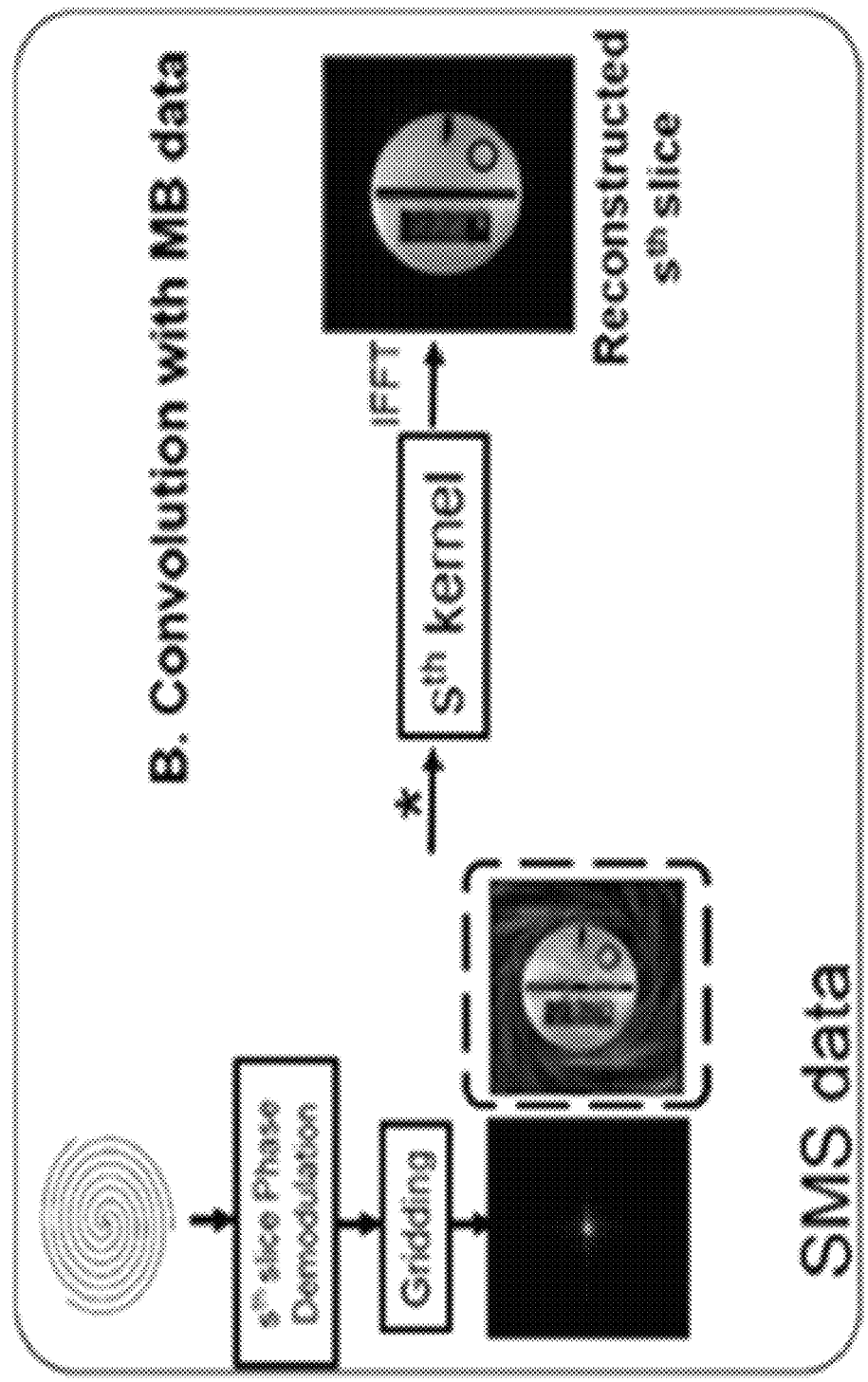
FIG. 19B is a continuation of the flow chart of FIG. 19A. Next, gridding is performed on all slices, and the split-slice GRAPPA method is applied to fit the slice-GRAPPA kernel of the sth slice. For MB data, the sth slice-GRAPPA kernel is applied after phase demodulation corresponding to the sth slice and gridding, followed by the IFFT. This process repeats for each of the slices.
Figure 20:
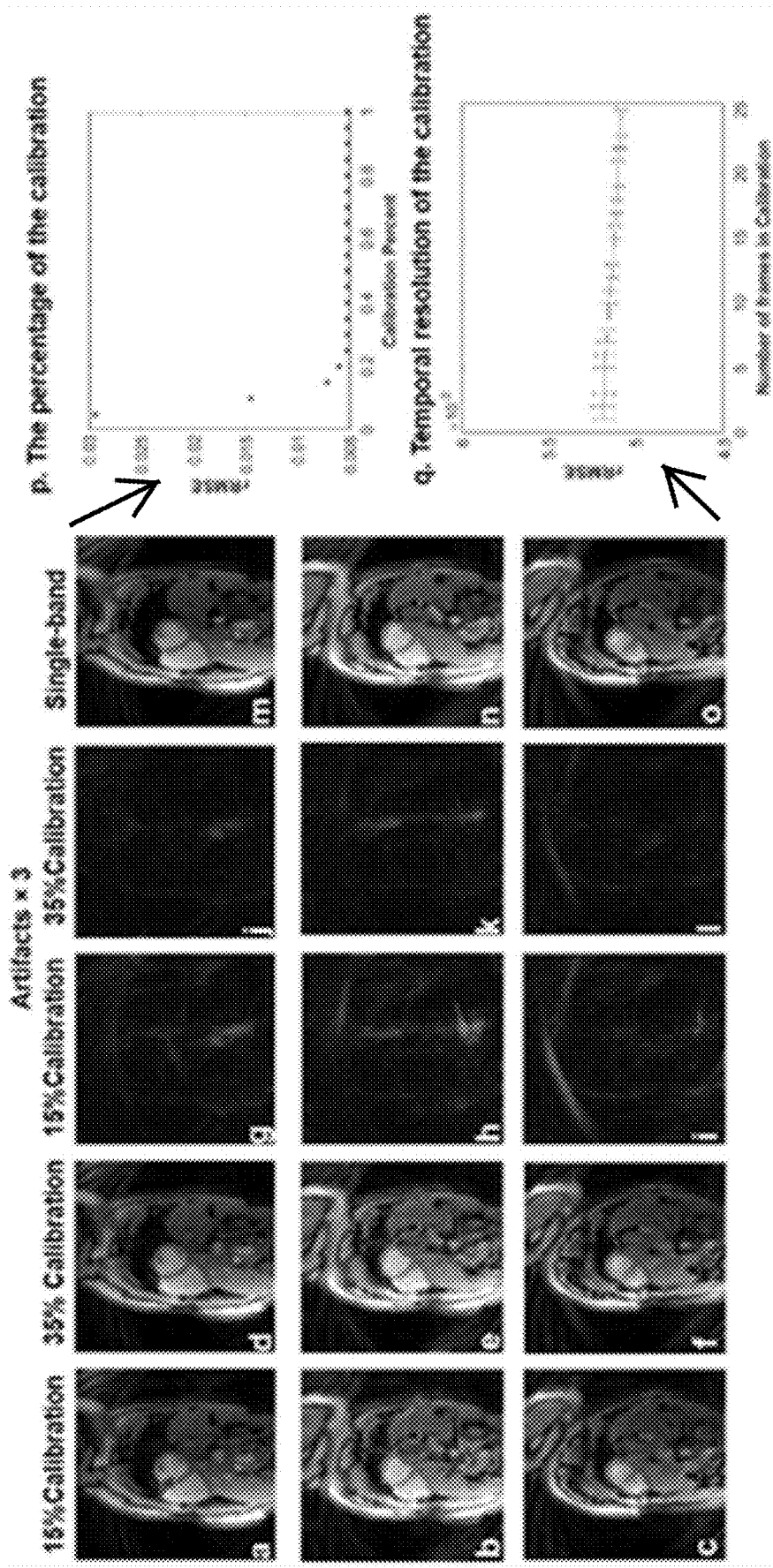
FIG. 20 is a flow chart of one method of reconstructing image data from acquired MRI data.
Figure 21:
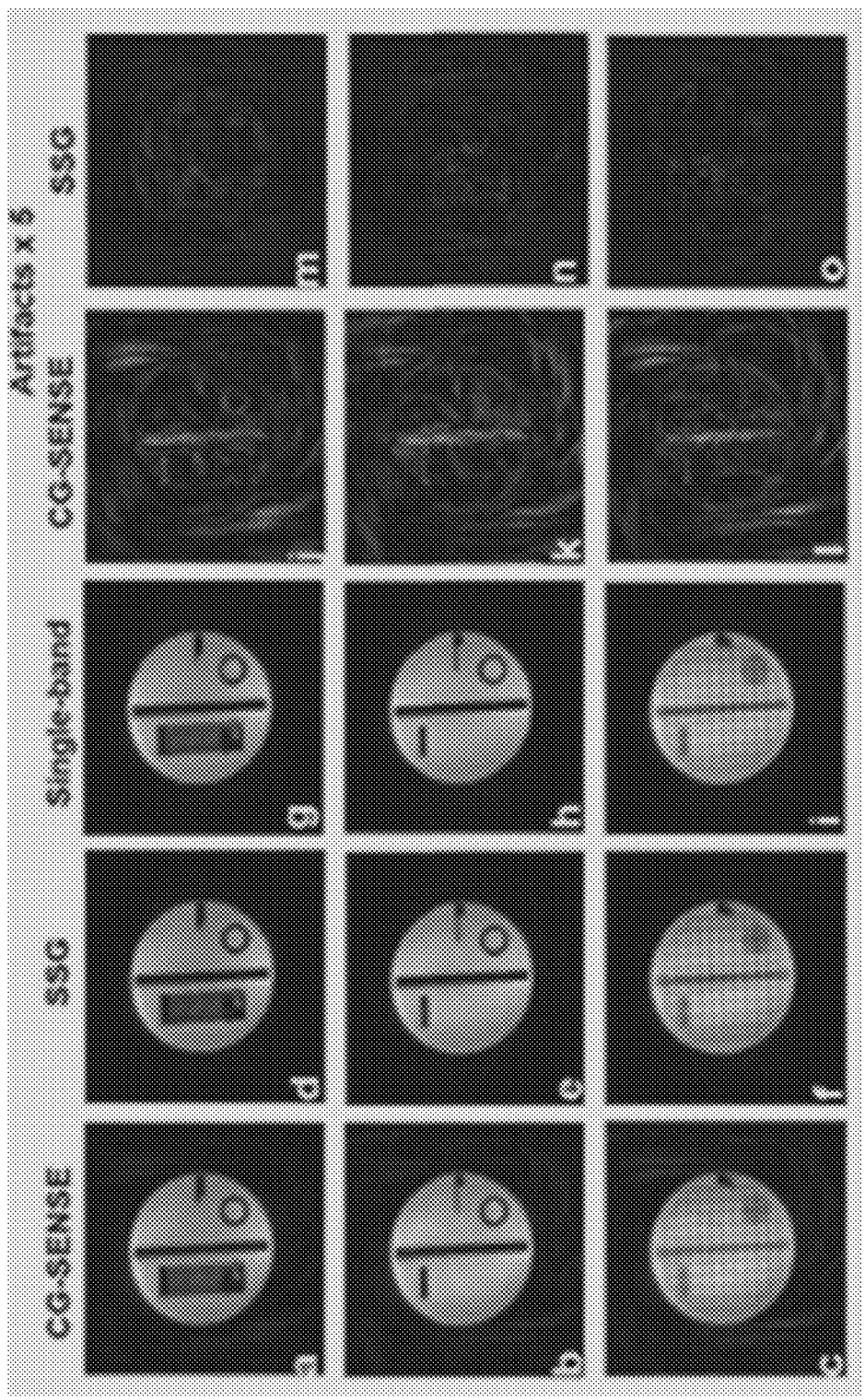
FIG. 21 is an example of output images according to the disclosure herein. Phantom imaging with spiral cine gradient-echo MRI (MB=3) shows that reconstruction using SSG (d-f) reduces slice leakage artifact compared to CG-SENSE (a-c). The gold standard single-band images at matched locations were reconstructed by NUFFT (g-i).
Figure 22:
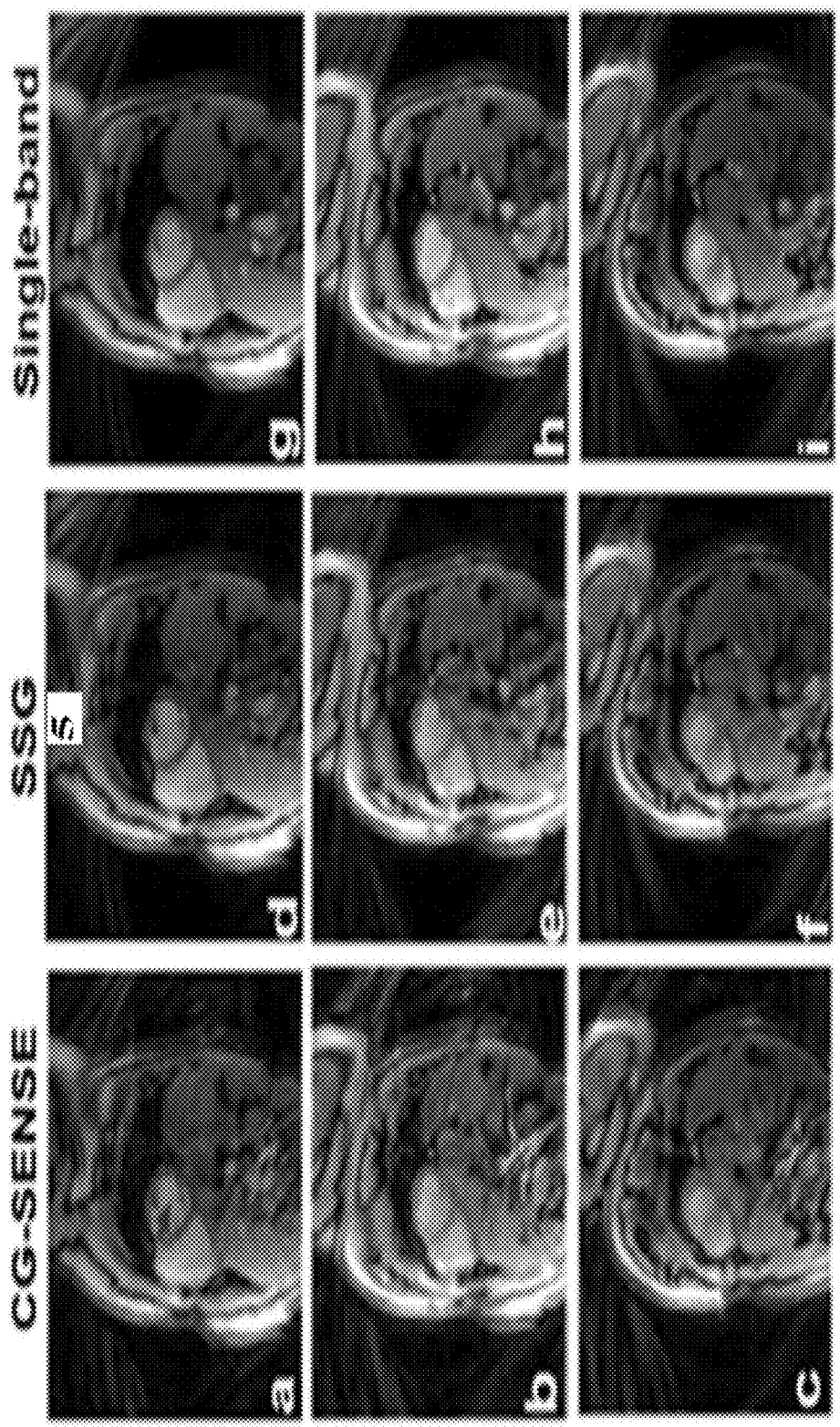
FIG. 22 is an example output images according to the disclosure herein.
Figure 23:
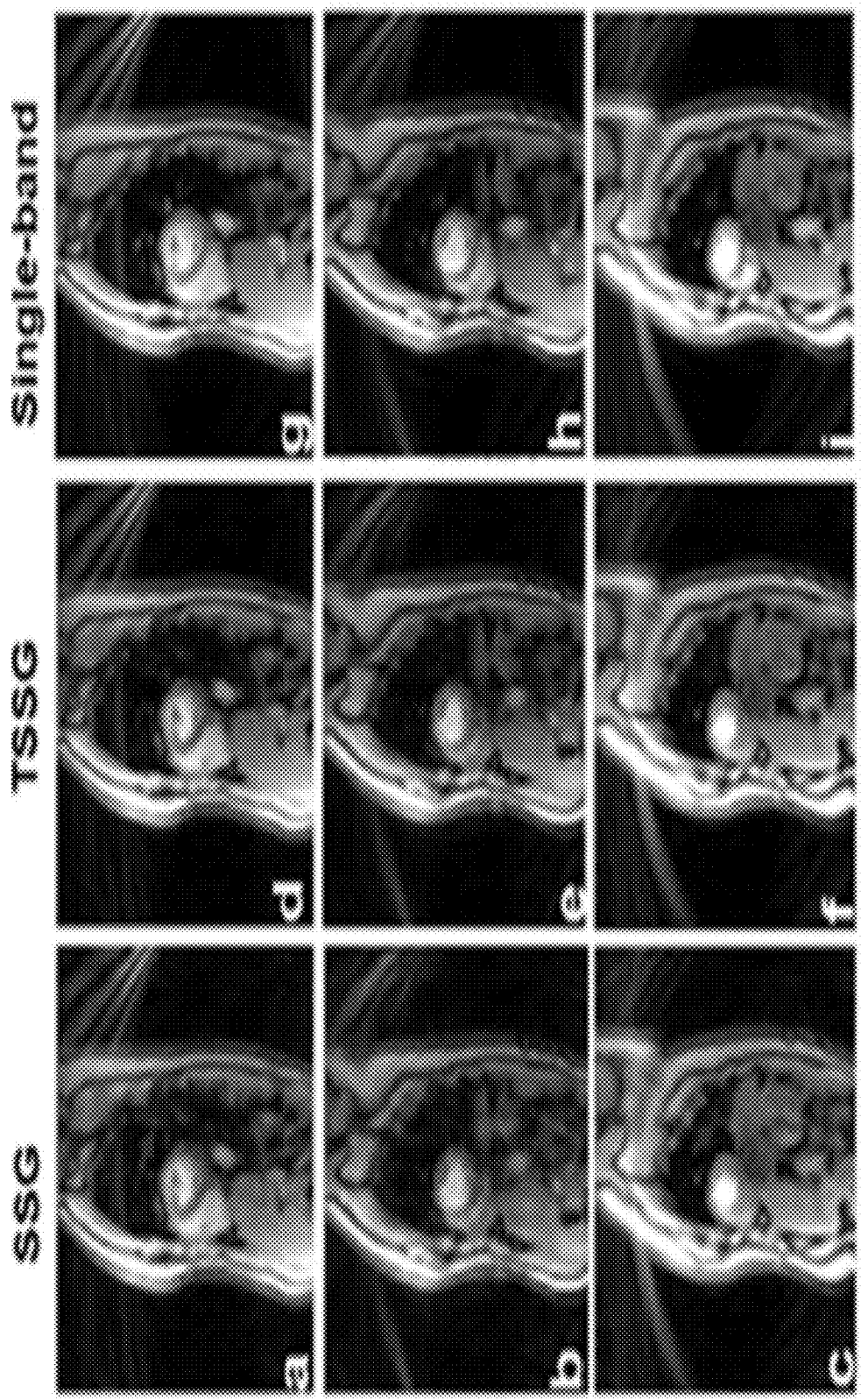
FIG. 23 is an example of output images according to the disclosure herein.
Figure 24B:
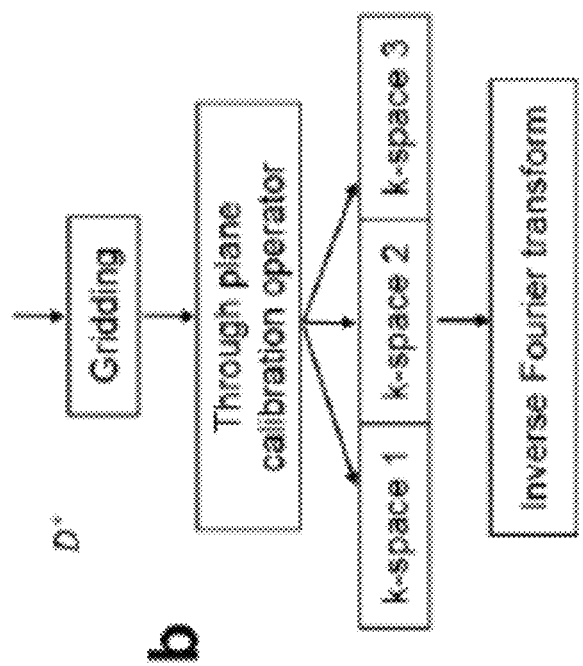
FIG. 24B is a continuation flow chart of the process of FIG. 24A showing that the operator D* is based on gridding and slice-GRAPPA kernels.
Figure 24A:
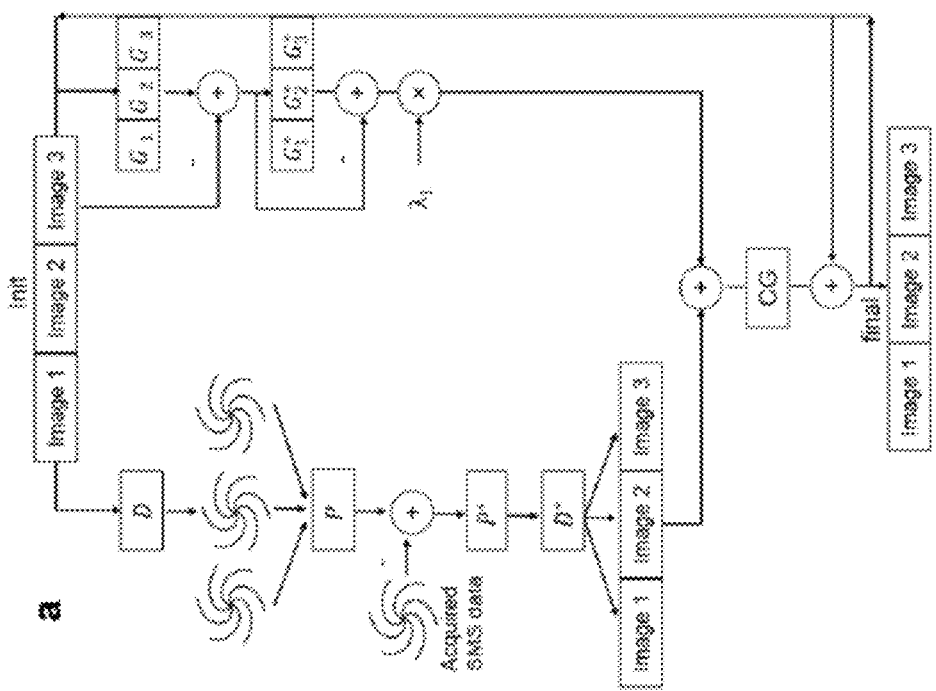
Figure 25:
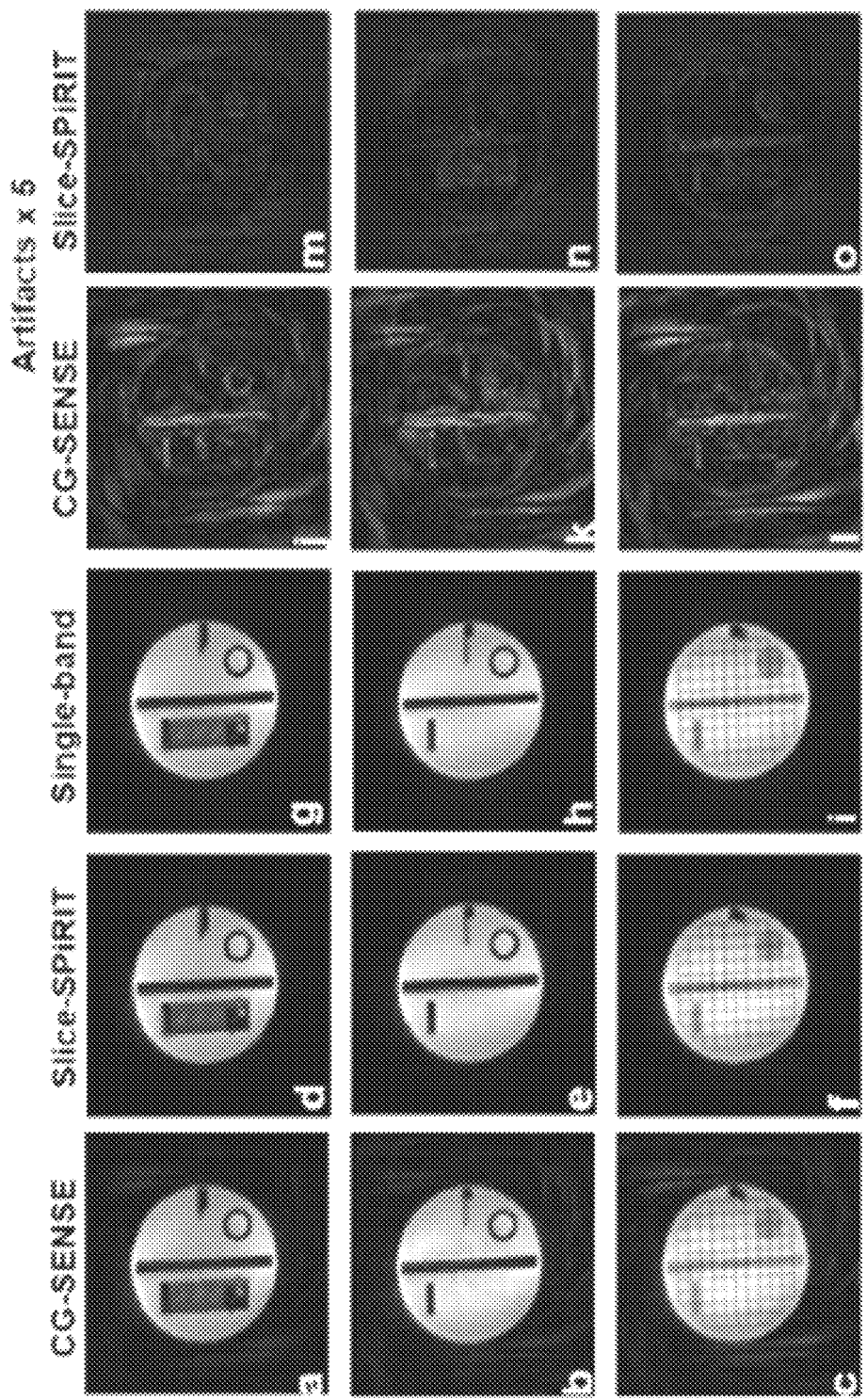
FIG. 25 is an example of output images according to the disclosure herein.
Figure 26:
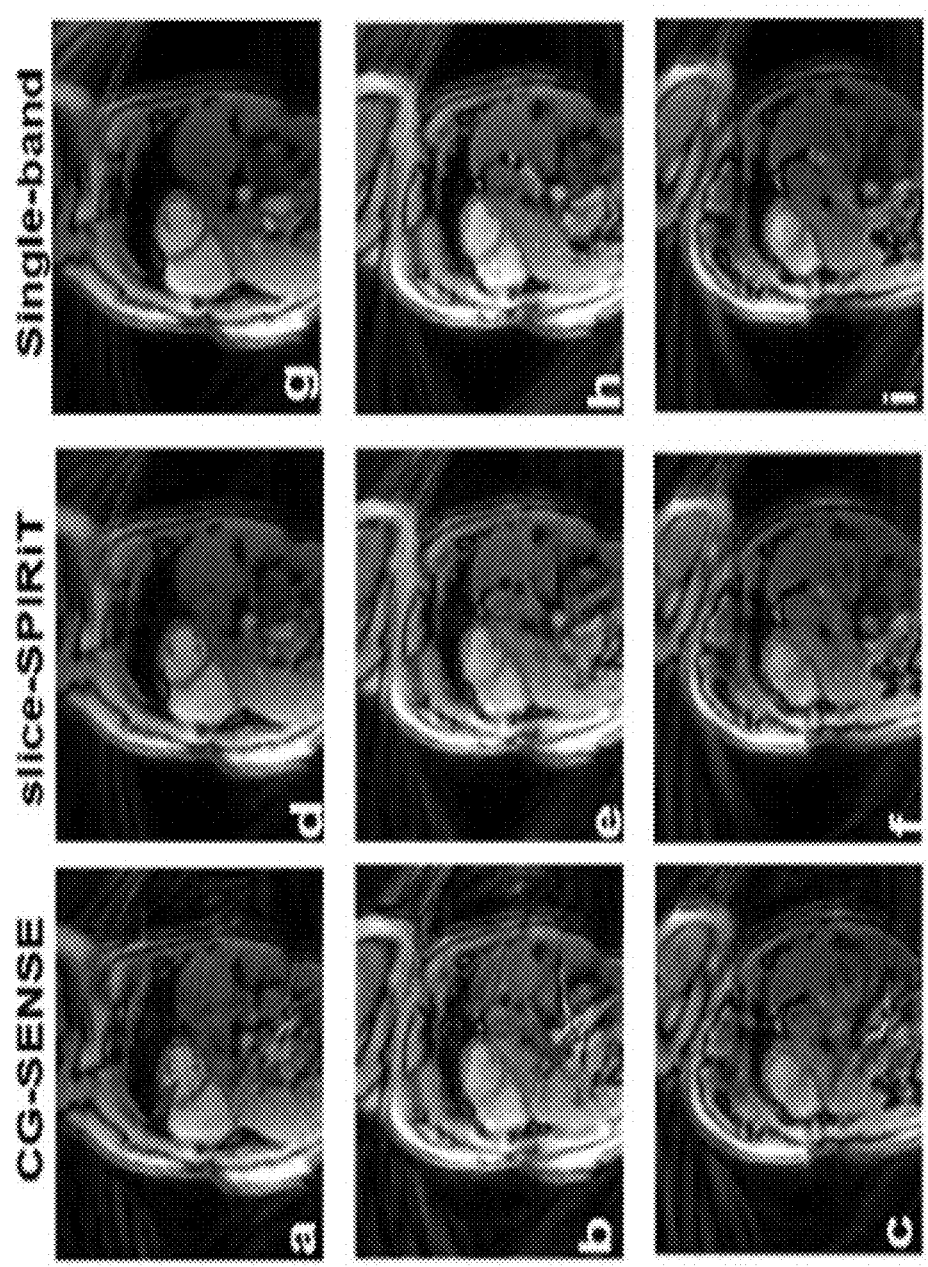
FIG. 26 is an example of output images according to the disclosure herein.
Figure 27A:
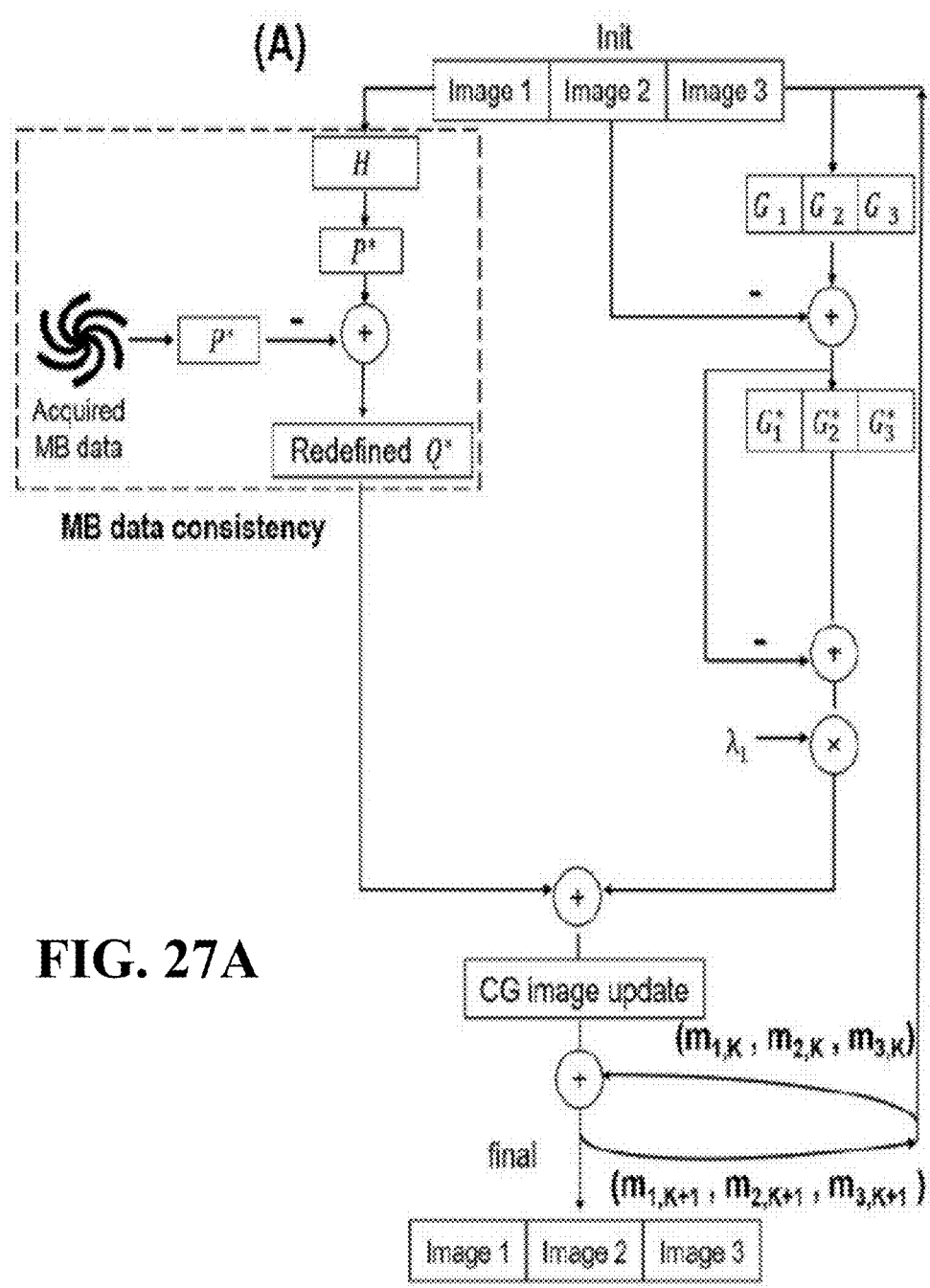
FIG. 27A is a flow chart of one method of reconstructing image data from acquired MRI data.
Figure 27B:
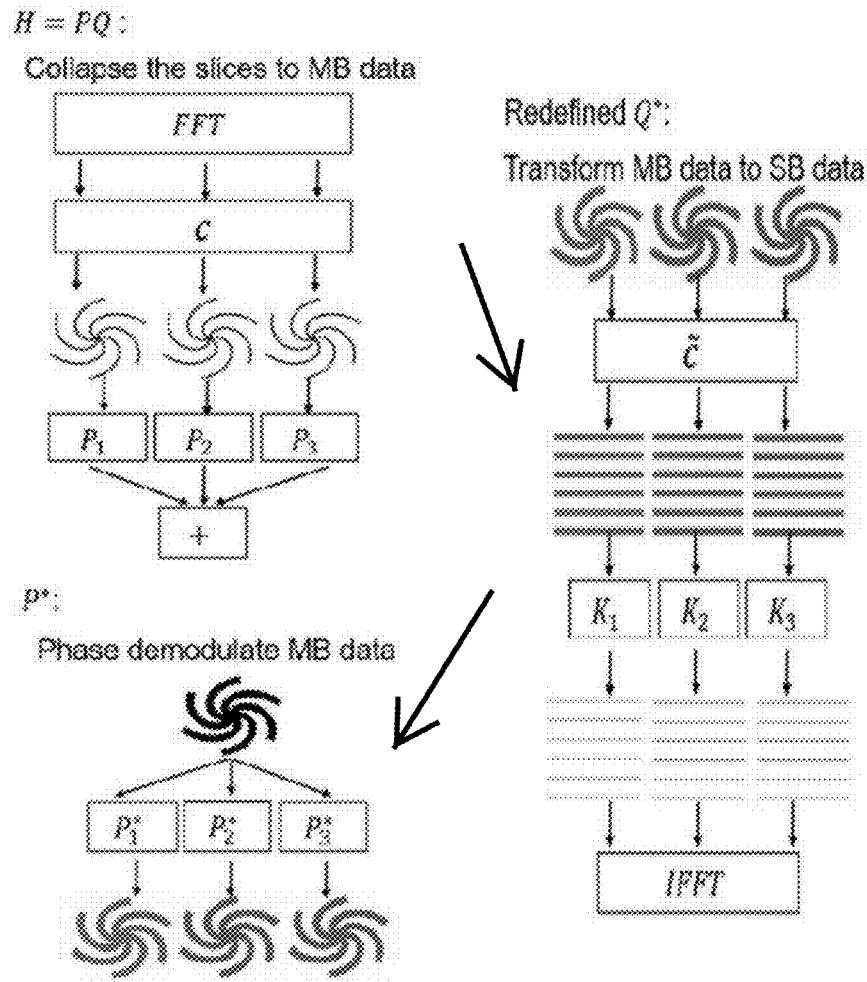
FIG. 27B are further sub-parts of the flow chart of FIG. 27A.
Figure 28A:
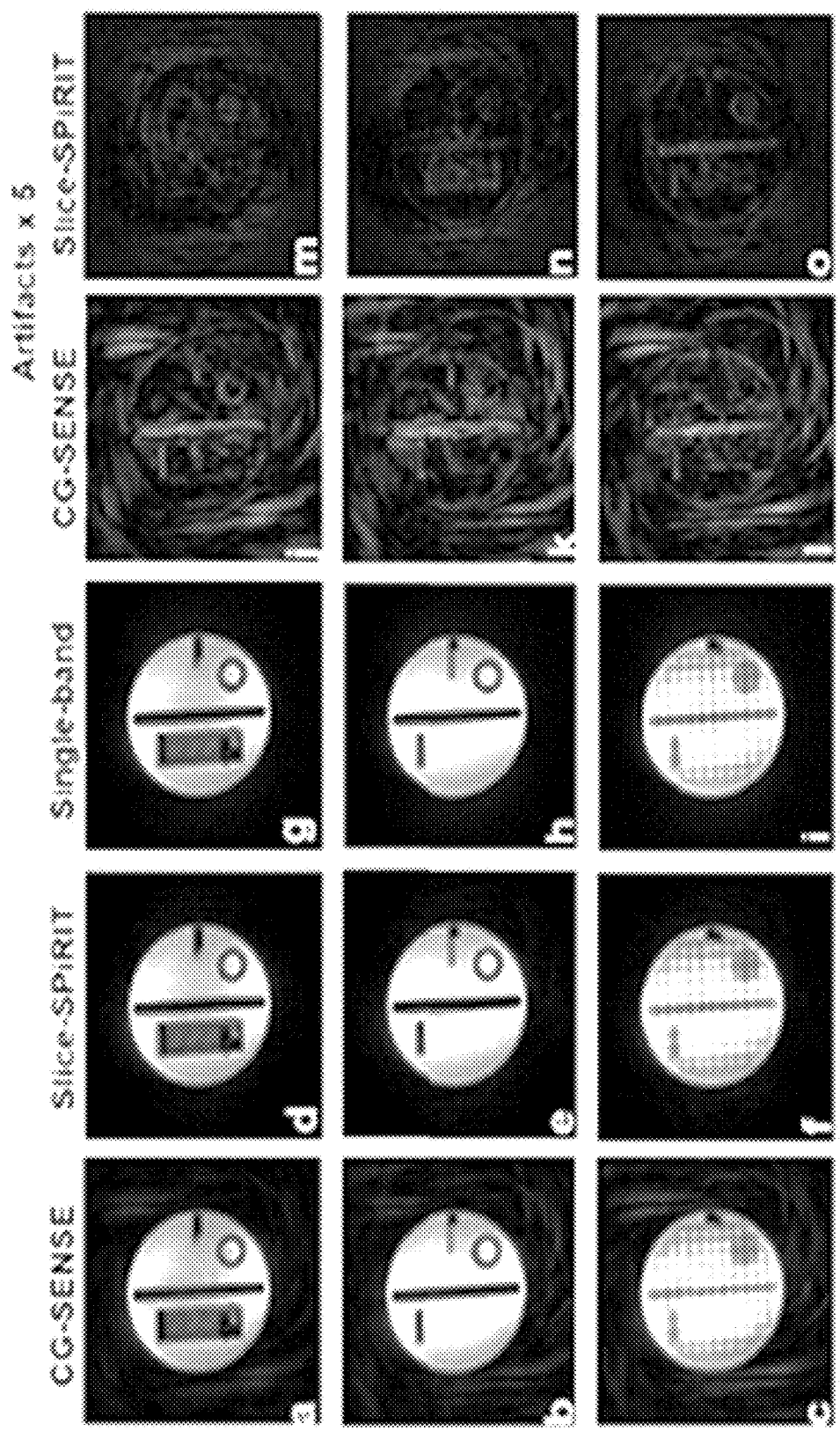
Figure 28B:
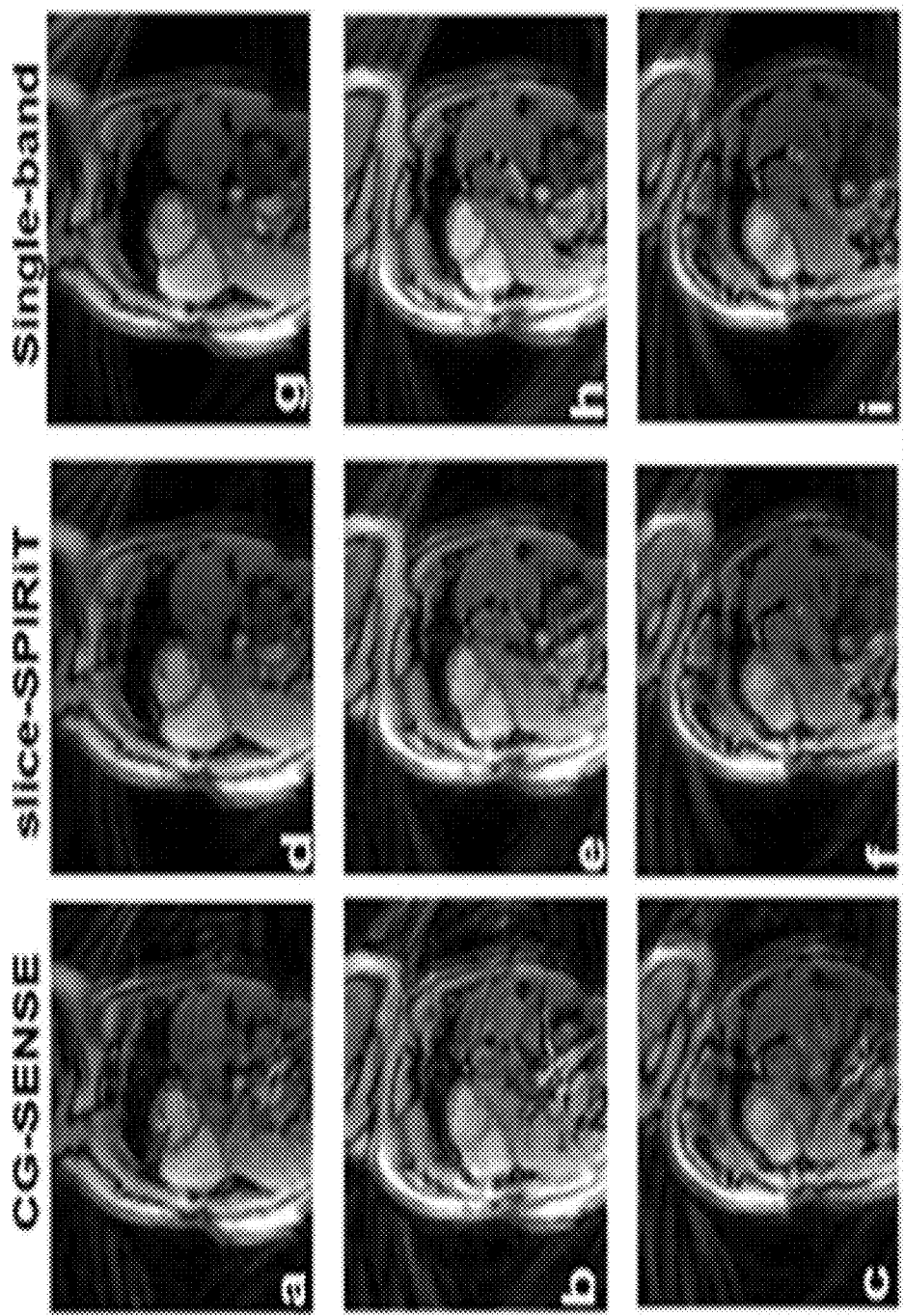
FIG. 28B is an example of output images according to the disclosure herein. Comparison of slice-SPIRiT and CG-SENSE for image recovery applied to spiral cine gradient echo MRI (MB=3) of three short-axis slices in a human volunteer. For CG-SENSE (a-c), multiple slice-leakage artifacts are observed (red arrows). The artifacts are reduced using slice-SPiRIT (d-f). SB images at matched locations are presented as reference standards (g-i).
Figure 29A:
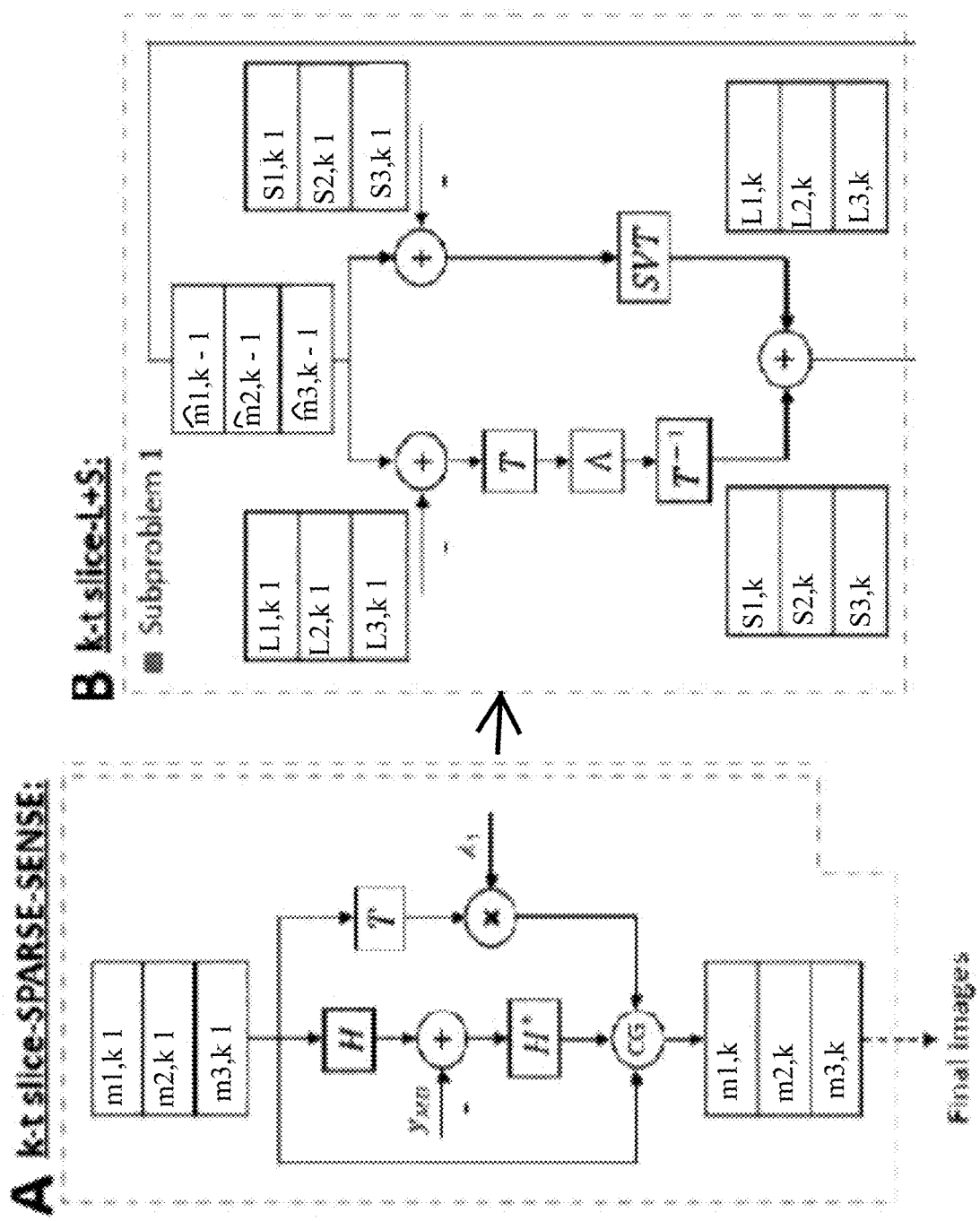
Figure 29B:
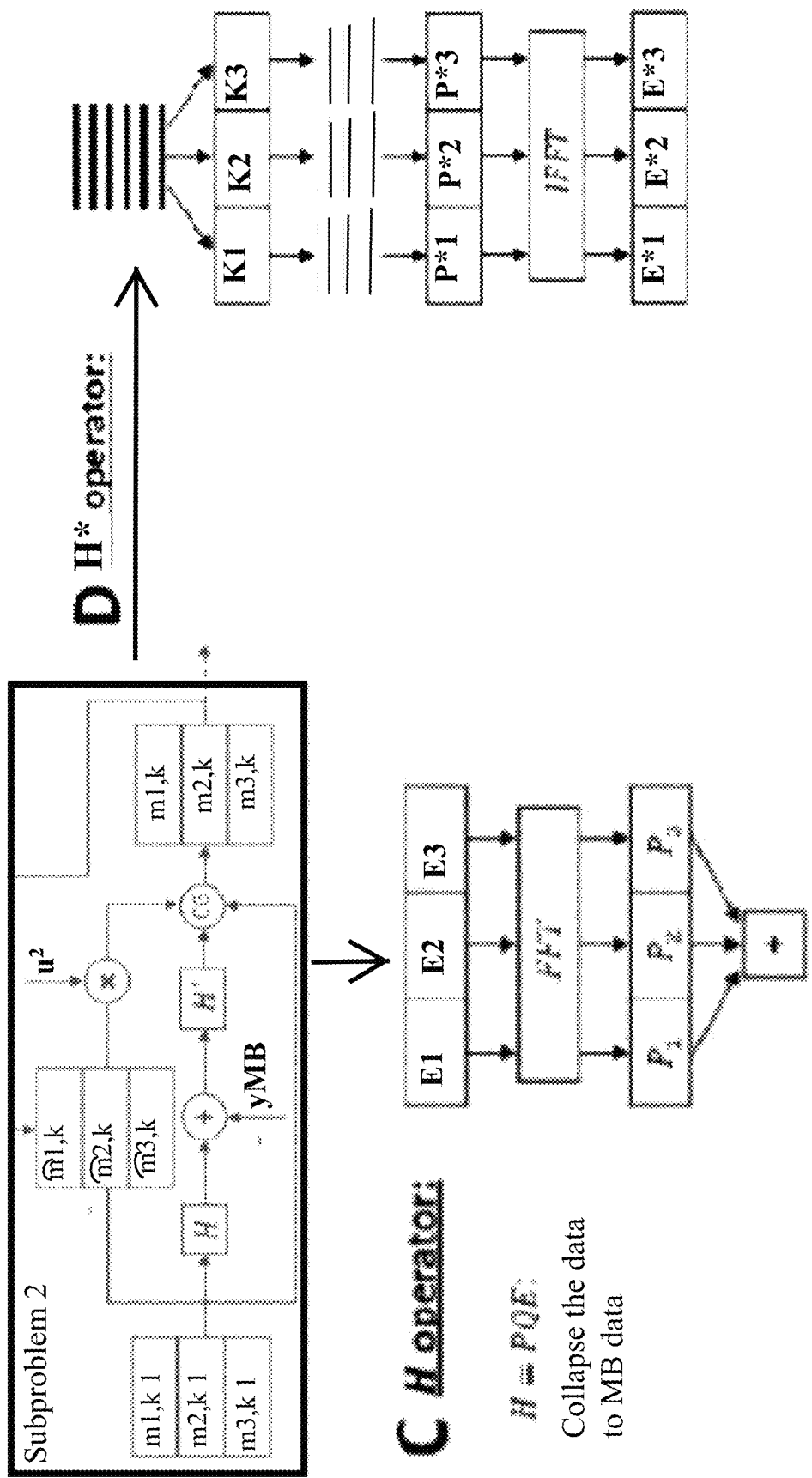
FIG. 29B is an example solution of the k-t slice L+S model using CG and soft thresholding with variable splitting. The temporal threshold and the SVT singular value threshold are shown. C: the H operator is depicted including use of sensitivity maps (E), FFT, (F), phase modulation (P), and summation. D: The approximation of H* is depicted, including slice-separating K kernels, phase demodulations (P*), IFFT ($F^{-1}$) and coil combination (E*).
Figure 30:
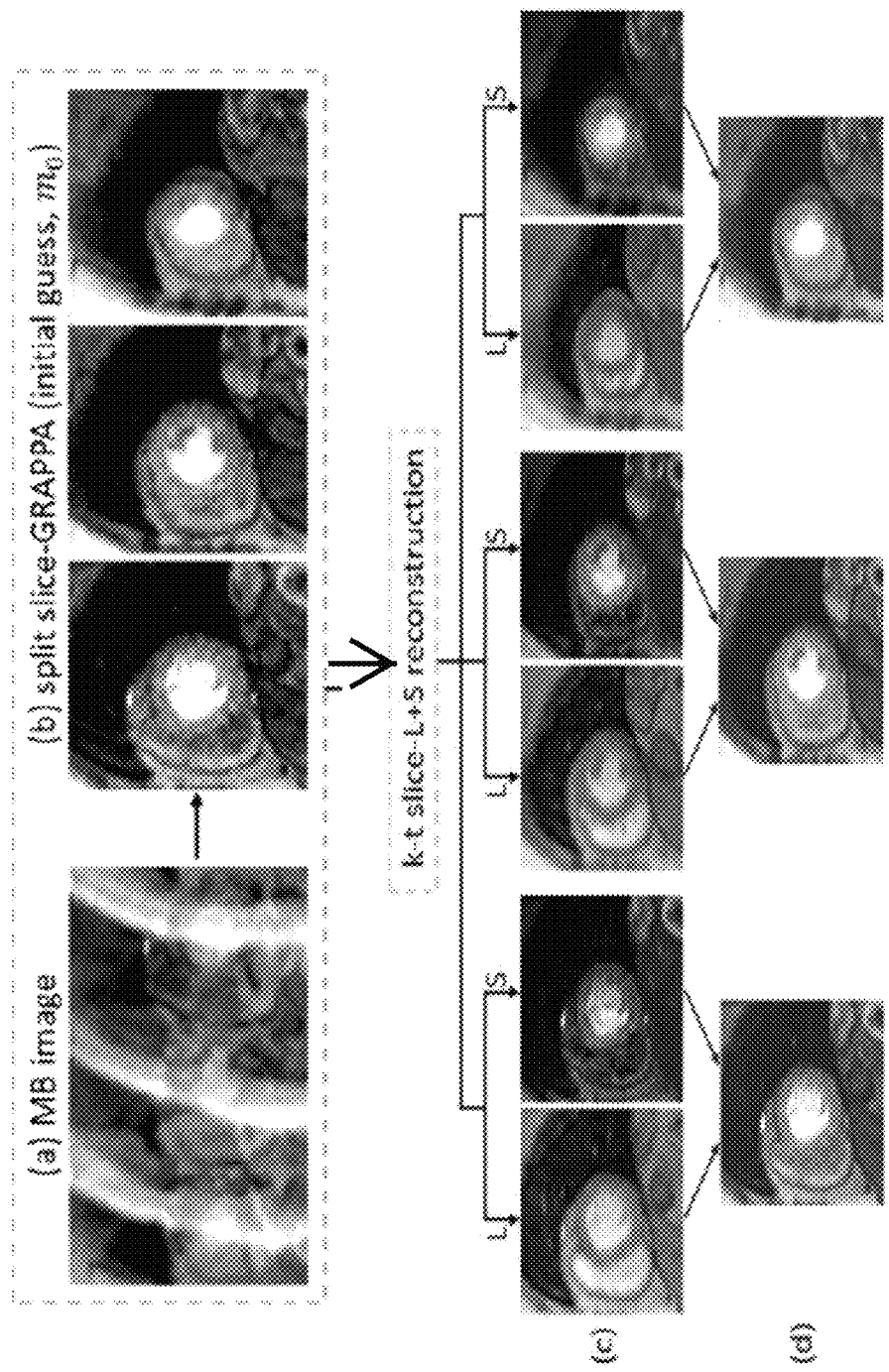
FIG. 30 is an example output images according to the disclosure herein.
Figure 31:
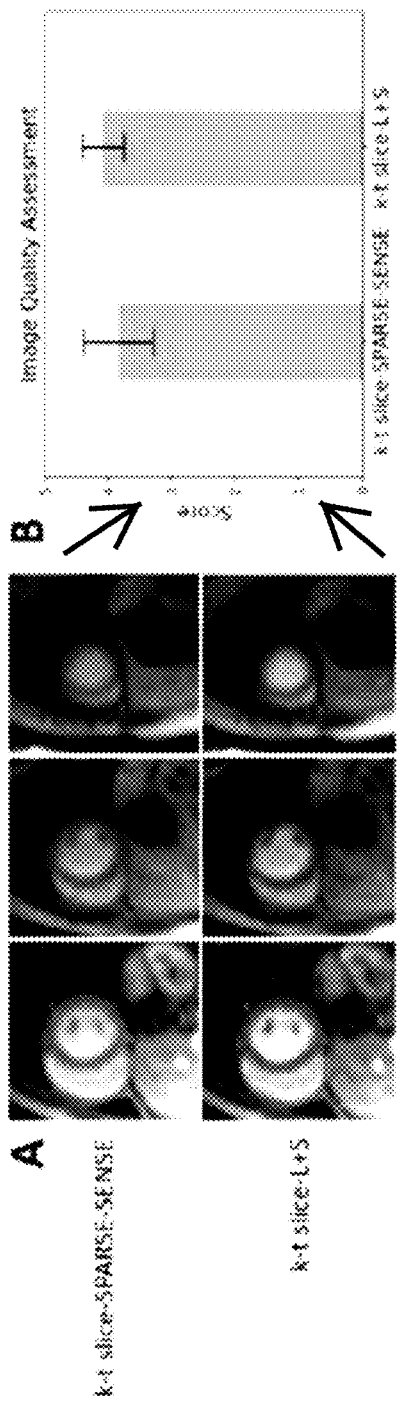
FIG. 31 is a comparison of k-t slice SPARSE SENSE using temporal TV and k-t slice L+S for image reconstruction applied to first pass perfusion MRI with MB=3 and in plane undersampling with R=2 (three short axis slices from a patient are shown). Slice L+S shows sharper borders and greater contrast compared to k-t slice SPARSE SENSE. B shows a blinded image quality score for subjects. The bar plot shows the mean score of slice L+S is higher than slice-SPARSE-SENSE with lower standard deviation.
Figure 32:
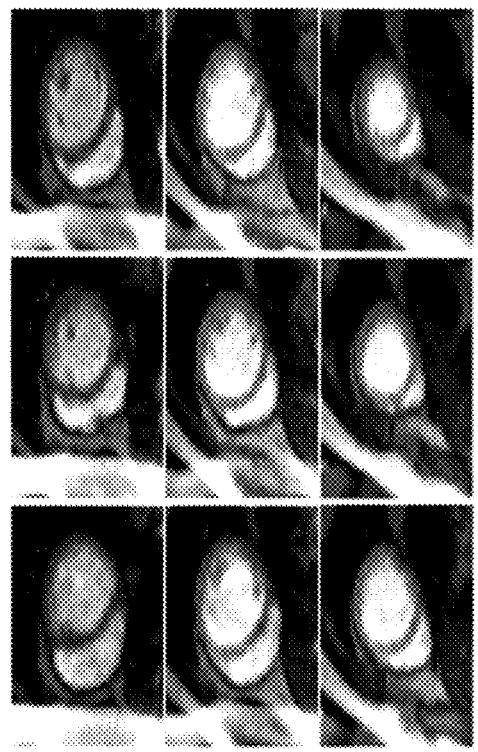
FIG. 32 is a Rate-6 accelerated perfusion images with MB=3 and in-plane undersampling with R=2 provides 9-slice coverage using k-t slice L+S.
Figure 33:
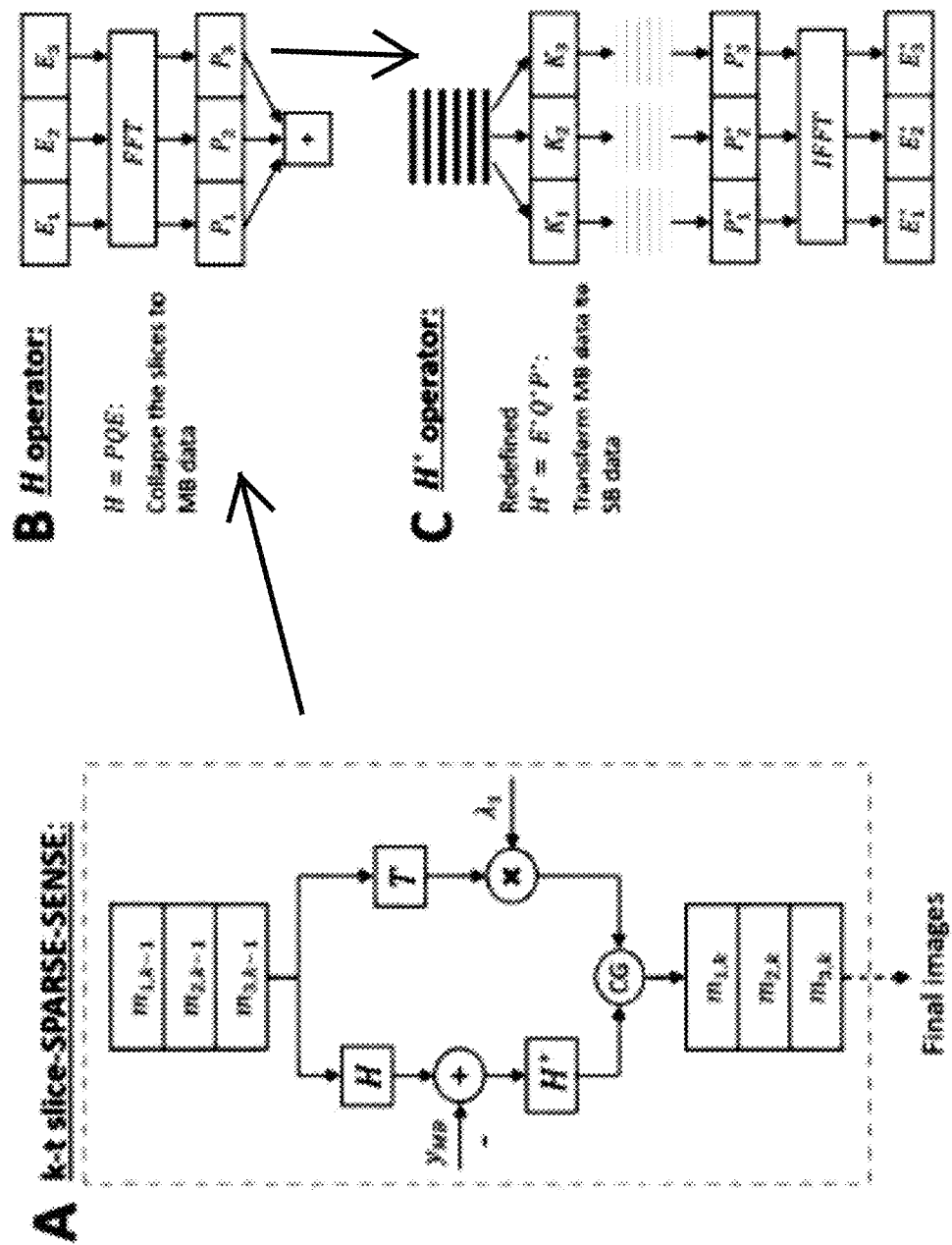
FIG. 33 is the solution of the k-t slice SPARSE SENSE model using conjugate gradient (CG).
Figure 34:
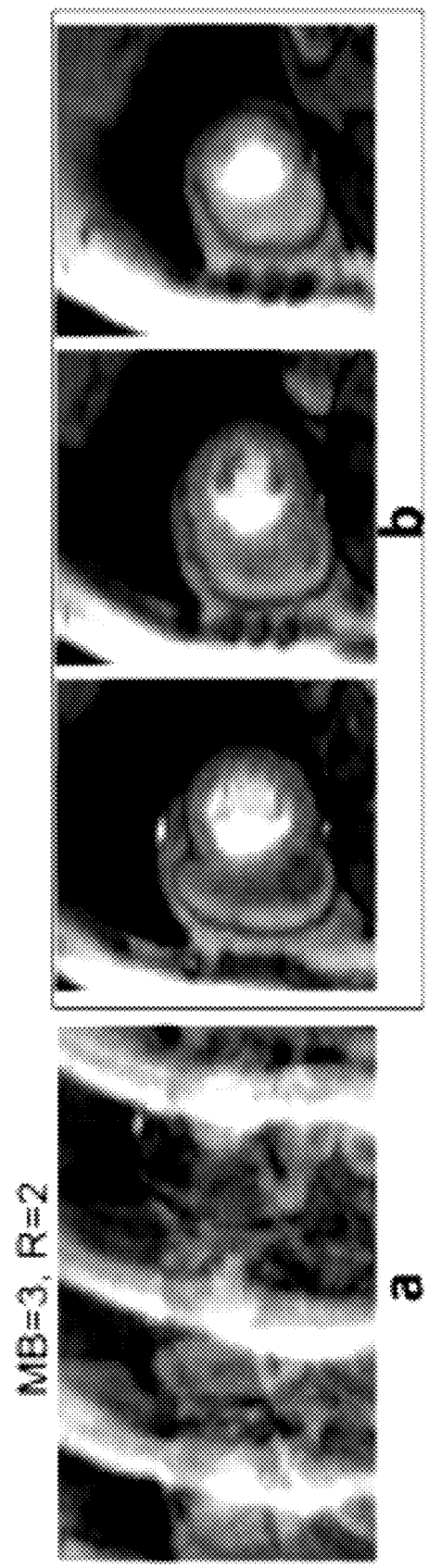
FIG. 34 illustrates a Rate-6 accelerated perfusion imaging with MB=3 and in plane undersampling with R=2. 2DIFFT reconstructions illustrate the artifacts associated with MB=3 and R=2 sampling (a), and images reconstructed using k-t SSS demonstrate slice separation and artifact removal (b).
Figure 35:
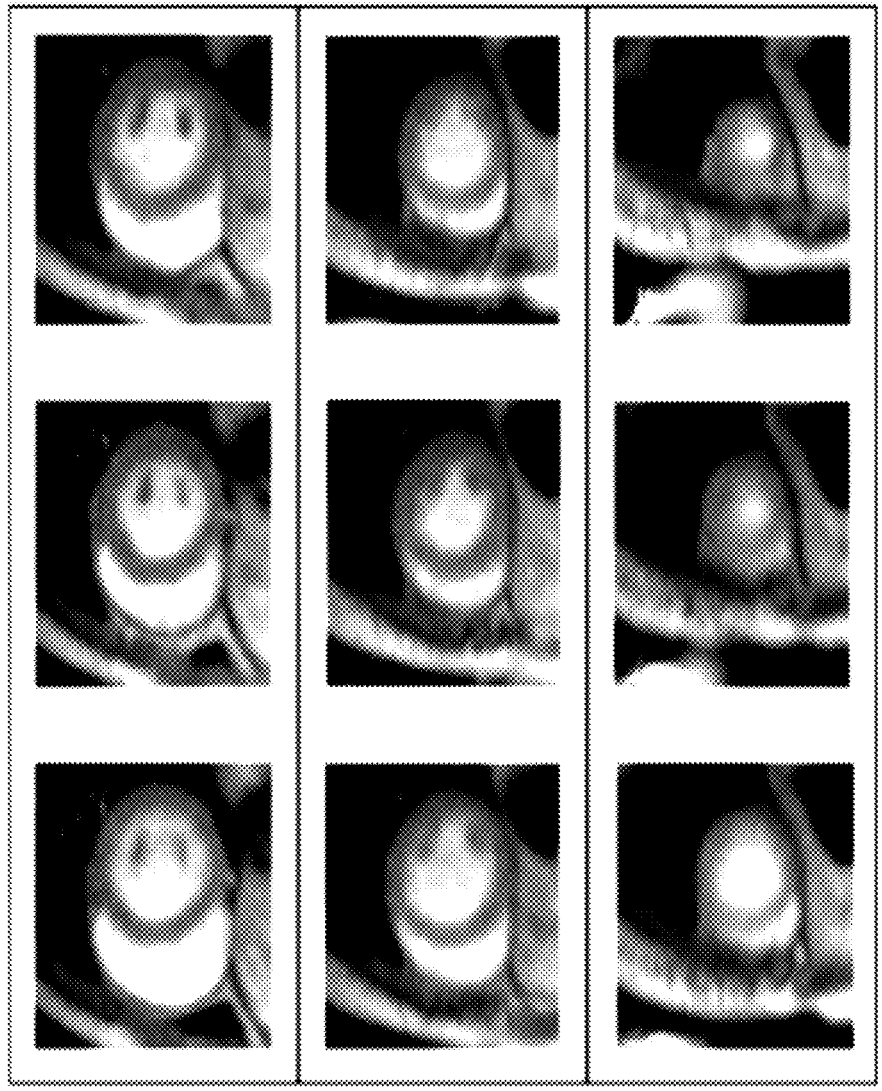
FIG. 35 illustrates rate-6 accelerated perfusion images with MB=3 and in-plane undersampling with R=2 provide 9-slice coverage.

For iterative MB reconstruction algorithms, the different slices may converge after different numbers of iterations, which complicates the stopping criteria. For slice-SPIRiT, we observed that the number of iterations for different slices and for all slices combined to reach the lowest rRMSE is not always the same (FIG. 9). For our in vivo human imaging, slice-SPIRiT typically required 10-15 iterations, which is very similar to conventional SPIRiT. For phantom imaging, 15-30 iterations were typically needed.

T-CAIPIRINHA

We developed T-CAIPIRINHA in order to use the through-plane dimension to generate temporal variation of MB artifacts. As previously shown in methods like UNFOLD and TSENSE, application of a temporal filter was then effective in reducing artifacts. When used with NCSG and slice-SPIRiT, T-CAIPIRINHA provided additional artifact reduction and improved image quality.

For comparisons in human subjects, the breath hold positions may differ slightly between SB and MB acquisitions, potentially leading to a source of error when using the SB images as the reference standard. Similarly, blood signal saturation may occur due to MB excitation and through-plane flow, leading to another source of error compared to the reference standard data. For these reasons, we included imaging of stationary objects in our study design.

As for other non-Cartesian GRAPPA methods, the SG kernels depend on the sampling pattern of the k-space trajectory, therefore NCSG is not as flexible as CGSENSE. The current NCSG method was tested only on constant-density spiral MB data, and the method may not perform well using variable-density spirals or using in-plane under sampling. However, the slice-SPIRiT method may be effective in those cases and will require further study in the future.

While we developed slice-SPIRiT to handle MB spiral data, slice-SPIRiT may also have advantages for MB Cartesian imaging. In the future we will test whether slice-SPIRiT has advantages compared to other methods in the setting of MB Cartesian imaging. We did not investigate the performance of NCSG and slice-SPIRiT for MB imaging with more than three slices; however, we will perform these studies in the future. Also, we did not evaluate our methods for the conditions of combined through plane and in-plane acceleration or using variable density spirals. These studies are also planned for the future. Recently, other reconstruction methods have been proposed for non-Cartesian MB image reconstruction, including regularized nonlinear inversion (35), EPIRiT (36), and compressed sensing (13). Slice-SPIRiT should be compared with these methods in follow-up work. We acquired kernel calibration data appended to the end of the MB spiral pulse sequence. In the future, we will investigate auto-calibration strategies for NCSG and slice-SPIRiT.

CONCLUSIONS

NCSG, a non-iterative method using through-plane coil calibration information provides high-quality MB reconstructions for constant-density fully-sampled MB spiral imaging. Slice-SPIRiT, which combines in-plane and through-plane coil information within an iterative framework, further reduces image artifacts. T-slice-SPIRiT and T-NCSG using T-CAIPIRINHA and a temporal filter additionally improve image quality.

References The following patents, applications and publications as listed below and throughout this document are hereby incorporated by reference in their entirety herein.
1. Breuer F A, Blaimer M, Heidemann R M, Mueller M F, Griswold M A, Jakob P M. Controlled aliasing in parallel imaging results in higher acceleration (CAIPIRINHA) for multi-slice imaging. Magn Reson Med 2005; 53(3):684-691.
2. Setsompop K, Gagoski B A, Polimeni J R, Witzel T, Wedeen V J, Wald L L.
Blipped-controlled aliasing in parallel imaging for simultaneous multislice echo planar imaging with reduced g-factor penalty. Magn Reson Med 2012; 67(5):1210-1224.
3. Cauley S F, Polimeni J R, Bhat H, Wald L L, Setsompop K. Interslice leakage artifact reduction technique for simultaneous multislice acquisitions. Magn Reson Med 2014; 72(1):93-102.
4. Stab D, Ritter C O, Breuer F A, Weng A M, Hahn D, Kostler H. CAIPIRINHA accelerated SSFP imaging. MagnReson Med 2011; 65(1):157-164.
5. Stab D, Wech T, Breuer F A, Weng A M, Ritter C O, Hahn D, Kostler H. High resolution myocardial first-pass perfusion imaging with extended anatomic coverage. J Magn Reson Imaging 2014; 39(6):1575-1587.
6. Ferrazzi G, Bassenge J P, Wink C, Ruh A, Markl M, Moeller S, Metzger G J, Ittermann B, Schmitter S. Auto-calibrated multiband CAIPIRINHA with through-time encoding: Proof of principle and application to cardiac tissue phase mapping. Magnetic Resonance in Medicine 2018.
7. Weingartner S, Moeller S, Schmitter S, Auerbach E, Kellman P, Shenoy C, Akcakaya M. Simultaneous multislice imaging for native myocardial T1 mapping: Improved spatial coverage in a single breath-hold. Magn Reson Med 2017; 78(2):462-471.
8. Ahn C B, Kim J H, Cho Z H. High-speed spiral-scan echo planar NMR imaging-I. IEEE Trans Med Imaging 1986; 5(1):2-7.
9. Meyer C H, Hu B S, Nishimura D G, Macovski A. Fast spiral coronary artery imaging. Magn Reson Med 1992; 28(2):202-213.
10. Zhong X, Spottiswoode B S, Meyer C H, Kramer C M, Epstein F H. Imaging three-dimensional myocardial mechanics using navigator-gated volumetric spiral cine DENSE MRI. Magn Reson Med 2010; 64(4):1089-1097.
11. Salerno M, Sica C T, Kramer C M, Meyer C H. Optimization of spiral-based pulse sequences for first-pass myocardial perfusion imaging. Magn Reson Med 2011; 65(6):1602-1610.
12. Feng X, Salerno M, Kramer C M, Meyer C H. Non-Cartesian balanced steady-state free precession pulse sequences for real-time cardiac MRI. Magn Reson Med 2016; 75(4):1546-1555.
13. Yang Y, Meyer C H, Epstein F H, Kramer C M, Salerno M. Whole-Heart Spiral Simultaneous Multi-Slice First-Pass Myocardial Perfusion Imaging. Magnetic Resonance in Medicine 2018.
14. Blaimer M, Breuer F A, Seiberlich N, Mueller M F, Heidemann R M, Jellus V, Wiggins G, Wald L L, Griswold M A, Jakob P M. Accelerated volumetric MRI with a SENSE/GRAPPA combination. J Magn Reson Imaging 2006; 24(2):444-450.
15. Yutzy S R, Seiberlich N, Duerk J L, Griswold M A. Improvements in multislice parallel imaging using radial CAIPIRINHA. Magn Reson Med 2011; 65(6):1630-1637.
16. Sun C, Yang Y, Cai X, Cui S, Auger D, Salerno M, Epstein F H. Simultaneous multislice spiral cine DENSE MRI. Proceedings of the 26th Annual meeting of ISMRM 2018:#4911.
17. Ye H, Cauley S F, Gagoski B, Bilgic B, Ma D, Jiang Y, Du Y P, Griswold M A, Wald L L, Setsompop K. Simultaneous multislice magnetic resonance fingerprinting (SMS-MRF) with direct-spiral slice-GRAPPA (ds-SG) reconstruction. Magn Reson Med 2017; 77(5):1966-1974.
18. Chu A, Noll D C. Coil compression in simultaneous multislice functional MRI with concentric ring slice-GRAPPA and SENSE. Magn Reson Med 2016; 76(4):1196-1209.
19. Lustig M, Pauly J M. SPIRiT: Iterative self-consistent parallel imaging reconstruction from arbitrary k-space. Magn Reson Med 2010; 64(2):457-471.
20. Kellman P, Epstein F H, McVeigh E R. Adaptive sensitivity encoding incorporating temporal filtering (TSENSE). Magn Reson Med 2001; 45(5):846-852.
21. Madore B, Glover G H, Pelc N J. Unaliasing by fourier-encoding the overlaps using the temporal dimension (UNFOLD), applied to cardiac imaging and fMRI. Magn Reson Med 1999; 42(5):813-828.
22. Madore B. Using UNFOLD to remove artifacts in parallel imaging and in partial-Fourier imaging. MagnReson Med 2002; 48(3):493-501.
23. Wang H, Adluru G, Chen L, Kholmovski E G, Bangerter N K, DiBella E V.
Radial simultaneous multi-slice CAIPI for ungated myocardial perfusion. Magn Reson Imaging 2016; 34(9):1329-1336.

24. Fessler J A, Sutton B P. Nonuniform fast fourier transforms using min-max interpolation. IEEE Transactions on Signal Processing 2003; 51(2):560-574.
25. Jackson J I, Meyer C H, Nishimura D G, Macovski A. Selection of a convolution function for Fourier inversion using gridding [computerised tomography application]. IEEE Trans Med Imaging 1991; 10(3):473-478.
26. Paige C C, SAUNDERS M A. LSQR: An algorithm for sparse linear equations and sparse least squares. TOMS 1982; 8(1):43-71.
27. Barth M, Breuer F, Koopmans P J, Norris D G, Poser B A. Simultaneous multislice (SMS) imaging techniques. Magn Reson Med 2016; 75(1):63-81.
28. Schmitter S, Moeller S, Wu X, Auerbach E J, Metzger G J, Van de Moortele P F, Ugurbil K. Simultaneous multislice imaging in dynamic cardiac MRI at 7T using parallel transmission. Magn Reson Med 2017; 77(3): 1010-1020.
29. Walsh D O, Gmitro A F, Marcellin M W. Adaptive reconstruction of phased array M R imagery. Magn Reson Med 2000; 43(5):682-690.
30. Griswold M A, Jakob P M, Heidemann R M, Nittka M, Jellus V, Wang J, Kiefer B, Haase A. Generalized autocalibrating partially parallel acquisitions (GRAPPA). Magn Reson Med 2002; 47(6):1202-1210.
31. Chen X, Salerno M, Yang Y, Epstein F H. Motion-compensated compressed sensing for dynamic contrast enhanced MRI using regional spatiotemporal sparsity and region tracking: block low-rank sparsity with motion-guidance (BLOSM). Magn Reson Med 2014; 72(4):1028-1038.
32. Lustig M, Donoho D, Pauly J M. Sparse MRI: The application of compressed sensing for rapid M R imaging. Magnetic resonance in medicine 2007; 58(6):1182-1195.
33. Feng L, Grimm R, Block K T, Chandarana H, Kim S, Xu J, Axel L, Sodickson D K, Otazo R. Golden-angle radial sparse parallel MRI: combination of compressed sensing, parallel imaging, and golden-angle radial sampling for fast and flexible dynamic volumetric MRI. Magn Reson Med 2014; 72(3):707-717.
34. Zahneisen B, Ernst T, Poser B A. SENSE and simultaneous multislice imaging. Magn Reson Med 2015; 74(5): 1356-1362.
35. Rosenzweig S, Holme HCM, Wilke R N, Voit D, Frahm J, Uecker M.
Simultaneous multi-slice MRI using cartesian and radial FLASH and regularized nonlinear inversion: SMS-NL-INV. Magn Reson Med 2018; 79(4):2057-2066.
36. Uecker M, Lai P, Murphy N U, Virtue P, Elad M, Pauly J M, Vasanawala S S, Lustig M. ESPIRiT—an eigenvalue approach to autocalibrating parallel MRI: where SENSE meets GRAPPA. Magn Reson Med 2014; 71(3):990-1001.

The following patents, applications and publications as listed above and throughout this document are hereby incorporated by reference in their entirety herein.

ADDITIONAL REFERENCES

The devices, systems, apparatuses, compositions, machine readable medium, computer program products, non-transitory computer readable medium, and methods of various embodiments of the invention disclosed herein may utilize aspects disclosed in the following references, applications, publications and patents and which are hereby incorporated by reference herein in their entirety, and which are not admitted to be prior art with respect to the present invention by inclusion in this section:

A. U.S. Utility patent application Ser. No. 16/295,939, entitled "AUTOMATIC QUANTIFICATION OF CARDIAC MRI FOR HYPERTROPHIC CARDIOMYOPATHY", filed Mar. 7, 2019.
B. U.S. Utility patent application Ser. No. 16/195,424, entitled "CARDIAC AND RESPIRATORY SELF-GATED MOTION-CORRECTED FREE-BREATHING SPIRAL CINE IMAGING", filed Nov. 19, 2018.
C. U.S. Utility patent application Ser. No. 15/959,913, entitled "SYSTEMS AND METHODS FOR SIMULTANEOUS MULTI-SLICE IMAGING", filed Apr. 23, 2018; Publication No. US-2018-0306880-A1, Oct. 25, 2018.
D. U.S. Utility patent application Ser. No. 15/947,443, entitled "MAGNETIC FIELD MONITORING OF SPIRAL ECHO TRAIN IMAGING", filed Apr. 6, 2018; Publication No. US-2018-0292499-A1, Oct. 11, 2018.
E. U.S. Utility patent application Ser. No. 15/803,007, entitled "Interferometric Magnetic Resonance Imaging System and Related Method", filed Nov. 3, 2017.
F. U.S. Utility patent application Ser. No. 14/112,737, entitled "Interferometric Techniques for Magnetic Resonance Imaging", filed Oct. 18, 2013; U.S. Pat. No. 9,811,924, issued Nov. 7, 2017.
G. International Patent Application Serial No. PCT/US2012/034305, entitled "Interferometric Magnetic Resonance Imaging System and Related Method", filed Apr. 19, 2012; Publication No. WO 2012/145547, Oct. 26, 2012.
H. U.S. Utility patent application Ser. No. 15/606,882, entitled "REDUCED FIELD-OF VIEW PERFUSION IMAGING WITH HIGH SPATIOTEMPORAL RESOLUTION", filed May 26, 2017; Publication No. US-2017-0343635-A1, Nov. 30, 2017.
I. U.S. Utility patent application Ser. No. 15/593,894, entitled "DETECTING SIGNAL CHANGES IN HEATED BONE WITH A 3D SPIRAL ULTRA-SHORT ECHO TIME SEQUENCE", filed May 12, 2017; Publication No. US-2017-0328972-A1, Nov. 16, 2017.
J. U.S. Utility patent application Ser. No. 15/493,825, entitled "SYSTEMS AND METHODS FOR FREE-BREATHING CINE DENSE MRI USING SELF-NAVIGATION", filed Apr. 21, 2017; Publication No. US-2017-0307712-A1, Oct. 26, 2017.
K. U.S. Utility patent application Ser. No. 15/493,842, entitled "3D UTE IMAGING USING VARIABLE-TE STACK-OF-SPIRALS ACQUISITION", filed Apr. 21, 2017; Publication No. US-2017-0307705-A1, Oct. 26, 2017.
L. U.S. Utility patent application Ser. No. 15/321,495, entitled "SYSTEMS AND METHODS FOR IDENTIFYING AND PROFILING MUSCLE PATTERNS", filed Dec. 22, 2016; Publication No. US-2017-0202478-A1, Jul. 20, 2017.
M. International Patent Application Serial No. PCT/US2015/039162, entitled "SYSTEMS AND METHODS FOR IDENTIFYING AND PROFILING MUSCLE PATTERNS", filed Jul. 3, 2015; Publication No. WO2016004423, Jan. 7, 2016.
N. U.S. Utility patent application Ser. No. 15/349,971, entitled "SYSTEM AND METHOD FOR COMPARISON-BASED IMAGE QUALITY ASSESSMENT", filed Nov. 11, 2016; Publication No. US-2017-0140518-A1, May 18, 2017.
O. U.S. Utility patent application Ser. No. 15/331,292, entitled "SYSTEMS AND METHODS FOR REDUCING RESPIRATORY-INDUCED MOTION ARTIFACTS FOR ACCELERATED IMAGING", filed Oct. 21, 2016; Publication No. US-2017-0112449-A1, Apr. 27, 2017.
P. U.S. Utility patent application Ser. No. 15/267,371, entitled "FREE-BREATHING PARAMETER MAPPING WITH HIGH-CONTRAST IMAGE REGISTRATION", filed Sep. 16, 2016; U.S. Pat. No. 10,198,810, issued Feb. 5, 2019.
Q. U.S. Utility patent application Ser. No. 15/227,825, entitled "RAPID 3D DYNAMIC ARTERIAL SPIN LABELING WITH A SPARSE MODELBASED IMAGE RECONSTRUCTION", filed Aug. 3, 2016; Publication No. US-2017-0035319-A1, Feb. 9, 2017.
R. U.S. Utility patent application Ser. No. 15/078,790, entitled "SYSTEMS AND METHODS FOR REDUCED OFF-RESONANCE BLURRING IN SPIRAL IMAGING", filed Mar. 23, 2016; U.S. Pat. No. 9,651,645, issued May 16, 2017.
S. U.S. Utility patent application Ser. No. 13/868,095, entitled "SYSTEMS AND METHODS FOR REDUCED OFF-RESONANCE BLURRING IN SPIRAL IMAGING", filed Apr. 22, 2013; U.S. Pat. No. 9,322,896, issued Apr. 26, 2016.
T. U.S. Utility patent application Ser. No. 14/952,859, entitled "Systems and Methods for Three-Dimensional Spiral Perfusion Imaging", filed Nov. 25, 2015; U.S. Pat. No. 9,953,439, issued Apr. 24, 2018.
U. U.S. Utility patent application Ser. No. 14/870,803, entitled "SYSTEMS AND METHODS FOR ACCELERATED ARTERIAL SPIN LABELING USING COMPRESSED SENSING", filed Sep. 30, 2015; U.S. Pat. No. 9,589,345, issued Mar. 7, 2017.
V. U.S. Utility patent application Ser. No. 13/867,325, entitled "SYSTEMS AND METHODS FOR ACCELERATED ARTERIAL SPIN LABELING USING COMPRESSED SENSING", filed Apr. 22, 2013; U.S. Pat. No. 9,183,626, issued Nov. 10, 2015.
W. U.S. Utility patent application Ser. No. 14/677,905, entitled "SYSTEMS AND METHODS FOR ACCELERATED IMAGING USING VARIABLE DENSITY SAMPLING AND COMPRESSED SENSING WITH PARALLEL IMAGING", filed Apr. 2, 2015; U.S. Pat. No. 10,143,384, issued Dec. 4, 2018.
X. U.S. Utility patent application Ser. No. 14/677,891, entitled "SYSTEMS AND METHODS FOR MEDICAL IMAGING INCORPORATING PRIOR KNOWLEDGE", filed Apr. 2, 2015; Publication No. US-2015-0282719-A1, Oct. 8, 2015.
Y. U.S. Utility patent application Ser. No. 14/677,877, entitled "SYSTEMS AND METHODS FOR IMAGE RECONSTRUCTION USING VARIABLE-DENSITY SPIRAL TRAJECTORY", filed Apr. 2, 2015; U.S. Pat. No. 9,989,611, issued Jun. 5, 2018.
Z. U.S. Utility patent application Ser. No. 14/677,866, entitled "SYSTEMS AND METHODS FOR ACCELERATED PARAMETER MAPPING", filed Apr. 2, 2015; Publication No. US-2015-0287222-A1, Oct. 8, 2015.
AA. U.S. Utility patent application Ser. No. 14/677,915, entitled "Systems and Methods for Accelerated MR Thermometry", filed Apr. 2, 2015; Publication No. US-2015-0282733,
BB. U.S. Utility patent application Ser. No. 14/237,986, entitled "IMAGE-BASED IDENTIFICATION OF MUSCLE ABNORMALITIES", filed Feb. 10, 2014; Publication No. 2014/0364723, Dec. 11, 2014.
CC. International Patent Application Serial No. PCT/US2012/050591, entitled "IMAGEBASED IDENTIFICATION OF MUSCLE ABNORMALITIES", filed Aug. 13, 2012; Publication No. WO 2013/023214, Feb. 14, 2013.
DD. U.S. Utility patent application Ser. No. 14/174,748, entitled "SYSTEMS AND METHODS FOR ACCELERATED DYNAMIC MAGNETIC RESONANCE IMAGING", filed Feb. 6, 2014; U.S. Pat. No. 9,224,210, issued Dec. 29, 2015.
EE. U.S. Utility patent application Ser. No. 13/867,885, entitled "SYSTEMS AND METHODS FOR REGULARIZED RECONSTRUCTIONS IN MRI USING SIDE INFORMATION", filed Apr. 22, 2013; U.S. Pat. No. 9,874,623, issued Jan. 23, 2018.
FF. U.S. Utility patent application Ser. No. 13/867,922, entitled "SYSTEMS AND METHODS FOR CARTESIAN DYNAMIC IMAGING", filed Apr. 22, 2013; U.S. Pat. No. 9,910,118, issued Mar. 6, 2018.
GG. U.S. Utility patent application Ser. No. 13/126,029, entitled "Multimodal Imaging of Atherosclerotic Plaque Targeted to LOX-1", filed Apr. 26, 2011; U.S. Pat. No. 8,440,167, issued May 14, 2013.
HH. International Patent Application Serial No. PCT/US2009/062063, entitled "Multimodal Imaging of Atherosclerotic Plaque Targeted to LOX-1", filed Oct. 26, 2009; Publication No. WO 2010/062557, Jun. 3, 2010.
II. U.S. Utility patent application Ser. No. 12/696,433, entitled "MOTION-ATTENUATED CONTRAST-ENHANCED CARDIAC MAGNETIC RESONANCE IMAGING AND RELATED METHOD THEREOF", filed Jan. 29, 2010; U.S. Pat. No. 8,700,127, issued Apr. 15, 2014.
JJ. U.S. Utility patent application Ser. No. 12/411,110, entitled "Rapid Auto-Calibrated Parallel Reconstruction Using Synthetic Target Coil", filed Mar. 25, 2009; U.S. Pat. No. 8,026,720, issued Sep. 27, 2011.
KK. U.S. Utility patent application Ser. No. 12/114,307, entitled "System, Method and Computer Program Product for Fast Conjugate Phase Reconstruction Based on Polynomial Approximation", filed May 2, 2008; U.S. Pat. No. 8,094,907, issued Jan. 10, 2012.
LL. U.S. Utility patent application Ser. No. 12/036,805, entitled "Method and System for Off-Resonance Correction for Non-Cartesian Parallel Usage Reconstruction", filed Feb. 25, 2008; U.S. Pat. No. 8,306,289, issued Nov. 6, 2012.
MM. U.S. Utility patent application Ser. No. 12/036,693, entitled "Efficient Off-Resonance Correction Method and System for Spiral Imaging with Improved Accuracy", filed Feb. 25, 2008; U.S. Pat. No. 8,238,634, issued Aug. 7, 2012.
NN. U.S. Utility patent application Ser. No. 12/036,654, entitled "K-Space Trajectory Estimation In Spiral MRI System & Related Method Thereof", filed Feb. 25, 2008; U.S. Pat. No. 7,888,935, issued Feb. 15, 2011.
OO. U.S. Utility patent application Ser. No. 11/892,261, entitled "Fast Automatic Linear Off-Resonance Correction Method for Spiral Imaging", filed Aug. 21, 2007; U.S. Pat. No. 7,642,777, issued Jan. 5, 2010.
PP. U.S. Utility patent application Ser. No. 11/748,204, entitled "Motion-Guided Segmentation for Cine Dense Images", filed May 14, 2007; U.S. Pat. No. 7,813,537, issued Oct. 12, 2010.
QQ. U.S. Utility patent application Ser. No. 14/785,734, entitled "Partially Parallel Magnetic Resonance Imaging Using Arbitrary K-Space Trajectories with Image Reconstruction Based on Successive Convolution Operations", filed Apr. 19, 2007; U.S. Pat. No. 7,583,082, issued Sep. 1, 2009.

RR. U.S. Utility patent application Ser. No. 10/474,571, entitled "Optimized High-Speed Magnetic Resonance Imaging Method and System Using Hyperpolarized Noble Gases", filed Oct. 10, 2003; U.S. Pat. No. 7,174,200, issued Feb. 6, 2007.

SS. International Patent Application Serial No. PCT/US2002/011746, entitled "OPTIMIZED HIGH-SPEED MAGNETIC RESONANCE IMAGING METHOD AND SYSTEM USING HYPERPOLARIZED NOBLE GASES", filed Apr. 12, 2002; Publication No. WO 02/084305, Oct. 24, 2002.

Calibration Data for the NCSG Kernel

To compute the non-Cartesian slice-GRAPPA (NCSG) kernel, let yc be the concatenated SB spiral calibration center-of-k-space data of all of the slices, and let ys(be the concatenated data after CAIPIRINHA phase modulation, phase demodulation of the slice, and gridding as expressed by, $$\check{Y}_s = \hat{c}Q^*sQyc \quad (s1)$$

Here is the gridding operator Q=diag $(e^{-ip1[1 \cdots L]}, e^{-ip2[1 \cdots L]}, \ldots, e^{-ipNS[1 \cdots L]})$ is the diagonal matrix representing phase modulation of all the slices, and $Q^*s$=diag $(e^{-ip1[1 \cdots L]}, e^{-ip1[1 \cdots L]}, e^{-ipNS[1 \cdots L]})$ is the diagonal matrix representing phase demodulation of slice s. The size of ys(is Nx×Ny, where Nx and Ny are the number of lines in gridded k-space, and yc matrices are L×NS×NC, where NC is the number of readout points acquired per calibration interleave. The dimensions of Q and Q* are L×NS×L×NS. For kernel computation, SB spiral calibration data from all slices are processed according to Eq. S1, and the Cartesian split slice-GRAPPA model, as described in (1'), is used for kernel fitting (FIG. 2B).

Simultaneous Multi-Slice Reconstruction Using Spiral Slice-GRAPPA

Synopsis

Spiral trajectories provide efficient data acquisition and favorable motion properties for cardiac MRI. We developed multiband (MB) methods to accelerate spiral cardiac cine imaging including a non-iterative spiral slice-GRAPPA (SSG) reconstruction and a temporal SSG (TSSG). Using 25-35% of k-space for single-band calibration data, experiments in phantoms and five volunteers show 18.7% lower mean artifact power than CG-SENSE when imaging three slices simultaneously. TSSG incorporating CAIPIRINHA with temporal alternation and a temporal filter in reconstruction further reduced rRMSE by 11.2% compared to SSG.

Purpose: Spiral trajectories provide efficient data acquisition and favorable motion properties for cardiac MRI1. Multiband (MB) imaging with CAIPIRINHA3 has become an important acceleration method for Cartesian MRI2, 3, and it has also been demonstrated for non-Cartesian imaging 4-6. For the non-Cartesian case, extensive calibration data are typically required, which extends the scan time 4, 6. Cardiac MRI, which often involves dynamic imaging, also presents the opportunity to utilize temporal variation 7, 8 to improve MB methods. We sought to develop improved MB methods for spiral cardiac MRI that require a reduced amount of calibration data and exploit temporal variation. We introduce spiral slice-GRAPPA (SSG) and temporal SSG (TSSG) and compare them to conjugate gradient sensitivity encoding (CG-SENSE) for MB spiral cine imaging.

Theory: The SSG method is illustrated in FIG. 1, and the SSG reconstruction model can be expressed as follows:

Xs=SSGxC (Ps*·X), where the matrix SSGs is the spiral slice-GRAPPA kernel of the slice, C is the gridding function, P represents CAIPIRINHA phase modulation, X is the multiband k-space data, and xs is the separated k-space data of slice s. As shown in FIG. 1A, the SSGs kernel is fitted using the single-band (SB) spiral center of k-space as calibration data. For this calculation, CAIPIRINHA phase modulation is applied to all slices, then phase demodulation corresponding to the sth slice is applied to all slices. Next, gridding is performed on all slices, and the split-slice GRAPPA method 2 is applied to fit the slice-GRAPPA kernel of the sth slice (FIG. 1A). For image recovery, as shown in FIG. 1B, the MB data are phase demodulated using the conjugate of the sth phase modulation matrix, P*s, and the gridding function is convolved with the MB data 9. Next, the processed MB data are convolved with the sth slice-GRAPPA kernel, and the separated gridded k-space (xs) is obtained. Finally, the inverse Fast Fourier transform (IFFT) is performed to compute the image of the sth slice. This process is repeated for all slices. TSSG is based on alternation of CAIPIRINHA, and a temporal filter 7, 8 is applied after SSG reconstruction.

Methods: Spiral gradient-echo cine MRI was performed on a 3T system (Prisma, Siemens) using 30-34 RF channels. For MB cine RF excitation we employed CAIPIRINHA phase modulation of the multiple slices 3, without and with temporal alternation of CAIPIRINHA phase. Simulations of MB images using SB data were performed in volunteers to determine the minimum amount of calibration data needed to minimize root mean squared error relative (rRMSE) 10 to SB images. Also, for prospective MB spiral acquisitions, we compared the proposed SSG method with iterative CG-SENSE4. We also compared SSG to TSSG. Comparison studies used a phantom and short-axis cine MRI of five volunteers. SB images acquired at matched slice locations were used as reference standards. For MB imaging, SB kernel calibration data using the central 35% of k-space for each slice were acquired in one additional heartbeat appended to the cine acquisition.

Results:

FIG. 2 shows that rRMSE is minimized when 25-35% of the SB k-space are used for kernel calibration. Example images reconstructed using 15% (a-c) and 35% (d-f) of k-space for calibration are shown, as are corresponding artifacts relative to fully-sampled SB reference images (g-l). Panels (p) and (q) show the dependence of rRMSE on the spatial and temporal resolution of the calibration data. Based on these results, subsequent MB acquisitions used 35% of k-space and one cardiac phase for the SB calibration data.

FIG. 3 shows phantom results comparing SSG and CG-SENSE for MB=3, where both methods used 35% of SB k-space for calibration. Less slice leakage artifact was achieved using SSG. Results from a volunteer are shown in FIG. 4. Specifically, for a reference, fully-sampled SB images at basal, mid-ventricular and apical locations are shown in FIG. 4(g-i), and CG-SENSE-recovered MB images (a-c) and SSG-recovered MB images (d-f) at the same locations are also shown. Red arrows indicate slice-leakage artifacts in CG-SENSE, and these are reduced using SSG. The artifact power 4 of SSG was 18.7% lower than CG-SENSE (0.148±0.036 vs 0.182±0.037 for SSG vs. CG-SENSE, p<0.05, N=5). SSG required 30% of the computation time of CG-SENSE. FIG. 5 compares results using SSG (FIG. 5 (a-c)) and TSSG (FIG. 5 (d-f)). The mean rRMSE of TSSG was 11.2% lower than SSG. The computation time for TSSG is similar to SSG.

Discussion: SSG and TSSG are non-iterative slice-GRAPPA-based methods that provide better image quality than CG-SENSE for MB spiral cine MRI of the heart. Only 25-35% of the center of k-space is needed for kernel calibration, and the computation time is reduced. These methods provide rapid and accurate solutions for MB spiral imaging.

References: FOR PARAGRAPHS 159-258, The the following patents, applications and publications as listed below and throughout this document are hereby incorporated by reference in their entirety herein.
1. Mayer et al. MRM, 1992, 28: 202-213.
2. Cauley et al. MRM, 2014, 72: 93-102.
3. Breuer et al. MRM, 2005; 53(3): 684-691.
4. Yutzy et al. MRM, 2011; 65(6): 1630-1637.
5. Yang et al. MRM, 2018, 00:1-11.
6. Chu et al. MRM, 2016; 76: 1196-1209.
7. Madore et al. MRM, 1999; 42: 813-828.
8. Kellman et al. MRM, 2001; 45(5): 846-852.
9. Fessler et al. IEEE T Signal Proces, 2003; 51(2): 560-574.
10. Chen et al. MRM, 2013; 72(4): 1028-1038.

Simultaneous Multislice Multi-Slice Reconstruction for Spiral MRI Using Slice-SPIRiT Synopsis Simultaneous multislice (SMS) imaging provides through-plane acceleration. While current reconstruction methods for non-Cartesian imaging (and also for Cartesian imaging) utilize either in-plane or through-plane coil information, we reasoned that a slice-SPIRiT model could utilize both in-plane and through-plane kernel calibration information, and potentially outperform methods like conjugate-gradient SENSE (CG-SENSE). We developed a slice-SPIRiT method and compared it to CG-SENSE for spiral cardiac cine imaging. Slice leakage artifacts using slice-SPIRiT were 52.9% lower than using CG-SENSE in phantoms, and the artifact power of slice-SPIRiT was 24.2% less than CG-SENSE in five volunteers. Slice-SPIRiT is a promising method for spiral SMS imaging.

Purpose: Simultaneous multislice (SMS) or multiband (MB) imaging provides through-plane acceleration for MRI 1, 2. While MB acceleration with CAIPIRINHA3 has signal-to-noise ratio advantages compared to parallel imaging with in-plane undersampling, interslice leakage presents challenges, and this occurs for both Cartesian2 and non-Cartesian methods 4. Split slice-GRAPPA2 has been used in Cartesian imaging to reduce slice-leakage and CG-SENSE5 has similarly been used for non-Cartesian imaging. We developed an iterative slice-SPIRiT method to reconstruct spiral SMS images.

Theory: We reasoned that a slice-SPIRiT model could utilize both in-plane and through-plane kernel calibration information, and outperform methods like CG-SENSE, which make use of only in-plane coil sensitivity. The proposed slice-SPIRiT reconstruction is illustrated in FIG. 1 and the proposed slice-SPIRiT model can be expressed in Equation 1 as follows:

$$\text{Argmin} \left\| \sum_{Z=1}^{Ns} P_z \cdot D(mz)) - y \right\|^2 + \lambda 1 \|(G-I)mn\|^2 + \lambda 2 \|m\|^2$$

where is the number of MB slices, y is the slice number, Pz is the CAIPIRINHA phase modulation matrix for the zth slice, the D operator performs the Fast Fourier transform and inverse-gridding 6 of the Cartesian images, mz to the spiral k-space, mz is the multicoil image of the zth slice, y is the acquired MB spiral data, lambda 1 is the weight for the in-plane 7 calibration consistency, G is the operator of concatenated in-plane Gz SPIRiT 7 kernels Gz for the NS slices.

$$G = \begin{bmatrix} G1 & \cdots & 0 \\ 0 & \cdots & GNs \end{bmatrix}$$

$$I = \begin{bmatrix} G1 & \cdots & 0 \\ 0 & \cdots & GNs \end{bmatrix}$$

is the concatenated unit matrices, $$m = [m1 \, m2 \ldots mNS]$$

is the matrix of concatenated images for the NS slices, and lambda2 is the weight. For the Tikhonov regularization in the image domain.

In addition, we define the operator H=insert then the conjugate of H is I-1* is the key operator to calculate the gradient insert. However, the dimension of the gradient does not match the dimension of the concatenated separated slices, m. To solve this problem, we use an approximation for H*, namely insert where insert, C is the gridding operator 6, and SSGz is the slice separating kernel as used in the split slice GRAPPA method 2. In this way, the data consistency term in Eq. 1 utilizes the through plane GRAPPA kernel and enforces joint estimation of the separated slices. LSQR 8 is used as the conjugate gradient solver for this model (denoted as CG in FIG. 1a).

Methods: SMS spiral gradient-echo cine MRI was performed on a 3T system (Prisma, Siemens) using 30-34 RF channels. For MB RF excitation (MB=3) we employed CAIPIRINHA phase modulation of the multiple slices 3. For the reconstruction, we compared the proposed slice-SPIRiT method with CG-SENSE with Tikhonov regularization (weight=0.3). Comparison studies were performed using a phantom and by performing short-axis cine MRI of the heart in five human volunteers. Single-band (SB) images acquired at the same slice locations were used as reference standards. For the phantom and volunteers, SB kernel calibration data using the central 35% of k-space for each slice were acquired in one additional heartbeat appended to the end of the cine acquisition. We used a value of lambda1=1 based on the SPIRiT model 7 and we used 1 based on an ad hoc method. The number of iterations for slice-SPIRiT was 3 and for CG-SENSE was greater than 20.

Results:

FIG. 2 shows a comparison of slice-SPIRiT and CG-SENSE for SMS imaging of a phantom. We found that slice leakage artifacts (assessed using the difference from SB images) of slice-SPIRiT-recovered images (FIG. 2j-l) are 52.9% lower than CG-SENSE-recovered images (FIG. 2m-o).

Results from one of the five human volunteers are shown in FIG. 3. The reference SB images at basal, mid-ventricular and apical locations are shown in FIG. 3(g-i), and CG-SENSE-recovered MB images 3(a-c) and slice-SPIRiT-recovered MB images (d-f) are shown at the same locations. Red arrows show slice-leakage artifacts in CG-SENSE that are reduced using slice-SPIRiT. Summarizing the results from the 5 volunteers, the artifact power 5 of slice-SPIRiT was 24.2% lower than of CG-SENSE (0.138±0.034 vs 0.182±0.037 for slice-SPIRiT vs. CGSENSE, p<0.05, N=5).

Discussion: We developed a slice-SPIRiT reconstruction that uses through-plane calibration consistency, in-plane calibration consistency, and consistency with the acquired MB data. When applied to SMS spiral cardiac cine imaging, the slice-SPIRiT reconstruction performed better than CG-SENSE. Slice-SPIRiT may also be well-suited for variable density spiral data, in-plane undersampling, and SMS Cartesian imaging.

References: For paragraphs 282-285, the The following patents, applications and publications as listed below and throughout this document are hereby incorporated by reference in their entirety herein.
1. Markus et al. MRM, 2016, 75: 63-81
2. Cauley et al. MRM, 2014, 72: 93-102.
3. Breuer et al. MRM, 2005; 53(3): 684-691.
4. Yang et al. MRM, 2018, 00:1-11.
5. Yutzy et al. MRM, 2011; 65(6): 1630-1637.
6. Fessler et al. IEEE T Signal Proces, 2003; 51(2): 560-574.
7. Lustig et al. MRM, 2010, 64: 457-471.
8. Paige et al. TOMS, 1982, 8: 43-71.

System and Method for Multiband First-Pass Myocardial Perfusion MRI Using a Slicelow-Rank Plus Sparse Model Synopsis Multiband (MB) excitation and in-plane acceleration of first-pass perfusion imaging has the potential to provide a high aggregate acceleration rate. Our recent slice-SPIRiT work formulated MB reconstruction as a constrained optimization problem that jointly uses in-plane and through-plane coil information and MB data consistency. Here we extend these methods to develop k-t slice-SPARSE-SENSE and k-t slice-L+S reconstruction models. First-pass perfusion data with MB=3 and rate-2 k-t Poisson-disk undersampling were acquired in 6 patients. The slice L+S reconstruction showed sharper borders and greater contrast than slice-SPARSE-SENSE and had better image quality scores as assessed by two cardiologists.

Purpose:

First-pass MRI is widely used to image myocardial perfusion. While three slices are typically acquired 1, multiband (MB) and in-plane acceleration methods used together promise an increased number of slices and better heart coverage. We recently developed a MB reconstruction model that combines through-plane coil sensitivity, in-plane coil calibration consistency, and consistency with acquired data for iterative joint estimation of all slices 2. For MB excitation and in-plane acceleration, here we further develop k-t slice-SPARSE-SENSE and slice-low-rank plus sparse 3 (slice-L+S) reconstructions and apply them to first-pass imaging, including comparisons of the two reconstructions.

Theory:

The k-t slice-L+S model utilizes in-plane sensitivity maps and through-plane kernel calibration information for MB data consistency, and enforces temporal L+S. The proposed slice L+S reconstruction (FIG. 1B) is expressed in Equation 1:

$$ArgminLS \| H[L1 + S1\ L2 + S2\ LNS + SNS] - YMP \|2 + \lambda L \| L1\ L2\ LNs \| + \lambda S \| T[S1\ S2\ SNs] \|_1,$$

Where the operator H (shown in FIG. 1C is defined as H=PQE, Ns is the number of MB slices, Pz is the CAIPIRINHA phase modulation matrix for the zth slice, Fi sithe fast Fourier transform, Ez is the sensitivity map for the zth slice, YMB is the MB data, $\lambda L$ is the weight for the low-rank constraint, $\lambda S$ is the weight for the temporal frequency sparce constraint, T, is the temporary sparsity operator, $$M = [m1\ m2 \ldots mNS] = [L1 + S1\ L2 + S2\ LNS + SNS]$$

represents the concatenated Ns, coil combined images undergoing reconstruction as L+S for all slices, mz is the coil combined image 4 of the zth slice, $$L = [L1\ L2\ L3 \ldots LNs],\ S = [S1, S2, \ldots SNs],$$
$$P = [P1, P2, \ldots PNs],\ Q = \begin{bmatrix} F & \cdots & 0 \\ 0 & \cdots & F \end{bmatrix} \text{ and } E = \begin{bmatrix} E1 & \cdots & 0 \\ 0 & \cdots & ENs \end{bmatrix}.$$

We use the variable splitting 5 to decompose the problem into two subproblems: 1) the MB data consistency subproblem written as $$\text{argmin}(m1, m2, mNS) \| Hm - yMB \|^2 + \mu^2 \| m - m' \|^2,$$

and 2) the slice L+S subproblem written as $$\text{argmin}(m1, m2, mNS) \lambda L \| L \|, + \lambda S \| TS \|1 + \| m - m' \|^2.$$

Here $\mu^2$ was empirically chosen as 0.4

We define the conjugate of H as H*=E* Q*P* (FIG. 1D and redefine $$Q^* = \begin{matrix} [F^{-1}K_1 \ldots\ 0 \\ [0 \ldots\ F^{-1}K_{NS}] \end{matrix}$$

where Kz is a matrix that performs a convolution using the split slice GRAPPA kernel[6]. For comparison a k-[7] slice-SPARSE-SENSE method (FIG. 1A) using temporal total variation (T)[7] as a constraint is formulated in Equation 2:

$$\text{argmin}(m1, m2, mNS) \| H(m1, m2, mNS) - yMB \|^2 + \lambda 1 \| T[m1, m2, mNS] \|_1,$$

where $\lambda 1$ is empirically chosen as 0.01.

Methods:

A saturation-recovery gradient-echo sequence was modified to use MB excitation with CAIPIRINHA8 phase modulation and Poisson-disk k-t under sampling. Imaging was performed on a 1.5T system (Aera, Siemens) using 20-34 receiver channels. Single-band calibration data were acquired in the first heartbeat, and were used to calibrate split slice-GRAPPA kernels and in-plane sensitivity maps. Six-fold aggregate acceleration was achieved using MB=3 and rate-2 (R=2) k-t under sampling. We implemented the k-t slice-SPARSE-SENSE and slice-L+S methods in MATLAB, both based on split slice-GRAPPA 6 and MB CG-SENSE9, where slice-SPARSE- SENSE used temporal total variation (TV) compressed sensing 6, and slice-L+S used low-rank and temporal-frequency sparsity and were solved using CG10, 11 and soft thresholding with variable splitting 4. The methods were evaluated in six patients, with 9 slices per patient. The two reconstruction methods were scored (1-5, 5 is best) by two cardiologists.

Results:

2D IFFT-reconstructions illustrate the artifacts associated with MB=3 and R=2 sampling (FIG. 2a), and initial split slice-GRAPPA reconstructions with remaining R=2 under sampling and slice-separation artifacts are shown in FIG. 2b. Example images demonstrating the slice L+S method are shown in FIG. 2c, showing simultaneous decomposition of background and dynamic components for multiple slices. Subsequently, the superposition of L and S demonstrates slice separation and artifact removal (FIG. 2d). The example in FIG. 3A compares sliceSPARSE-SENSE and slice-L+S, where slice-L+S shows sharper borders and greater contrast. The cardiologist scoring results were 3.8±0.58 and 4.1±0.36 for slice-SPARSE-SENSE and slice L+S, respectively (FIG. 3B). FIG. 4 shows a slice-L+S example of nine-slice coverage.

Discussion:

We developed slice-SPARSE-SENSE and slice-L+S reconstructions that use through plane and in-plane coil information, consistency with the acquired data and that enforce temporal constraints. CAPIRINHA MB phase modulation (MB=3), Poisson-disk (R=2) under sampling and the proposed reconstructions provide an effective means to acquire and reconstruct MB first-pass perfusion images. Slice-L+S provides sharper borders and greater contrast than slice-SPARSE SENSE with temporal TV, though more studies need to be performed. These methods enable the acquisition of nine slices in the time typically required to acquire three slices.

References: For Paragraphs 295-312, the The following patents, applications and publications as listed below and throughout this document are hereby incorporated by reference in their entirety herein.
1. Kramer et al. JCMR. 2013; 15:19.
2. Sun et al. MRM. 2019; DOI:10.1002/mrm.28002.
3. Otazo et al. MRM, 2015; 73(3): 1125-1136. 4. Uecker et al. MRM, 2014; 71(3): 990-1001. 5. Huang et al. MRM, 2010; 64(4): 1078-1088. 6. Cauley et al. MRM. 2014; 72(1):93-102.
7. Feng et al. MRM, 2014; 72(3): 707-717. 8. Breuer et al. MRM, 2005; 53(3): 684-691. 9. Yutzy et al. MRM, 2011; 65(6): 1630-1637. 10. Lustig et al. MRM, 2010, 64: 457-471. 11. Paige et al. TOMS, 1982, 8:43-71.

Multiband First-Pass Perfusion MRI Using k-t Slice-SPARSE SENSE

Target audience: This abstract is targeted to those interested in the acceleration of cardiac MRI sequences based on multiband methods, parallel imaging and compressed sensing.

Purpose: First-pass gadolinium-enhanced MRI is widely used to image myocardial perfusion. While three short-axis slices are typically acquired1, multiband (MB) and inplane acceleration methods used together promise an increased number of slices and better coverage of the left ventricle (LV). We have recently developed a MB reconstruction model that combines through-plane coil sensitivity information, in-plane coil calibration consistency, and consistency with acquired data for iterative joint estimation of all slices 2. While this initial work focused on cine MRI 2, here we extend the reconstruction methods and apply them to first-pass perfusion imaging with MB excitation and in-plane acceleration.

Theory: We implemented a k-t slice-SPARSE-SENSE method which uses the temporal total variation (T) as a constraint as shown in Equation 1 (FIG. 1), $$\mathrm{argmin}(m1, m2, mNS)\|H(m1, m2, mNS) - yMB\|^2 + \lambda 1\|T[m1, m2, mNS]\|_1, \quad (1)$$

where the operator H (as shown in FIG. 1B) is defined as H=(P1FE1, P2FE2, ... PNsFENs)=PQE, Ns is the number of MB slices, Pz is the CAIPIRINHA phase modulation matrix for the zth slice, Fi s the fast Fourier transform, Ez is the sensitivity map for the zth slice, YMB is the MB multicoil data and λ1 is empirically chosen as $$0.01. \quad m = [m1\ m2 \ldots mNS]$$

represents the concatenated Ns coil-combined image of the zth slice, $$P = [P1, P2, PNs],\ Q = \begin{bmatrix} F & \cdots & 0 \\ 0 & \cdots & F \end{bmatrix}\ \text{and}\ E = \begin{bmatrix} E1 & \cdots & 0 \\ 0 & \cdots & ENs \end{bmatrix}.$$

We define the conjugate of H as H* (FIG. 1C), where H*=E*Q*P*, P* is the phase demodulation operator for all slices and we redefine Q* as follows $$\begin{bmatrix} F^{-1}K_1 \ldots 0 \\ [0 \ldots F^{-1}K_{NS}] \end{bmatrix}$$

where F− is the inverse Fast Fourier transform, and Kz is a matrix that performs a convolution using the split slice-GRAPPA kernel[4] for the zth slice. It is through this use of Kz that slice SPARXE-SENSE utilizes through-plane coil information (FIG. 1C).

Methods: A saturation-recovery gradient-echo sequence was modified to use MB excitation with CAIPIRINHA3 phase modulation and Poisson disk in-plane undersampling. Single-band (SB) calibration data were acquired in the first heartbeat, and were used to calibrate split slice-GRAPPA kernels and in-plane sensitivity maps. Six-fold acceleration was achieved using MB=3 and rate-2 (R=2) in-plane undersampling. For the iterative reconstruction, we implemented the k-t slice SPARSE SENSE (k-t SSS) method based on split slice-GRAPPA4, MB CG-SENSES and temporal total variation compressed sensing 6,7,8. Imaging was performed on a 1.5T system (Aera, Siemens) using 20-34 RF receiver channels. We evaluated the acquisition and reconstruction methods in six patients, where nine slices were acquired per patient.

Results: FIG. 2 illustrates the effectiveness of the reconstruction method, where 2DIFFT-reconstructions illustrate the artifacts associated with MB=3 and R=2 sampling (FIG. 2a), and where the example images reconstructed using k-t SSS demonstrate slice separation and artifact removal (FIG. 2b). FIG. 3 shows an example of nine-slice coverage from another patient.

Conclusions: CAPIRINHA MB phase modulation (MB=3) and Poisson disk (R=2) undersampling used with the proposed k-t slice-SPARSE-SENSE reconstruction provide an effective means to acquire and reconstruct MB first-pass perfusion images. These methods enable the acquisition of nine slices to achieve whole-heart coverage in the time typically required to acquire 3 slices.

References: For Paragraphs 318-324, the The following patents, applications and publications as listed below and throughout this document are hereby incorporated by reference in their entirety herein.
1. Kramer et al. JCMR. 2013; 15:19.
2. Sun et al. MRM. 2019; DOI:10.1002/mrm. 28002.
3. Breuer et al. MRM. 2005; 53(3):684-691.
4. Cauley et al. MRM. 2014; 72(1):93-102.
5. Yutzy et al. MRM. 2011; 65(6): 1630-1637.
6. Lustig et al. MRM. 2007; 58(6): 1182-1195.
7. Feng et al. MRM. 2014; 72(3): 707-717
8. Otazo et al. MRM. 2010; 64(3): 767-776.

References: For Paragraphs 1-157, the following patents, applications and publications as listed below and throughout this document are hereby incorporated by reference in their entirety herein.
1. Breuer F A, Blaimer M, Heidemann R M, Mueller M F, Griswold M A, Jakob P M. Controlled aliasing in parallel imaging results in higher acceleration (CAIPIRINHA) for multi-slice imaging. Magn Reson Med 2005; 53(3):684-691.
2. Setsompop K, Gagoski B A, Polimeni J R, Witzel T, Wedeen V J, Wald L L.
Blipped-controlled aliasing in parallel imaging for simultaneous multislice echo planar imaging with reduced g-factor penalty. Magn Reson Med 2012; 67(5):1210-1224.
3. Cauley S F, Polimeni J R, Bhat H, Wald L L, Setsompop K. Interslice leakage artifact reduction technique for simultaneous multislice acquisitions. Magn Reson Med 2014; 72(1):93-102.
4. Stab D, Ritter C O, Breuer F A, Weng A M, Hahn D, Kostler H. CAIPIRINHA accelerated SSFP imaging. MagnReson Med 2011; 65(1):157-164.
5. Stab D, Wech T, Breuer F A, Weng A M, Ritter C O, Hahn D, Kostler H. High resolution myocardial first-pass perfusion imaging with extended anatomic coverage. J Magn Reson Imaging 2014; 39(6):1575-1587.
6. Ferrazzi G, Bassenge J P, Wink C, Ruh A, Markl M, Moeller S, Metzger G J, Ittermann B, Schmitter S. Autocalibrated multiband CAIPIRINHA with through-time encoding: Proof of principle and application to cardiac tissue phase mapping. Magnetic Resonance in Medicine 2018.
7. Weingartner S, Moeller S, Schmitter S, Auerbach E, Kellman P, Shenoy C, Akcakaya M. Simultaneous multislice imaging for native myocardial T1 mapping: Improved spatial coverage in a single breath-hold. Magn Reson Med 2017; 78(2):462-471.
8. Ahn C B, Kim J H, Cho Z H. High-speed spiral-scan echo planar NMR imaging-I. IEEE Trans Med Imaging 1986; 5(1):2-7.
9. Meyer C H, Hu B S, Nishimura D G, Macovski A. Fast spiral coronary artery imaging. Magn Reson Med 1992; 28(2):202-213.
10. Zhong X, Spottiswoode B S, Meyer C H, Kramer C M, Epstein F H. Imaging three-dimensional myocardial mechanics using navigator-gated volumetric spiral cine DENSE MRI. Magn Reson Med 2010; 64(4):1089-1097.
11. Salerno M, Sica C T, Kramer C M, Meyer C H. Optimization of spiral-based pulse sequences for first-pass myocardial perfusion imaging. Magn Reson Med 2011; 65(6): 1602-1610.
12. Feng X, Salerno M, Kramer C M, Meyer C H. Non-Cartesian balanced steady-state free precession pulse sequences for real-time cardiac MRI. Magn Reson Med 2016; 75(4):1546-1555.
13. Yang Y, Meyer C H, Epstein F H, Kramer C M, Salerno M. Whole-Heart Spiral Simultaneous Multi-Slice First-Pass Myocardial Perfusion Imaging. Magnetic Resonance in Medicine 2018.
14. Blaimer M, Breuer F A, Seiberlich N, Mueller M F, Heidemann R M, Jellus V, Wiggins G, Wald L L, Griswold M A, Jakob P M. Accelerated volumetric MRI with a SENSE/GRAPPA combination. J Magn Reson Imaging 2006; 24(2):444-450.
15. Yutzy S R, Seiberlich N, Duerk J L, Griswold M A. Improvements in multislice parallel imaging using radial CAIPIRINHA. Magn Reson Med 2011; 65(6):1630-1637.
16. Sun C, Yang Y, Cai X, Cui S, Auger D, Salerno M, Epstein F H. Simultaneous multislice spiral cine DENSE MRI. Proceedings of the 26th Annual meeting of ISMRM 2018:#4911.
17. Ye H, Cauley S F, Gagoski B, Bilgic B, Ma D, Jiang Y, Du Y P, Griswold M A, Wald L L, Setsompop K. Simultaneous multislice magnetic resonance fingerprinting (SMS-MRF) with direct-spiral slice-GRAPPA (ds-S G) reconstruction. Magn Reson Med 2017; 77(5):1966-1974.
18. Chu A, Noll D C. Coil compression in simultaneous multislice functional MRI with concentric ring slice-GRAPPA and SENSE. Magn Reson Med 2016; 76(4): 1196-1209.
19. Lustig M, Pauly J M. SPIRiT: Iterative self-consistent parallel imaging reconstruction from arbitrary k-space. Magn Reson Med 2010; 64(2):457-471.
20. Kellman P, Epstein F H, McVeigh E R. Adaptive sensitivity encoding incorporating temporal filtering (TSENSE). Magn Reson Med 2001; 45(5):846-852.
21. Madore B, Glover G H, Pelc N J. Unaliasing by fourier-encoding the overlaps using the temporal dimension (UNFOLD), applied to cardiac imaging and fMRI. Magn Reson Med 1999; 42(5):813-828.
22. Madore B. Using UNFOLD to remove artifacts in parallel imaging and in partial-Fourier imaging. MagnReson Med 2002; 48(3):493-501.
23. Wang H, Adluru G, Chen L, Kholmovski E G, Bangerter N K, DiBella E V. Radial simultaneous multi-slice CAIPI for ungated myocardial perfusion. Magn Reson Imaging 2016; 34(9): 1329-1336.
24. Fessler J A, Sutton B P. Nonuniform fast fourier transforms using min-max interpolation. IEEE Transactions on Signal Processing 2003; 51(2):560-574.
25. Jackson J I, Meyer C H, Nishimura D G, Macovski A. Selection of a convolution function for Fourier inversion using gridding [computerised tomography application]. IEEE Trans Med Imaging 1991; 10(3):473-478.
26. Paige C C, SAUNDERS M A. LSQR: An algorithm for sparse linear equations and sparse least squares. TOMS 1982; 8(1):43-71.
27. Barth M, Breuer F, Koopmans P J, Norris D G, Poser B A. Simultaneous multislice (SMS) imaging techniques. Magn Reson Med 2016; 75(1):63-81.
28. Schmitter S, Moeller S, Wu X, Auerbach E J, Metzger G J, Van de Moortele P F, Ugurbil K. Simultaneous multislice imaging in dynamic cardiac MRI at 7T using parallel transmission. Magn Reson Med 2017; 77(3): 1010-1020.
29. Walsh D O, Gmitro A F, Marcellin M W. Adaptive reconstruction of phased array M R imagery. Magn Reson Med 2000; 43(5):682-690.
30. Griswold M A, Jakob P M, Heidemann R M, Nittka M, Jellus V, Wang J, Kiefer B, Haase A. Generalized auto-calibrating partially parallel acquisitions (GRAPPA). Magn Reson Med 2002; 47(6):1202-1210.
31. Chen X, Salerno M, Yang Y, Epstein F H. Motion-compensated compressed sensing for dynamic contrast enhanced MRI using regional spatiotemporal sparsity and region tracking: block low-rank sparsity with motion-guidance (BLOSM). Magn Reson Med 2014; 72(4):1028-1038.
32. Lustig M, Donoho D, Pauly J M. Sparse MRI: The application of compressed sensing for rapid M R imaging. Magnetic resonance in medicine 2007; 58(6):1182-1195.
33. Feng L, Grimm R, Block K T, Chandarana H, Kim S, Xu J, Axel L, Sodickson D K, Otazo R. Golden-angle radial sparse parallel MRI: combination of compressed sensing, parallel imaging, and golden-angle radial sampling for fast and flexible dynamic volumetric MRI. Magn Reson Med 2014; 72(3):707-717.
34. Zahneisen B, Ernst T, Poser B A. SENSE and simultaneous multislice imaging. Magn Reson Med 2015; 74(5): 1356-1362.
35. Rosenzweig S, Holme HCM, Wilke R N, Voit D, Frahm J, Uecker M. Simultaneous multi-slice MRI using cartesian and radial FLASH and regularized nonlinear inversion: SMS-NLINV. Magn Reson Med 2018; 79(4):2057-2066.
36. Uecker M, Lai P, Murphy M J, Virtue P, Elad M, Pauly J M, Vasanawala S S, Lustig M. ESPIRiT—an eigenvalue approach to autocalibrating parallel MRI: where SENSE meets GRAPPA. Magn Reson Med 2014; 71(3):990-1001.

The following patents, applications and publications as listed above and throughout this document are hereby incorporated by reference in their entirety herein.

ADDITIONAL REFERENCES

The devices, systems, apparatuses, compositions, machine readable medium, computer program products, non-transitory computer readable medium, and methods of various embodiments of the invention disclosed herein may utilize aspects disclosed in the following references, applications, publications and patents and which are hereby incorporated by reference herein in their entirety, and which are not admitted to be prior art with respect to the present invention by inclusion in this section:

A. U.S. Utility patent application Ser. No. 16/295,939, entitled "AUTOMATIC QUANTIFICATION OF CARDIAC MRI FOR HYPERTROPHIC CARDIOMYOPATHY", filed Mar. 7, 2019.
B. U.S. Utility patent application Ser. No. 14/195,424, entitled "CARDIAC AND RESPIRATORY SELF-GATED MOTION-CORRECTED FREE-BREATHING SPIRAL CINE IMAGING", filed Nov. 19, 2018.
C. U.S. Utility patent application Ser. No. 15/959,913, entitled "SYSTEMS AND METHODS FOR SIMULTANEOUS MULTI-SLICE IMAGING", filed April 23, 2018; Publication No. US-2018-0306880-A1, Oct. 25, 2018.
D. U.S. Utility patent application Ser. No. 15/947,443, entitled "MAGNETIC FIELD MONITORING OF SPIRAL ECHO TRAIN IMAGING", filed Apr. 6, 2018; Publication No. US-2018-0292499-A1, Oct. 11, 2018.
E. U.S. Utility patent application Ser. No. 15/803,007, entitled "Interferometric Magnetic Resonance Imaging System and Related Method", filed Nov. 3, 2017.
F. U.S. Utility patent application Ser. No. 14/112,737, entitled "Interferometric Techniques for Magnetic Resonance Imaging", filed Oct. 18, 2013; U.S. Pat. No. 9,811,924, issued Nov. 7, 2017.
G. International Patent Application Serial No. PCT/US2012/034305, entitled "Interferometric Magnetic Resonance Imaging System and Related Method", filed Apr. 19, 2012; Publication No. WO 2012/145547, Oct. 26, 2012.
H. U.S. Utility patent application Ser. No. 15/606,882, entitled "REDUCED FIELD-OF VIEW PERFUSION IMAGING WITH HIGH SPATIOTEMPORAL RESOLUTION", filed May 26, 2017; Publication No. US-2017-0343635-A1, Nov. 30, 2017.
I. U.S. Utility patent application Ser. No. 15/593,894, entitled "DETECTING SIGNAL CHANGES IN HEATED BONE WITH A 3D SPIRAL ULTRA-SHORT ECHO TIME SEQUENCE", filed May 12, 2017; Publication No. US-2017-0328972-A1, Nov. 16, 2017.
J. U.S. Utility patent application Ser. No. 15/493,825, entitled "SYSTEMS AND METHODS FOR FREE-BREATHING CINE DENSE MRI USING SELF-NAVIGATION", filed Apr. 21, 2017; Publication No. US-2017-0307712-A1, Oct. 26, 2017.
K. U.S. Utility patent application Ser. No. 15/493,842, entitled "3D UTE IMAGING USING VARIABLE-TE STACK-OF-SPIRALS ACQUISITION", filed Apr. 21, 2017; Publication No. US-2017-0307705-A1, Oct. 26, 2017.
L. U.S. Utility patent application Ser. No. 15/321,495, entitled "SYSTEMS AND METHODS FOR IDENTIFYING AND PROFILING MUSCLE PATTERNS", filed Dec. 22, 2016; Publication No. US-2017-0202478-A1, Jul. 20, 2017.
M. International Patent Application Serial No. PCT/US2015/039162, entitled "SYSTEMS AND METHODS FOR IDENTIFYING AND PROFILING MUSCLE PATTERNS", filed Jul. 3, 2015; Publication No. WO2016004423, Jan. 7, 2016.
N. U.S. Utility patent application Ser. No. 15/349,971, entitled "SYSTEM AND METHOD FOR COMPARISON-BASED IMAGE QUALITY ASSESSMENT", filed Nov. 11, 2016; Publication No. US-2017-0140518-A1, May 18, 2017.
O. U.S. Utility patent application Ser. No. 15/331,292, entitled "SYSTEMS AND METHODS FOR REDUCING RESPIRATORY-INDUCED MOTION ARTIFACTS FOR ACCELERATED IMAGING", filed Oct. 21, 2016; Publication No. US-2017-0112449-A1, Apr. 27, 2017.
P. U.S. Utility patent application Ser. No. 15/267,371, entitled "FREE-BREATHING PARAMETER MAPPING WITH HIGH-CONTRAST IMAGE REGISTRATION", filed Sep. 16, 2016; U.S. Pat. No. 10,198,810, issued Feb. 5, 2019.
Q. U.S. Utility patent application Ser. No. 15/227,825, entitled "RAPID 3D DYNAMIC ARTERIAL SPIN LABELING WITH A SPARSE MODELBASED IMAGE RECONSTRUCTION", filed Aug. 3, 2016; Publication No. US-2017-0035319-A1, Feb. 9, 2017.
R. U.S. Utility patent application Ser. No. 15/078,790, entitled "SYSTEMS AND METHODS FOR REDUCED OFF-RESONANCE BLURRING IN SPIRAL IMAGING", filed Mar. 23, 2016; U.S. Pat. No. 9,651,645, issued May 16, 2017.

S. U.S. Utility patent application Ser. No. 13/868,095, entitled "SYSTEMS AND METHODS FOR REDUCED OFF-RESONANCE BLURRING IN SPIRAL IMAGING", filed Apr. 22, 2013; U.S. Pat. No. 9,322,896, issued Apr. 26, 2016.

T. U.S. Utility patent application Ser. No. 14/952,859, entitled "Systems and Methods for Three-Dimensional Spiral Perfusion Imaging", filed Nov. 25, 2015; U.S. Pat. No. 9,953,439, issued Apr. 24, 2018.

U. U.S. Utility patent application Ser. No. 14/870,803, entitled "SYSTEMS AND METHODS FOR ACCELERATED ARTERIAL SPIN LABELING USING COMPRESSED SENSING", filed Sep. 30, 2015; U.S. Pat. No. 9,589,345, issued Mar. 7, 2017.

V. U.S. Utility patent application Ser. No. 13/867,325, entitled "SYSTEMS AND METHODS FOR ACCELERATED ARTERIAL SPIN LABELING USING COMPRESSED SENSING", filed Apr. 22, 2013; U.S. Pat. No. 9,183,626, issued Nov. 10, 2015.

W. U.S. Utility patent application Ser. No. 14/677,905, entitled "SYSTEMS AND METHODS FOR ACCELERATED IMAGING USING VARIABLE DENSITY SAMPLING AND COMPRESSED SENSING WITH PARALLEL IMAGING", filed Apr. 2, 2015; U.S. Pat. No. 10,143,384, issued Dec. 4, 2018.

X. U.S. Utility patent application Ser. No. 14/677,891, entitled "SYSTEMS AND METHODS FOR MEDICAL IMAGING INCORPORATING PRIOR KNOWLEDGE", filed Apr. 2, 2015; Publication No. US-2015-0282719-A1, Oct. 8, 2015.

Y. U.S. Utility patent application Ser. No. 14/677,877, entitled "SYSTEMS AND METHODS FOR IMAGE RECONSTRUCTION USING VARIABLE-DENSITY SPIRAL TRAJECTORY", filed Apr. 2, 2015; U.S. Pat. No. 9,989,611, issued Jun. 5, 2018.

Z. U.S. Utility patent application Ser. No. 14/677,866, entitled "SYSTEMS AND METHODS FOR ACCELERATED PARAMETER MAPPING", filed Apr. 2, 2015; Publication No. US-2015-0287222-A1, Oct. 8, 2015.

AA. U.S. Utility patent application Ser. No. 14/677,915, entitled "Systems and Methods for Accelerated MR Thermometry", filed Apr. 2, 2015; Publication No. US-2015-0282733, BB. U.S. Utility patent application Ser. No. 14/237,986, entitled "IMAGE-BASED IDENTIFICATION OF MUSCLE ABNORMALITIES", filed Feb. 10, 2014; Publication No. 2014/0364723, Dec. 11, 2014.

CC. International Patent Application Serial No. PCT/US2012/050591, entitled "IMAGEBASED IDENTIFICATION OF MUSCLE ABNORMALITIES", filed Aug. 13, 2012; Publication No. WO 2013/023214, Feb. 14, 2013.

DD. U.S. Utility patent application Ser. No. 14/174,748, entitled "SYSTEMS AND METHODS FOR ACCELERATED DYNAMIC MAGNETIC RESONANCE IMAGING", filed Feb. 6, 2014; U.S. Pat. No. 9,224,210, issued Dec. 29, 2015.

EE. U.S. Utility patent application Ser. No. 13/867,885, entitled "SYSTEMS AND METHODS FOR REGULARIZED RECONSTRUCTIONS IN MRI USING SIDE INFORMATION", filed Apr. 22, 2013; U.S. Pat. No. 9,874,623, issued Jan. 23, 2018.

FF. U.S. Utility patent application Ser. No. 13/867,922, entitled "SYSTEMS AND METHODS FOR CARTESIAN DYNAMIC IMAGING", filed Apr. 22, 2013; U.S. Pat. No. 9,910,118, issued Mar. 6, 2018.

GG. U.S. Utility patent application Ser. No. 13/126,029, entitled "Multimodal Imaging of Atherosclerotic Plaque Targeted to LOX-1", filed Apr. 26, 2011; U.S. Pat. No. 8,440,167, issued May 14, 2013.

HH. International Patent Application Serial No. PCT/US2009/062063, entitled "Multimodal Imaging of Atherosclerotic Plaque Targeted to LOX-1", filed Oct. 26, 2009; Publication No. WO 2010/062557, Jun. 3, 2010.

II. U.S. Utility patent application Ser. No. 12/696,433, entitled "MOTION-ATTENUATED CONTRAST-ENHANCED CARDIAC MAGNETIC RESONANCE IMAGING AND RELATED METHOD THEREOF", filed Jan. 29, 2010; U.S. Pat. No. 8,700,127, issued Apr. 15, 2014.

JJ. U.S. Utility patent application Ser. No. 12/411,110, entitled "Rapid Auto-Calibrated Parallel Reconstruction Using Synthetic Target Coil", filed Mar. 25, 2009; U.S. Pat. No. 8,026,720, issued Sep. 27, 2011.

KK. U.S. Utility patent application Ser. No. 12/114,307, entitled "System, Method and Computer Program Product for Fast Conjugate Phase Reconstruction Based on Polynomial Approximation", filed May 2, 2008; U.S. Pat. No. 8,094,907, issued Jan. 10, 2012.

LL. U.S. Utility patent application Ser. No. 12/036,805, entitled "Method and System for Off-Resonance Correction for Non-Cartesian Parallel Usage Reconstruction", filed Feb. 25, 2008; U.S. Pat. No. 8,306,289, issued Nov. 6, 2012.

MM. U.S. Utility patent application Ser. No. 12/036,693, entitled "Efficient Off-Resonance Correction Method and System for Spiral Imaging with Improved Accuracy", filed Feb. 25, 2008; U.S. Pat. No. 8,238,634, issued Aug. 7, 2012.

NN. U.S. Utility patent application Ser. No. 12/036,654, entitled "K-Space Trajectory Estimation In Spiral MRI System & Related Method Thereof", filed Feb. 25, 2008; U.S. Pat. No. 7,888,935, issued Feb. 15, 2011.

OO. U.S. Utility patent application Ser. No. 11/892,261, entitled "Fast Automatic Linear Off-Resonance Correction Method for Spiral Imaging", filed Aug. 21, 2007; U.S. Pat. No. 7,642,777, issued Jan. 5, 2010.

PP. U.S. Utility patent application Ser. No. 14/748,204, entitled "Motion-Guided Segmentation for Cine Dense Images", filed May 14, 2007; U.S. Pat. No. 7,813,537, issued Oct. 12, 2010.

QQ. U.S. Utility patent application Ser. No. 11/785,734, entitled "Partially Parallel Magnetic Resonance Imaging Using Arbitrary K-Space Trajectories with Image Reconstruction Based on Successive Convolution Operations", filed Apr. 19, 2007; U.S. Pat. No. 7,583,082, issued Sep. 1, 2009.

RR. U.S. Utility patent application Ser. No. 10/474,571, entitled "Optimized High-Speed Magnetic Resonance Imaging Method and System Using Hyperpolarized Noble Gases", filed Oct. 10, 2003; U.S. Pat. No. 7,174,200, issued Feb. 6, 2007.

SS. International Patent Application Serial No. PCT/US2002/011746, entitled "OPTIMIZED HIGH-SPEED MAGNETIC RESONANCE IMAGING METHOD AND SYSTEM USING HYPERPOLARIZED NOBLE GASES", filed Apr. 12, 2002; Publication No. WO 02/084305, Oct. 24, 2002.

Conclusion

The specific configurations, choice of materials and the size and shape of various elements can be varied according to particular design specifications or constraints requiring a system or method constructed according to the principles of the disclosed technology. Such changes are intended to be embraced within the scope of the disclosed technology. The presently disclosed embodiments, therefore, are considered in all respects to be illustrative and not restrictive. The patentable scope of certain embodiments of the disclosed technology is indicated by the appended claims, rather than the foregoing description.

The invention claimed is:

1. A computerized method of reconstructing acquired magnetic resonance image (MRI) data to produce a series of output images, the computerized method comprising:
    acquiring a multiband k-space data set from a plurality of multiband slices of spiral MRI data;
    simultaneously acquiring a single band k-space data set comprising respective single band spiral image slices that are each associated with a respective one of the multiband slices in the multiband k-space data set;
    using the single band k-space data set, for each individual multiband slice, calculating a respective calibration kernel to apply to the multi-band k-space data set for each individual multiband slice;
    separating each individual multiband slice from the multiband k space data set by:
        phase demodulating the multi-band k-space data using multiband phase demodulation operators corresponding to the individual multiband slice;
        convolving phase demodulated multi-band k-space data with a selected convolution operator to form a gridded set of the multi-band k-space data corresponding to the individual multiband slice;
    separating the individual multiband slice from the multiband k-space data set by convolving the respective calibration kernel with the gridded set of the multi-band k-space data set to form a calibrated slice of k-space multi-band image data;
    converting the calibrated slice of multi-band k-space image data to an output image.

2. The computerized method of claim 1, wherein converting the calibrated slice of multi-band k-space image data to an output image comprises applying an inverse Fourier transform to the calibrated slice of multiband k-space image data.

3. The computerized method of claim 1, further comprising:
    for the individual multiband slice associated with a respective single band slice, calculating the calibration kernel by:
    iteratively on a slice by slice basis, for all respective single band slices:
    phase demodulating each of the single band slices across the entire single band k-space data set using a same single band phase demodulation operation corresponding to a respective single band slice;
    gridding each phase demodulated single band slice;
    utilizing all of the respectively gridded slices, fitting the calibration kernel for the individual multiband slice.

4. The computerized method of claim 3, wherein gridding each phase demodulated single band slice comprises convolving phase demodulated single-band k-space data with a respective single band convolution operator to form a respective gridded set of the single band k-space data corresponding to the respective single band slice.

5. The computerized method of claim 3, wherein fitting the calibration kernel comprises using a split slice GRAPPA resulting in kernel slices for each respective single band gridded slice.

6. A computerized method of producing a set of final output magnetic resonance images (MRI), the method comprising:
    calculating a plurality of estimated image slices corresponding to an acquired k space data set of spirally acquired slices by programming a computer to iteratively minimize difference functions between the acquired k space data set and an estimated k space data set of estimated images, by performing an iterative method comprising:
    for every slice of spiral MRI data, calculating an estimated image used to reconstruct the spiral MRI data by:
    phase demodulating acquired spiral data in the k space data set;
    phase demodulating estimated image data in the estimated k space data set;
    using corresponding phase demodulated data, calculating a corrected k-space data set by comparing estimated k-space data with acquired multi-band k-space data;
    iteratively updating intermediate output images by combining corrected image data calculated from the corrected k-space data set and sequentially estimated images for the respective slice of spiral MRI data; and
    converging iterations of the intermediate output images to the final output image having the minimized difference functions.

7. The computerized method of claim 6, wherein the final output image comprises a desired consistency with acquired coil data and a corresponding in plane data consistency calculated with in plane calibration kernels.

8. The computerized method of claim 7, wherein calculating the corrected image data comprises:
    transforming spiral multiband data from the corrected k-space data set to Cartesian single band data separated according to phase demodulation, wherein the transforming comprises applying through plane calibration kernels to the spiral multiband data and performing an inverse fast Fourier transform.

9. The computerized method of claim 7, further comprising calculating the sequentially estimated images by applying in plane calibration kernels and weighting factors to respective sets of intermediate output images for each of the spiral MRI slices.

10. The computerized method of claim 9, further comprising iteratively recalculating the estimated k space data set with the sequentially estimated images.

11. The computerized method of claim 10, further comprising collapsing the sequentially estimated images into the estimated k space data set by:
    applying a Fourier transform to the sequentially estimated images;
    converting the estimated images to the spiral domain;
    phase modulating the estimated images in the spiral domain to form an update to the estimated k space data set;
    repeating the step of iteratively minimizing difference functions between the acquired k space data set and an updated estimated k space data set of estimated images.

* * * * *